United States Patent
Ishikawa

[11] Patent Number: 5,828,120
[45] Date of Patent: Oct. 27, 1998

[54] SEMICONDUCTOR DEVICE AND PRODUCTION METHOD THEREOF

[75] Inventor: Akio Ishikawa, Tokyo, Japan

[73] Assignee: Nippon Steel Corporation, Tokyo, Japan

[21] Appl. No.: 804,413

[22] Filed: Feb. 21, 1997

[30] Foreign Application Priority Data

Feb. 23, 1996 [JP] Japan ................................. 8-061867

[51] Int. Cl.⁶ .................................................. H01L 29/00
[52] U.S. Cl. ....................... 257/499; 257/630; 257/401; 257/506
[58] Field of Search .................................. 257/499, 506, 257/508, 630, 647, 618, 401, 409, 296

[56] References Cited

U.S. PATENT DOCUMENTS

| | | | |
|---|---|---|---|
| 4,561,170 | 12/1985 | Doering et al. | 29/571 |
| 4,688,069 | 8/1987 | Joy et al. | 257/508 |
| 5,164,803 | 11/1992 | Ozaki et al. | 257/630 |
| 5,610,854 | 3/1997 | Ema | 257/499 |
| 5,641,989 | 6/1997 | Tomioha | 257/508 |

FOREIGN PATENT DOCUMENTS

| | | | |
|---|---|---|---|
| 60-98666 | 6/1985 | Japan | 257/499 |
| 2-3257 | 1/1990 | Japan . | |
| 2-172253 | 7/1990 | Japan . | |

OTHER PUBLICATIONS

Wakamiya et al., Fully Planarized 0.5μm Technologies For 16M DRAM, IEDM–88. pp. 246–249, Dec. 1988.

*Primary Examiner*—Mark V. Prenty
*Attorney, Agent, or Firm*—Pollock, Vande Sande & Priddy

[57] ABSTRACT

A semiconductor device equipped on the same substrate thereof with a first area isolated for device isolation by a first device isolation structure and with a second area isolated for device isolation by a second device isolation structure, wherein the thickness of the substrate inside the first area is different from the thickness of the substrate inside the second area, and the first and second device isolation structures are buried into the substrate so as to bring their tops into about the same level.

26 Claims, 51 Drawing Sheets

FIG. 1-1(j)
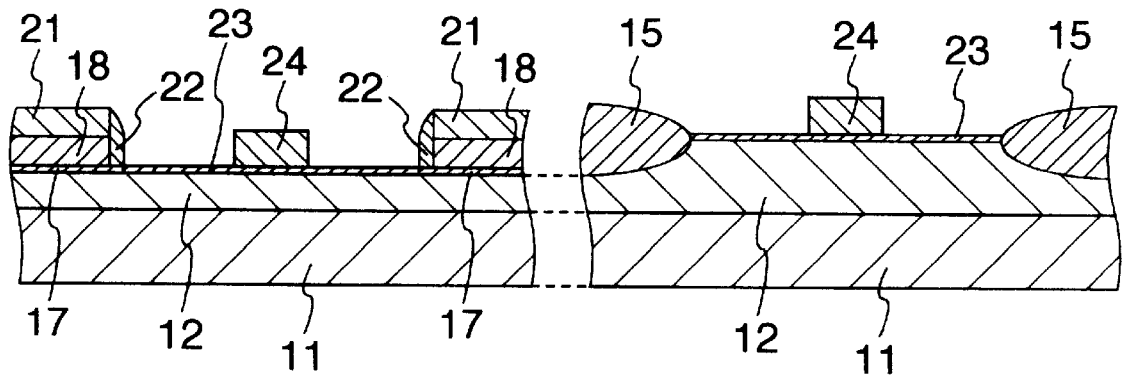
FIG. 1-1(k)
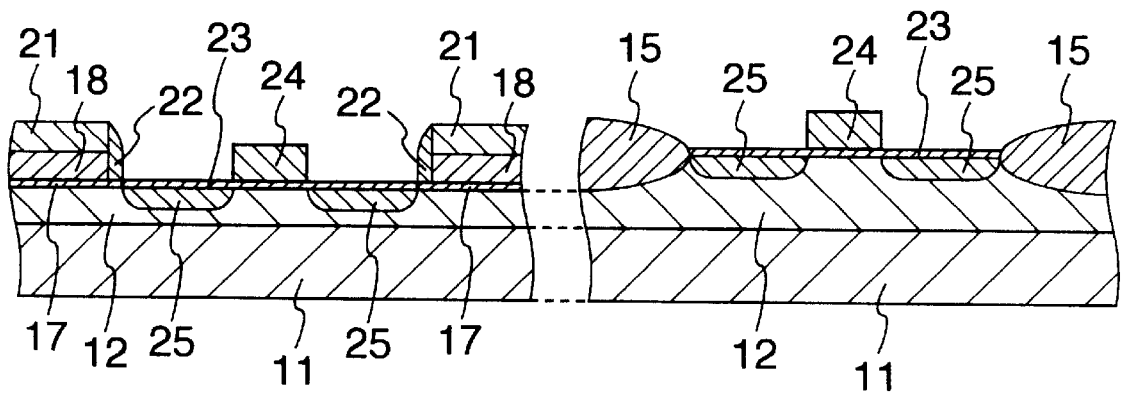
FIG. 1-1(ℓ)
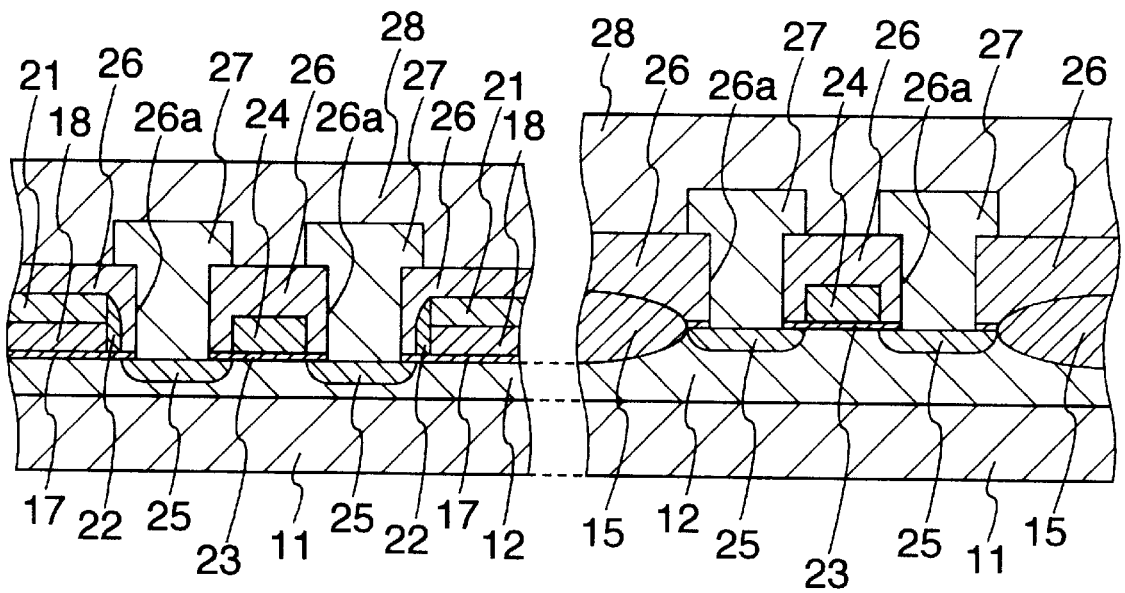

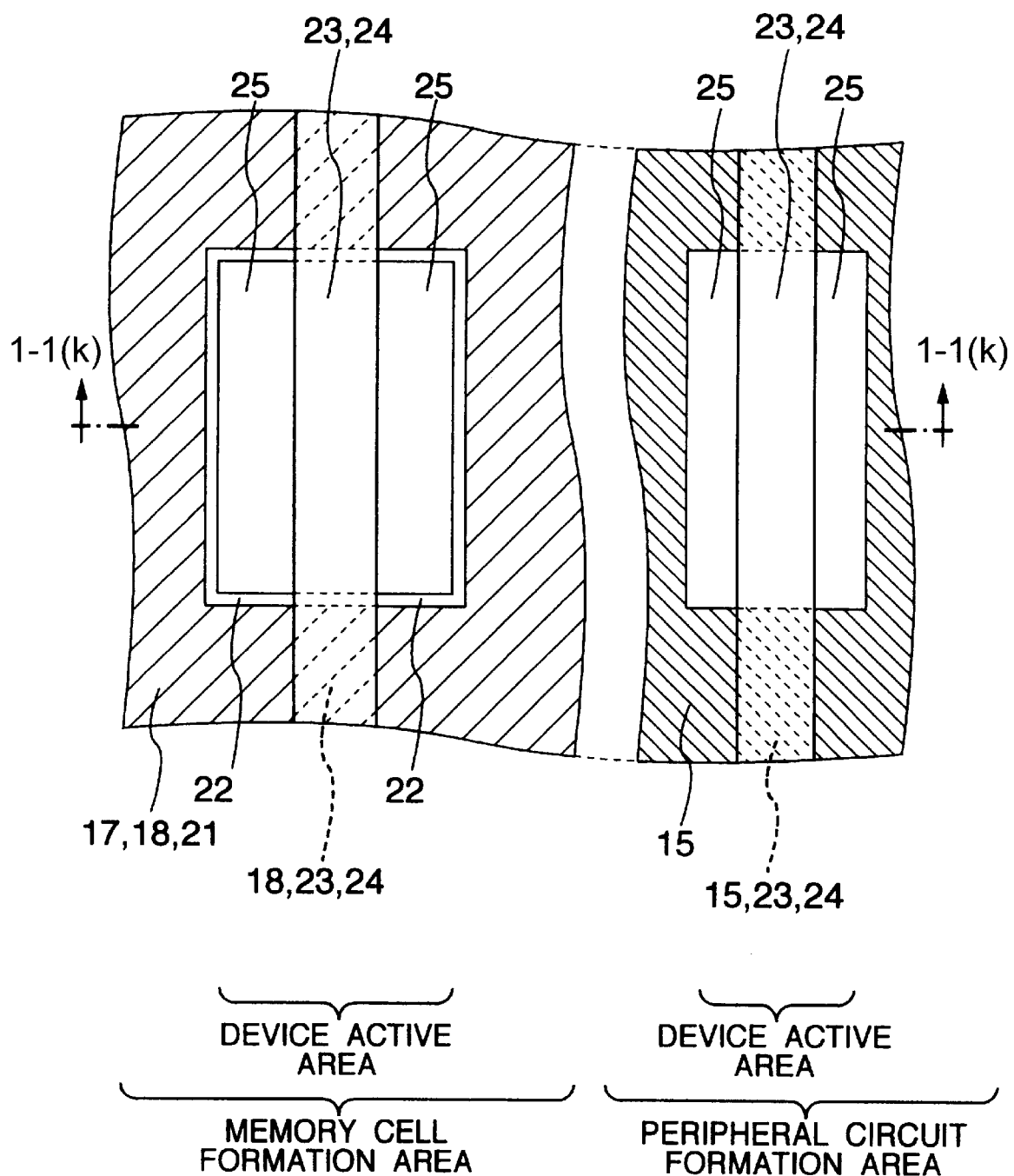

FIG. 2-1(j)
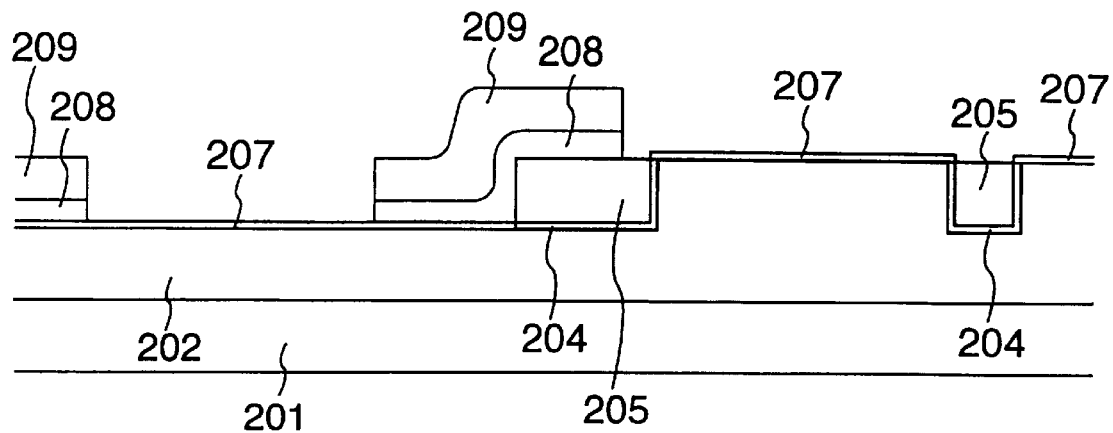
FIG. 2-1(k)
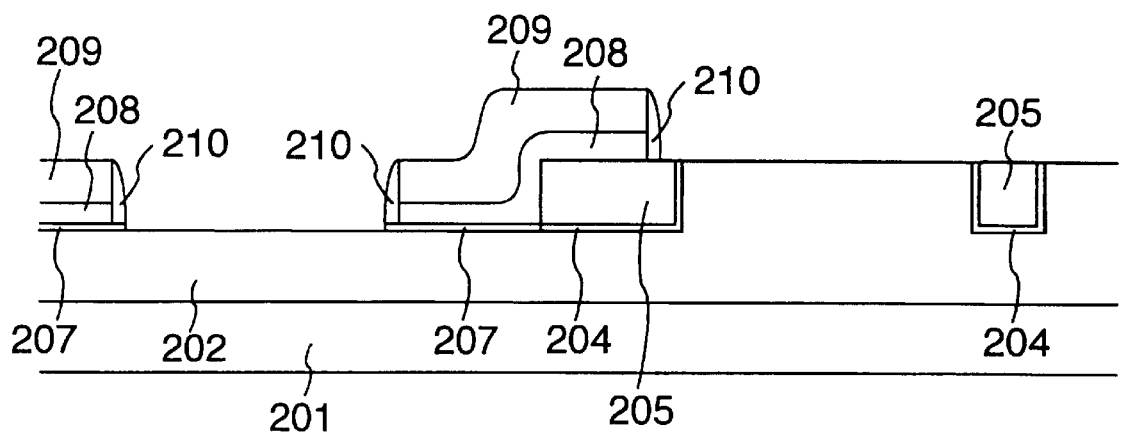
FIG. 2-1(ℓ)
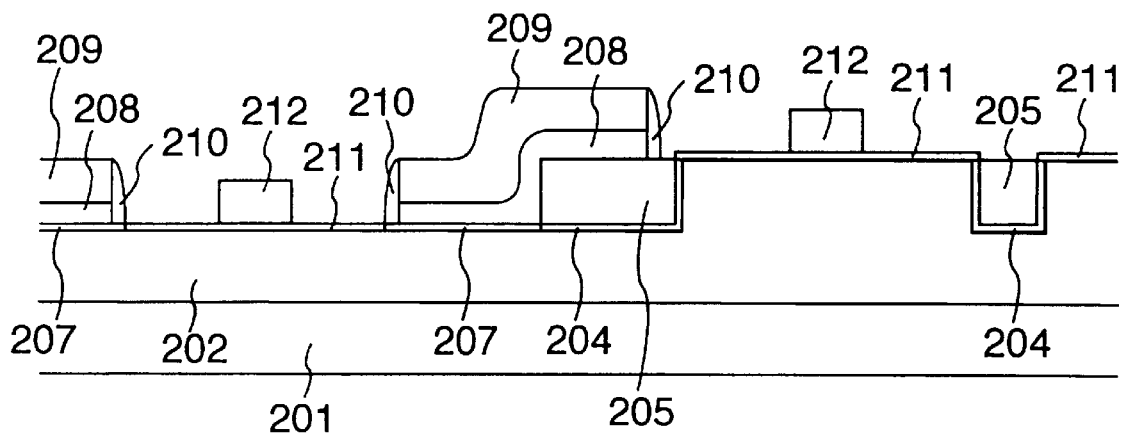

FIG. 3-1(j)
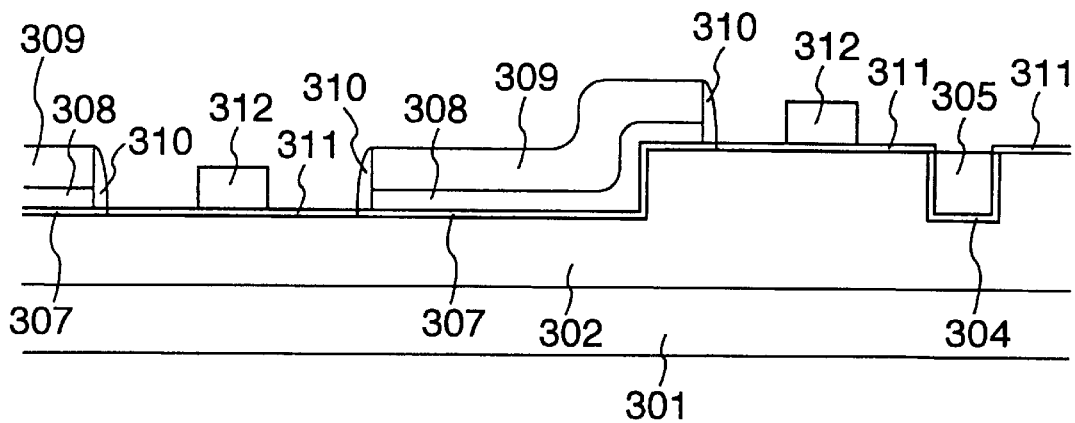
FIG. 3-1(k)
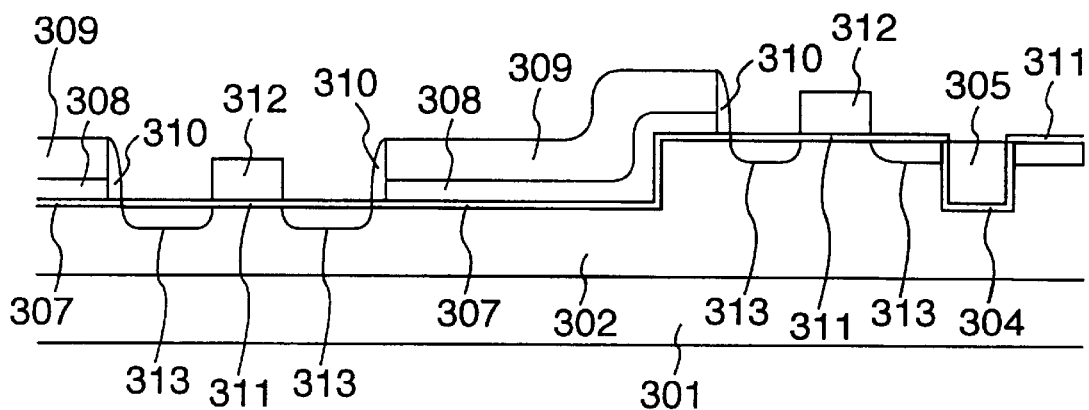
FIG. 3-1(ℓ)
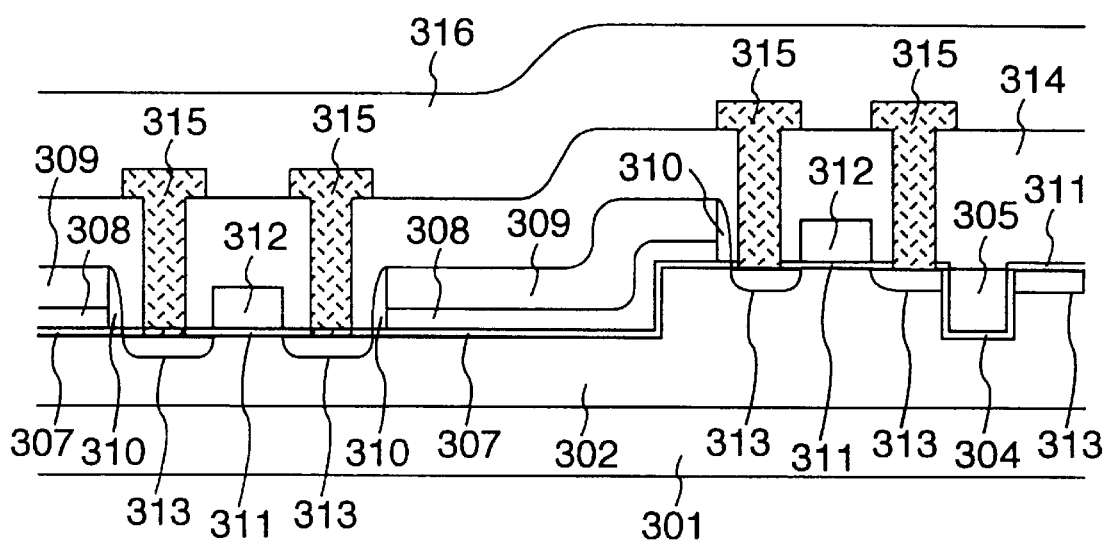

FIG. 4-1(j)
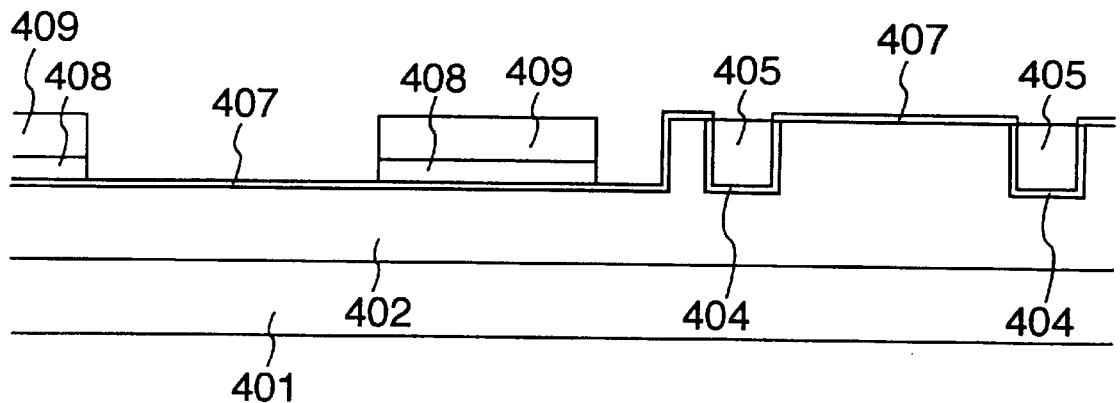
FIG. 4-1(k)
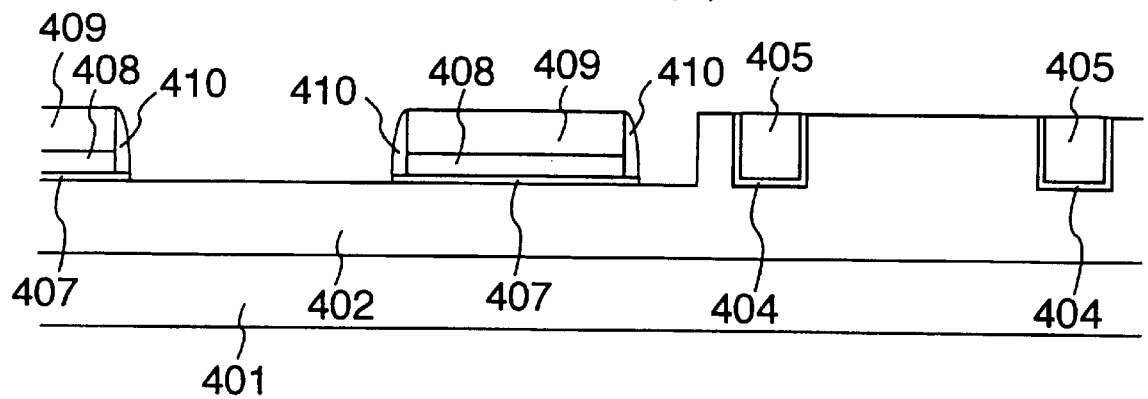
FIG. 4-1(ℓ)
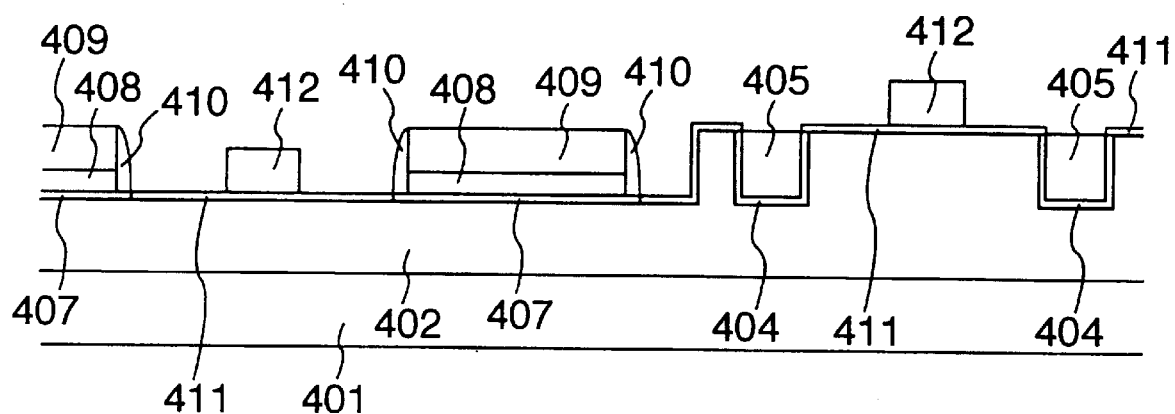

FIG. 5-1(j)
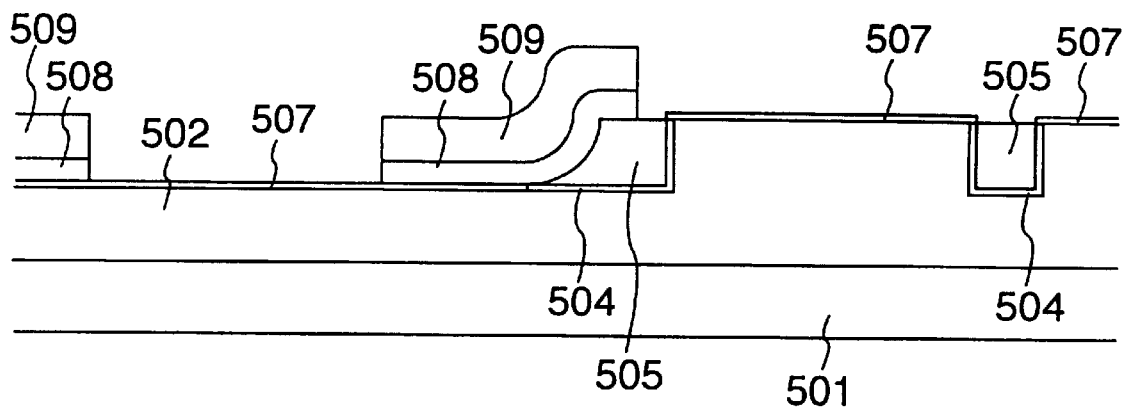
FIG. 5-1(k)
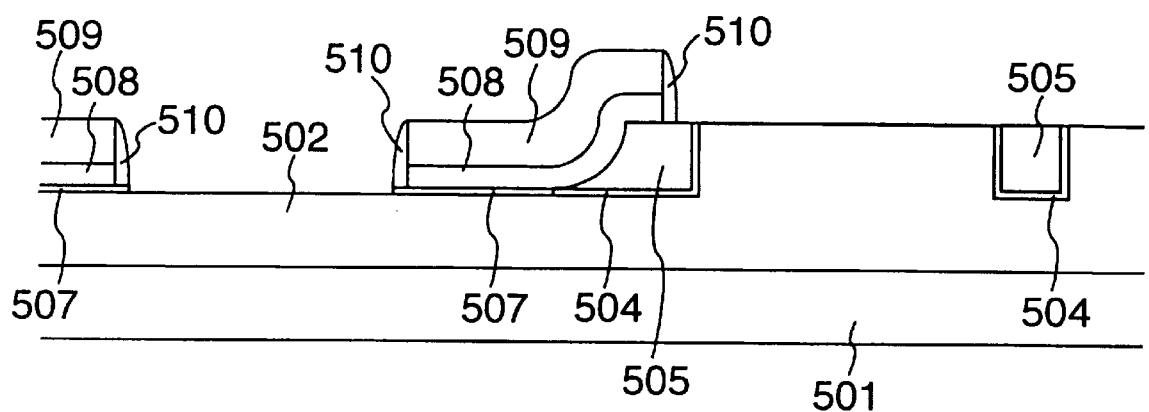
FIG. 5-1(ℓ)
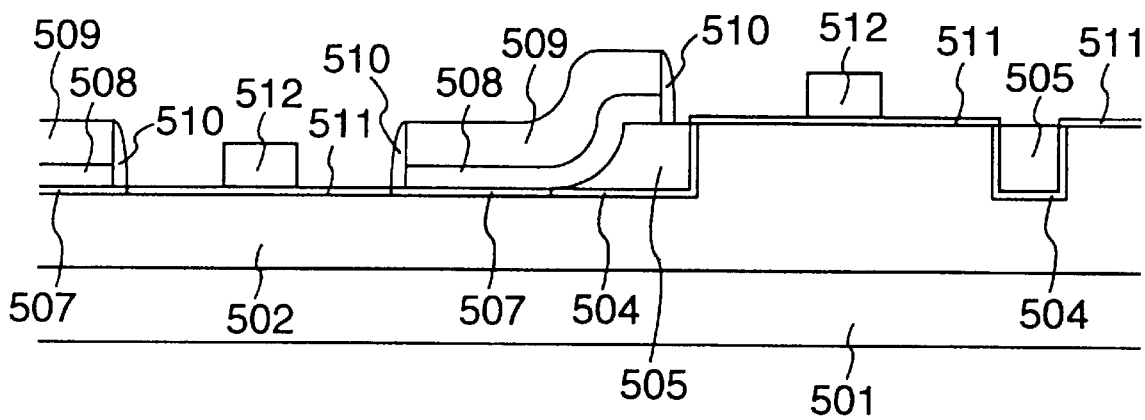

FIG. 6-1(j)
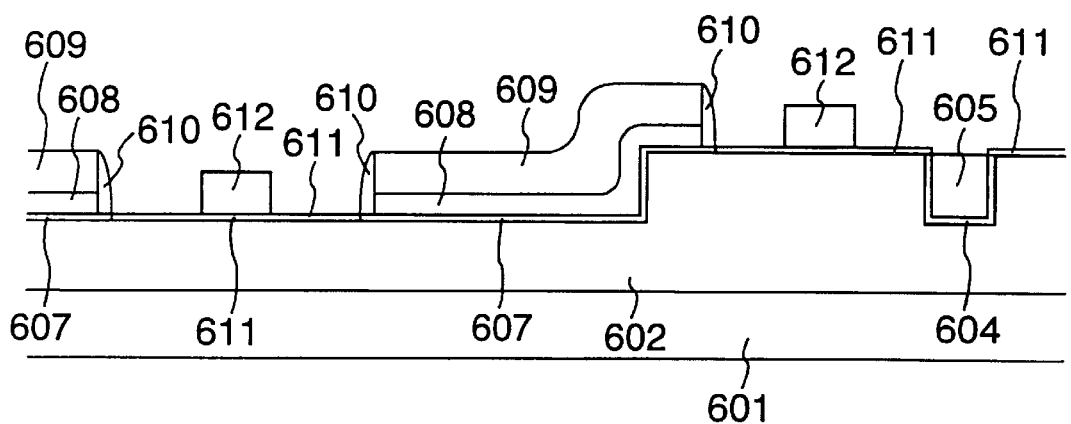
FIG. 6-1(k)
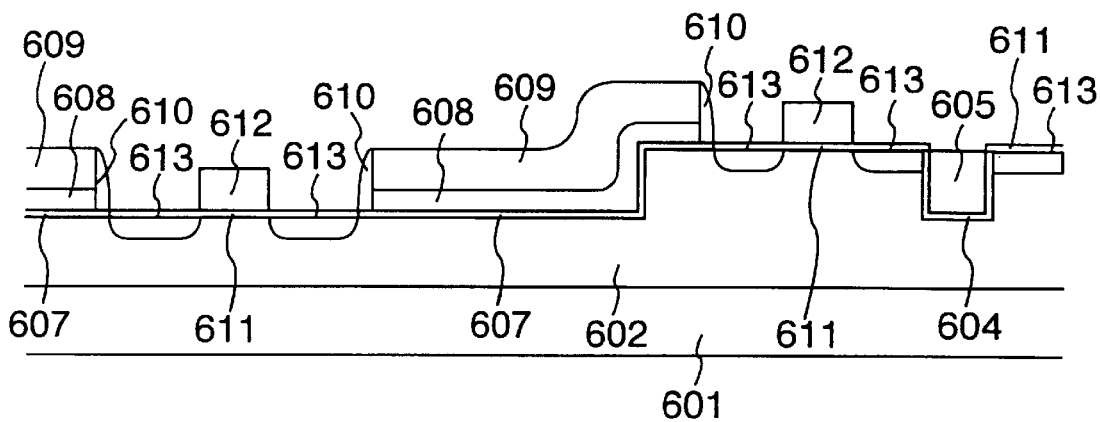
FIG. 6-1(ℓ)
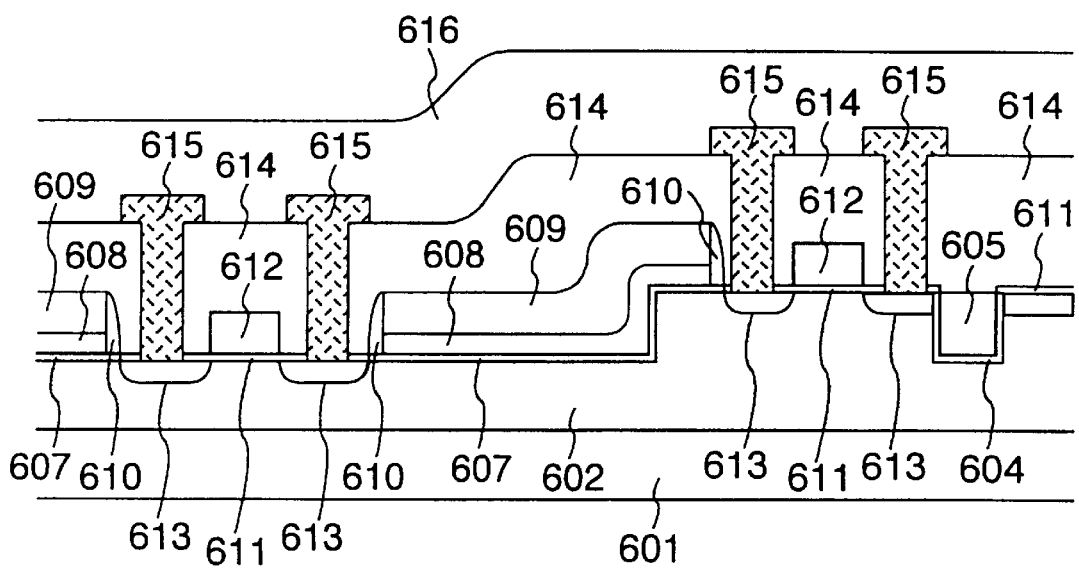

FIG. 7-1(j)
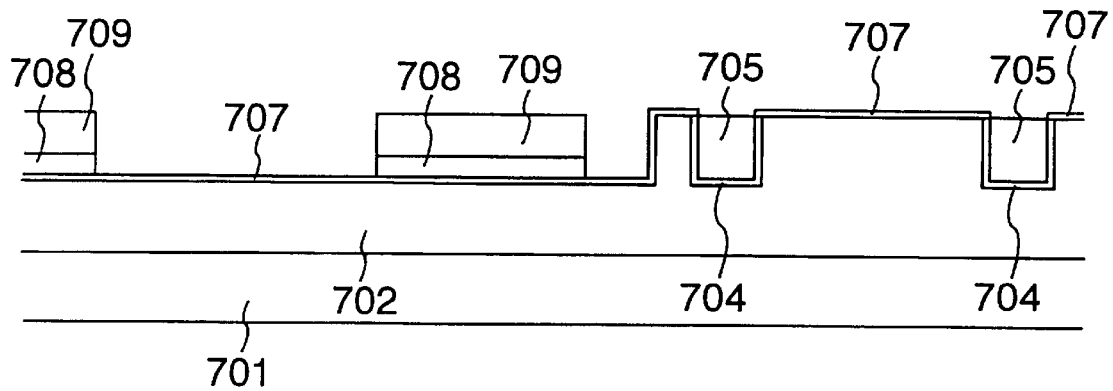
FIG. 7-1(k)
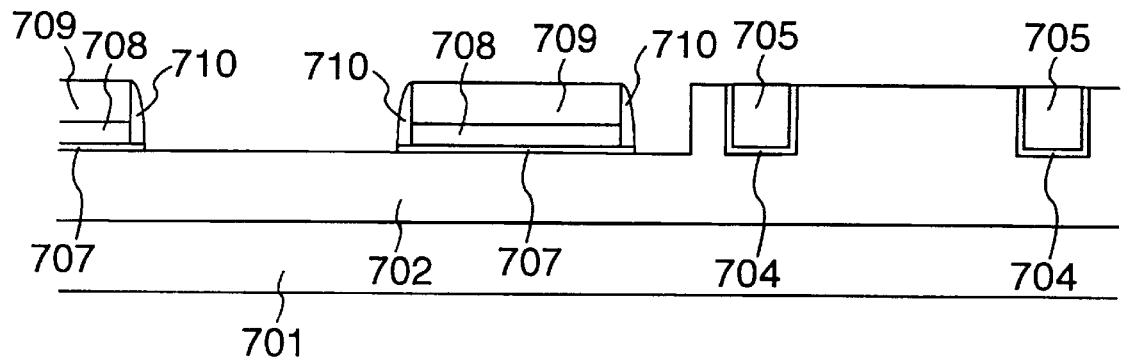
FIG. 7-1(ℓ)
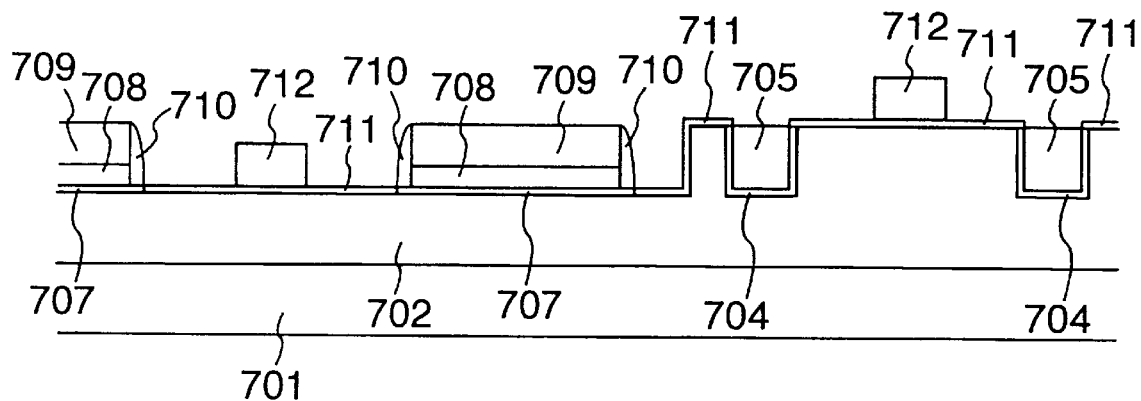

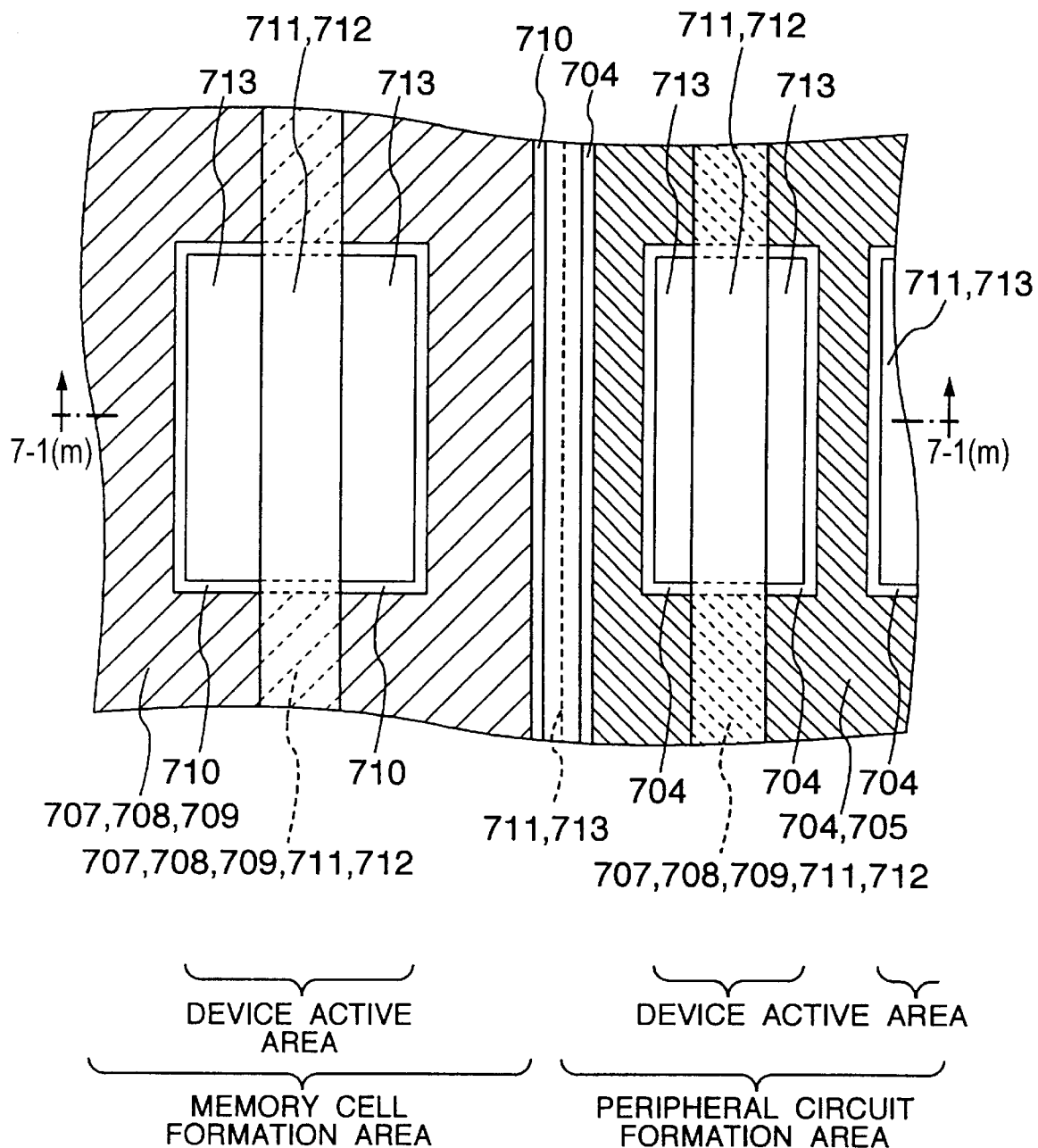

SEMICONDUCTOR DEVICE AND PRODUCTION METHOD THEREOF

BACKGROUND OF THE INVENTION

This invention relates to a semiconductor device equipped on the same substrate thereof with a plurality of device isolation structures having mutually different heights. More particularly, this invention relates to a semiconductor device equipped on the same substrate thereof with a device isolation structure with a buried insulating film and a field shield device isolation structure.

As miniaturization and a multi-layered structure of semiconductor devices have been further developed in recent years, flattening of each layer has been required. If a large step occurs on the surface of a multi-layered structure, problems such as disconnection occur in a layer formed on such a step.

One of the great factors that cause such a step is the difference of the height of each device isolation structure isolating each area. A field insulating film method and a field shield method, in particular, provide different heights.

The field insulating film method has been mainly employed in the past. However, this isolation method is not free from the drawbacks that the area of an effective device active area is reduced due to a bird's beak and a threshold voltage of a field effect transistor becomes higher than a desired value due to a narrow channel effect. Consequently, it has become difficult to apply this isolation method, particularly to miniaturized semiconductor devices. The field shield method has therefore drawn increasing attention as a device isolation method different from a selective oxidation method.

This field shield method disposes a shield plate electrode on a semiconductor substrate through a shield gate insulating film, and fixes this shield plate electrode at a ground potential, for example, to thereby prevent a potential of wirings extending over the shield plate electrode from affecting the semiconductor substrate below the shield gate insulating film and to prevent conduction of a parasitic MOS transistor.

Being free from the problems such as the bird's beak and the narrow channel effect, this field shield method is suitable for the miniaturization of semiconductor devices and provides excellent device isolation characteristic even when it is applied to miniature semiconductor devices (as reported, for example, in IEDM-88, pp. 246–249, "Fully Planarized 0.5 µm Technologies for 16M DRAM").

On the other hand, device isolation by the selective oxidation method is more suitable for MOS circuits than device isolation by the field shield method. Therefore, attempts have been made to apply both the selective oxidation method and the field shield method to the same semiconductor substrate.

However, the shield gate insulating film, the shield plate electrode and a cap insulating film must be serially laminated on the surface of the semiconductor substrate in the device isolation area formed by the field shield method. Therefore, the sum of the film thickness of these films becomes greater than the thickness of an oxide film (field oxide film) for device isolation by the selective oxidation method, and a large step develops between the area using the selective oxidation method and the area using the field shield method.

As a result, when the wirings are formed over the semiconductor substrate, step coverage of the wirings is inferior at the step portion between the area in which the device isolation area is formed by the selective oxidation method and the area in which the device isolation area is formed by the field shield method, and a margin for the depth of focus for lithography is small, too. Therefore, when both of the selective oxidation method and the field shield method are applied to the same semiconductor substrate, it has been difficult in the past to easily form the wirings over the semiconductor substrate and to provide semiconductor devices having high reliability, refer, for example, to JP-A-2-3257.

On the other hand, JP-A-2-172253 discloses a technology of forming a step on a substrate surface by removing a field oxide film formed by a LOCOS method, but this step is not used for eliminating the difference of the height of the device isolation structures.

Further, no prior art references set the tops of the device isolation structures to the same level.

SUMMARY OF THE INVENTION

It is therefore an object of the present invention to eliminate the problems resulting from the difference of the height of the device isolation structures, and to provide a semiconductor device having high reliability.

To accomplish this object, the present invention buries device isolation structures into ditches formed in a substrate so that the tops of the device isolation structures exist at substantially the same level.

In the present invention, further, a step is formed on the surface of the substrate, and device isolation structures having mutually different heights are disposed on an area having a large thickness and an area having a small thickness of the resulting substrate so that the tops of the device isolation structures exist at substantially the same level.

More concretely, a field oxide film is formed by a LOCOS process, and a process where a part, or the whole, of this field oxide film is removed so as to provide a step on the surface of the substrate.

Further, the present invention disposes the step on the surface of the substrate by etching.

More concretely, the present invention disposes a device isolation structure of a field oxide film in a thick area of the substrate and a field shield device isolation structure in a thin area of the substrate.

Further, a memory cell for storing data is formed in an area having a field shield device isolation structure, and a peripheral circuit device other than the memory cell is formed in an area having a device isolation structure of the field oxide film.

BRIEF DESCRIPTION OF THE DRAWINGS

FIGS. 1—1(a) to 1—1(l) show the production steps of a semiconductor device according to the first embodiment of the present invention;

FIG. 1–2 is a plan view of FIG. 1—1(k);

FIGS. 2-1(a) to 2-1(n) show the production steps of a semiconductor device according to the second embodiment of the present invention;

FIG. 2—2 is a plan view of FIG. 2-1(m);

FIGS. 3-1(a) to 3-1(l) show the production steps of a semiconductor device according to the third embodiment of the present invention;

FIG. 3-2 is a plan view of FIG. 3-1(k);

FIGS. 4-1(a) to 4-1(n) show the production steps of a semiconductor device according to the fourth embodiment of the present invention;

FIG. 4-2 is a plan view of FIG. 4-1(*m*);

FIGS. 5-1(*a*) to 5-1(*n*) shows the production steps of a semiconductor device according to the fifth embodiment of the present invention;

FIG. 5-2 is a plan view of FIG. 5-1(*m*);

FIGS. 6-1(*a*) to 6-1(*l*) show the production steps of a semiconductor device according to the sixth embodiment of the present invention;

FIG. 6-2 is a plan view of FIG. 6-1(*k*);

FIGS. 7-1(*a*) to 7-1(*n*) show the production steps of a semiconductor device according to the seventh embodiment of the present invention;

FIG. 7-2 is a plan view of FIG. 7-1(*m*);

FIGS. 8-1(*a*) to 8-1(*k*) show the production steps of a semiconductor device according to the eighth embodiment of the present invention;

FIG. 8-2 is a plan view of FIG. 8-1(*k*);

FIGS. 9-1(*a*) to 9-1(*h*) show the production steps of a semiconductor device according to the ninth embodiment of the present invention;

FIG. 9-2 is a plan view of FIG. 9-1(*h*);

FIGS. 10-1(*a*) to 10-1(*d*) show the production steps of a semiconductor device according to the tenth embodiment of the present invention; and FIG. 10-2 is a plan view of FIG. 10-1(*d*).

DESCRIPTION OF THE PREFERRED EMBODIMENTS (Embodiment 1)

The first embodiments of this present invention will be explained with reference to FIGS. 1—1(*a*) to 1—1(*l*) and FIG. 1–2.

Figures 1, 1A:
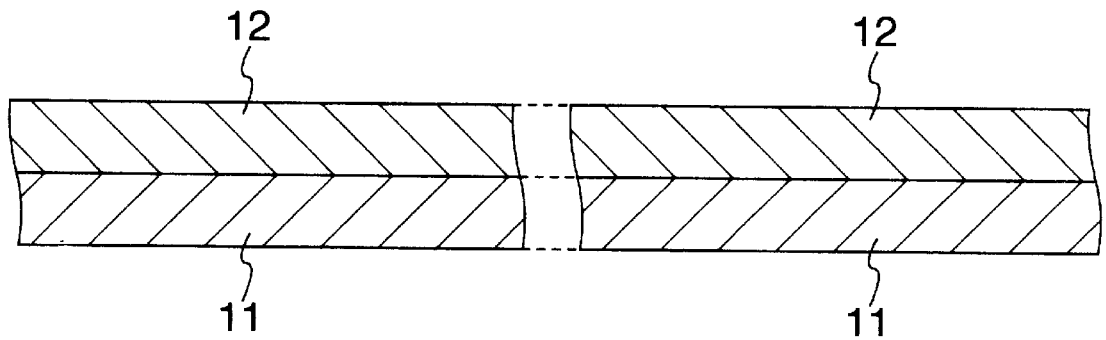

FIGS. 1—1(*a*) to 1—1(*l*) show the production steps of a semiconductor device according to the first embodiment of the present invention. FIG. 1–2 is a plan view of FIG. 1—1(*k*) and the transverse sectional view taken along a line A–A' of FIG. 1–2 corresponds to FIG. 1—1(*k*). In these drawings, the area shown on the right side is a peripheral circuit formation area, and the area shown on the left is a memory formation area. In both the right and left areas, the area encompassed by a device isolation structure is a device active area.

In this embodiment, boron ions are selectively implanted at an implantation energy of 60 keV and in a dose of $1 \times 10^{13}$ cm$^{-2}$ into a p type silicon substrate 11. Boron is diffused and activated by heat-treatment at a temperature of 1,100° C. for 6 hours so as to selectively form a P well 12.

Next, as shown in FIG. 1—1(*b*), the surface of the silicon substrate 11 is thermally oxidized to form an about 20 nm-thick silicon dioxide film 13 as a pad oxide film, and an about 150 nm-thick silicon nitride film 14 is then deposited on this silicon dioxide film 13 by a CVD process.

A portion which is to be used as a device active area among the areas using a selective oxidation process is covered with a photoresist (not shown) as shown in FIG. 1—1(*c*), and the silicon nitride film 14 is etched by using the photoresist as a mask. In consequence, the silicon nitride film 14 is completely etched in the area using a field shield process.

Next, the surface of the silicon substrate 11 is selectively oxidized by using the silicon nitride film 14 as an oxidation preventive film as shown in FIG. 1—1(*d*), and a silicon dioxide film 15 having a thickness of about 400 nm is formed as a field oxide film. Here, the silicon dioxide film 15 is not formed in the area covered with the silicon nitride film 14.

The entire areas using the selective oxidation process are then covered with the photoresist 16 as shown in FIG. 1—1(*e*), and the silicon dioxide film 15 of the area using the field shield process is removed by etching using this photoresist 16 as the mask. As a result, the surface of the area using the field shield process becomes lower by the thickness a (about 200 nm) of the oxidized surface of the silicon substrate 11 at the time of formation of the silicon dioxide film 15 than the surface of the areas using the selective oxidization process.

Next, the silicon nitride film 14 and the silicon dioxide film 13 are removed by etching as sown in FIG. 1—1(*f*).

The surface of the silicon substrate 11 is then oxide thermally as shown in FIG. 1—1(*g*) and a silicon dioxide film 17 having a thickness of about 50 nm is formed as a shield gate insulation film on the surface of the silicon substrate 11.

Next, an about 100 nm-thick polysilicon film 18 is deposited to the entire surface by the CVD process as shown in FIG. 1—1(*k*), and the resistance of this poly-silicon film 18 is lowered by thermally diffusing phosphorus into the polysilicon film 18. An about 200 nm-thick silicon dioxide film 21 is deposited to the entire surface by the CVD process as a cap insulating film covering the polysilicon film 18.

Thereafter, the silicon dioxide film 21 and the polysilicon film 18 are etched into the pattern of the device isolation area by the field shield process by using the photoresist (not shown) on the silicon dioxide film 21 as the mask. In consequence, the silicon dioxide film 21 and the polysilicon film 18 are removed from the entire region of the areas using the selective oxidization process and from the portion to be used as the device active area.

Next, as shown in FIG. 1—1(*i*), an about 200 nm-thick silicon dioxide film 22 is deposited to the entire surface by the CVD process, and the silicon dioxide films 22 and 17 are etched back by the anisotropic dry etching so as to form a sidewall insulating film comprising the silicon dioxide film 22 on the side surfaces of the poly-silicon film 18 and the side surfaces of the silicon dioxide film 21. At this time, the silicon dioxide film 17 is removed from the device active area of the areas using the selective oxidation method and from the device active area of the area using the field shield process. As a result, a field shield device isolation structure comprising the silicon dioxide film 17 (shield gate insulating film), the polysilicon film 18 (shield plate electrode), the silicon dioxide film 21 (cap oxide film) and the silicon dioxide film (sidewall insulating film) 22.

Next, as shown in FIG. 1—1(*j*), the surface of the silicon substrate which is exposed as a result of removal of the silicon dioxide film 17 is thermally oxidized, and an about 15 nm-thick silicon dioxide film 23 is formed as a gate insulating film on the surface of the substrate.

Next, an about 200 nm-thick polysilicon film 24 is deposited to the entire surface by the CVD process, and phosphorus is thermally diffused into this polysilicon film 24 so as to lower the resistance of the polysilicon film 24. The polysilicon film 24 is then etched into the pattern of the gate electrode by using the photoresist (not shown) on the polysilicon film 24 is the mask.

Arsenic ions are implanted at an implantation energy of 60 keV and in a dose of $5 \times 10^{15}$ cm$^{-2}$ into the silicon substrate 11 by using the polysilicon film 24 and the silicon dioxide films 15, 21 and 22 as the masks as shown in FIG. 1—1(*k*), and a pair of impurity diffusion layers 25 as the source and the drain are formed on the surface of the silicon substrate 11 on both sides of the polysilicon film 24 by heat-treatment.

Figures 1A, 2:
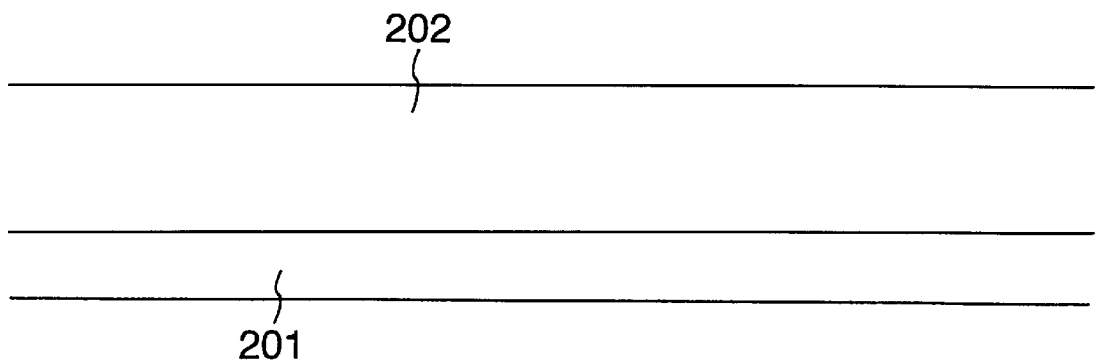
Figures 1B, 2:
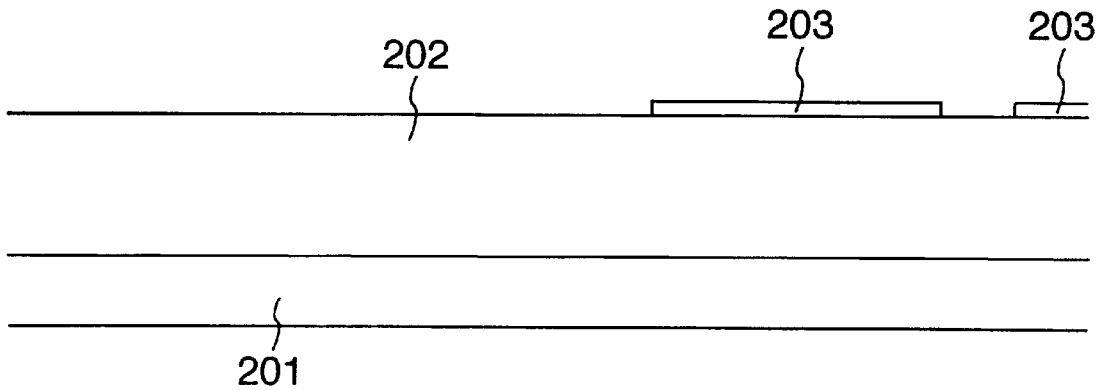
Figures 1C, 2:
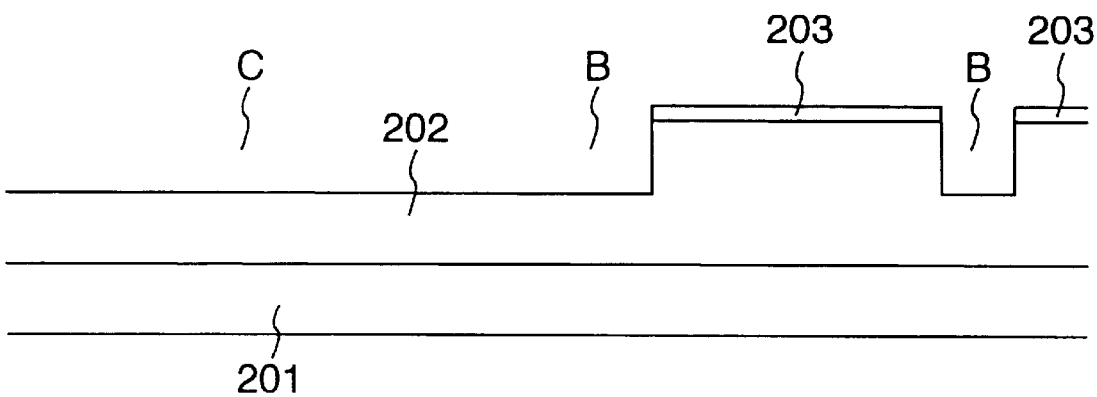
Figures 1D, 2:
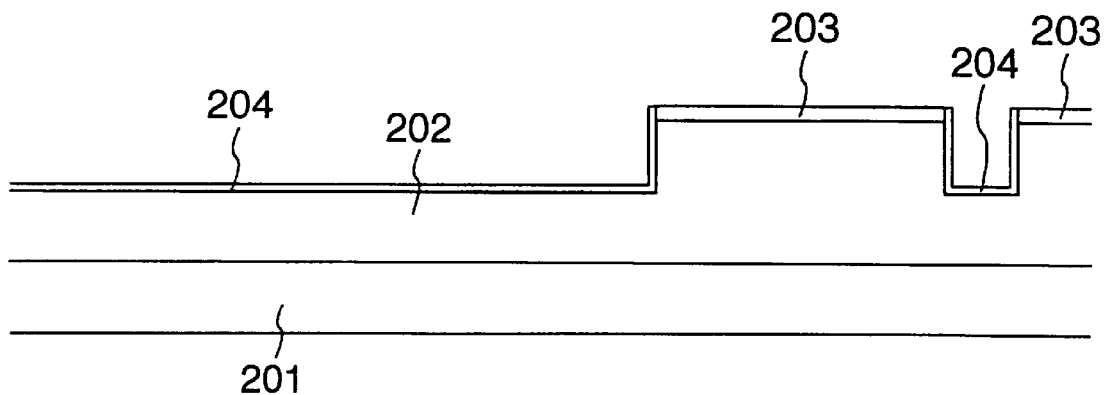
Figures 1E, 2:
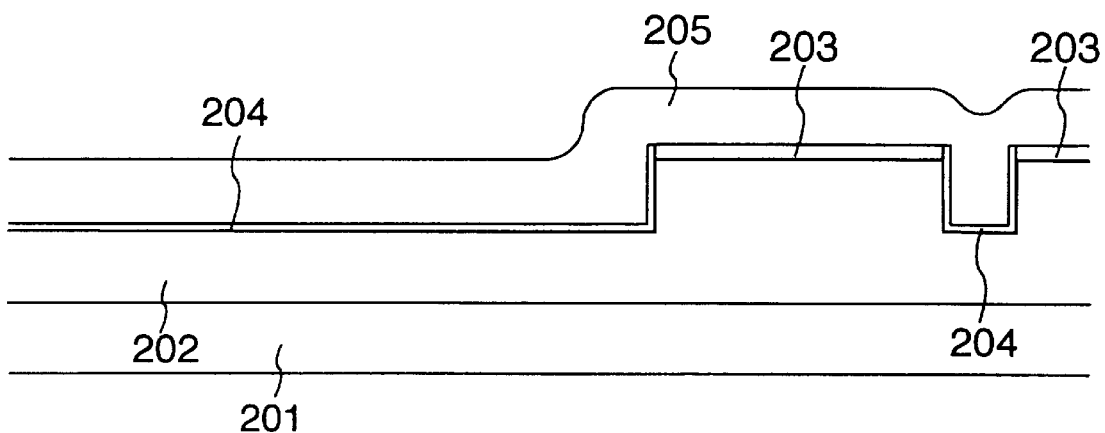
Figures 1F, 2:
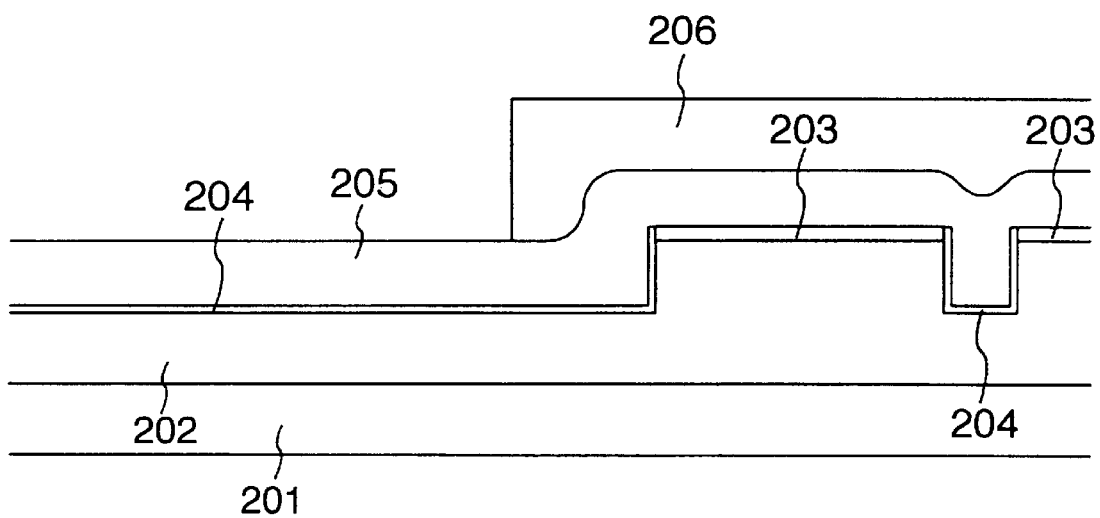
Figures 1G, 2:
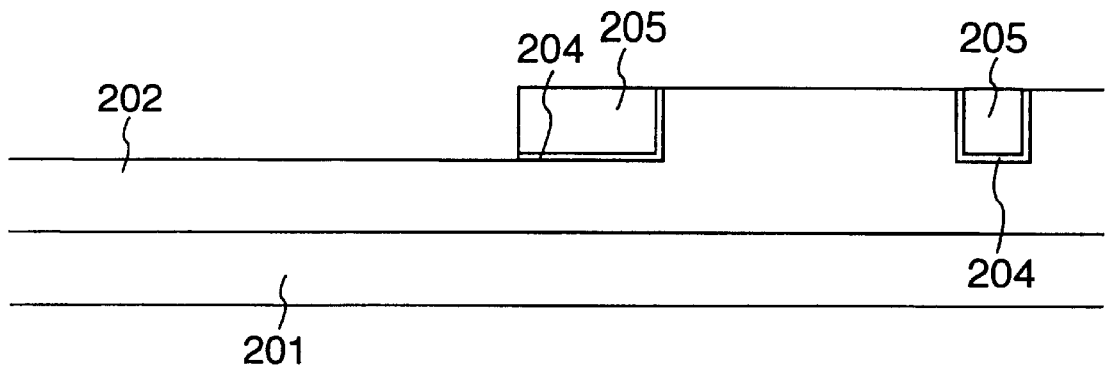
Figures 1H, 2:
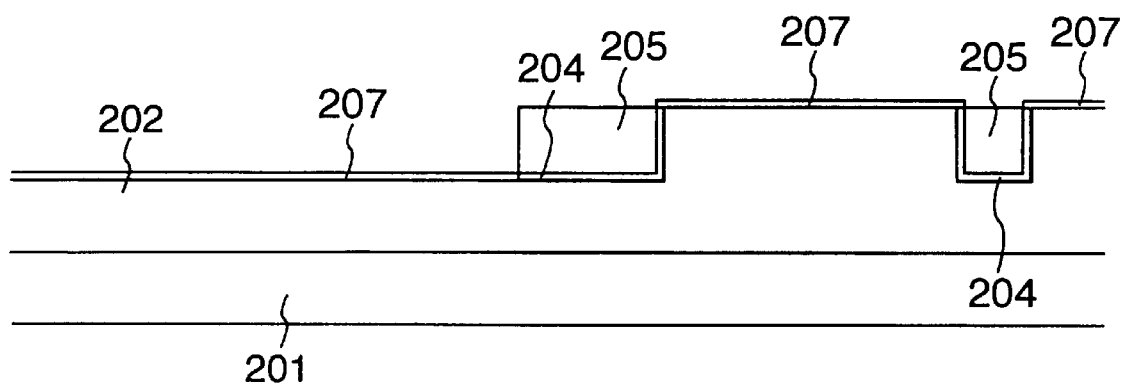
Figures 1I, 2:
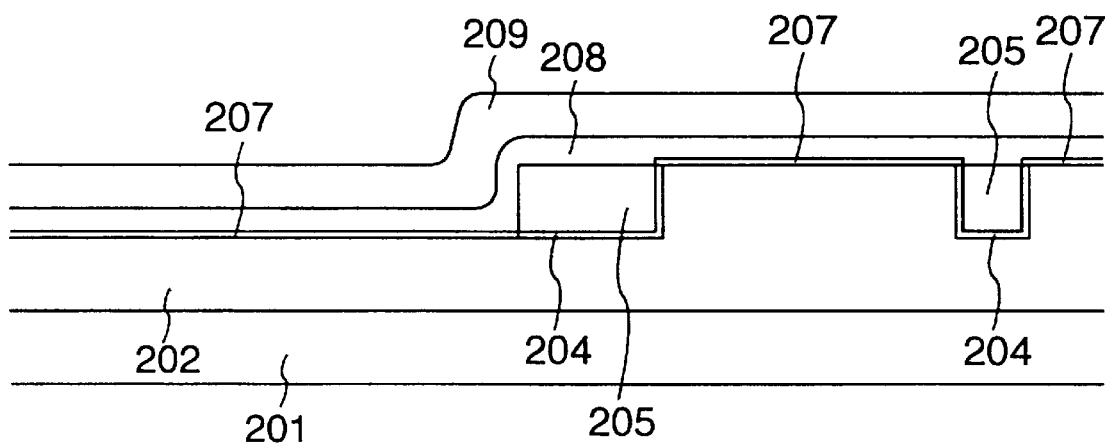
Figures 1A, 8:
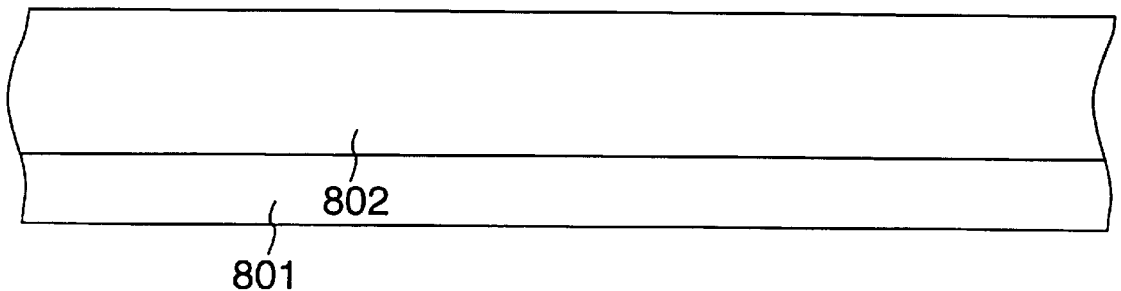
Figures 1B, 8:
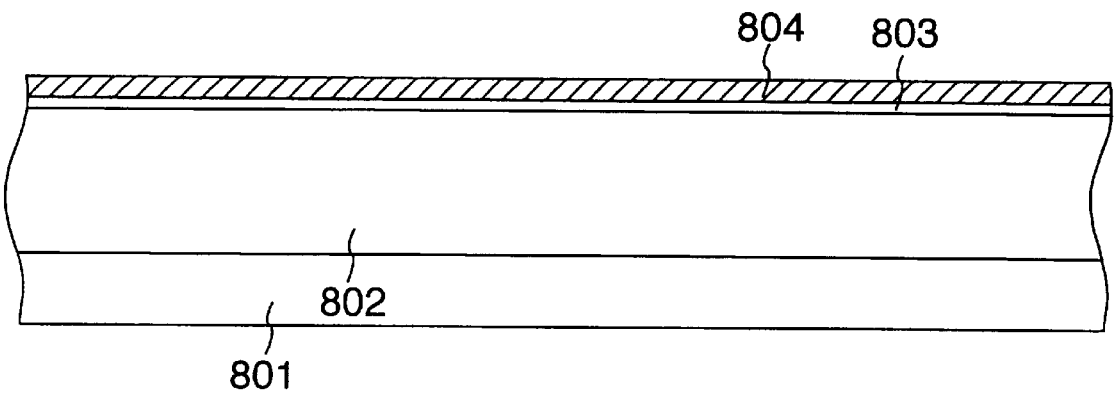
Figures 1C, 8:
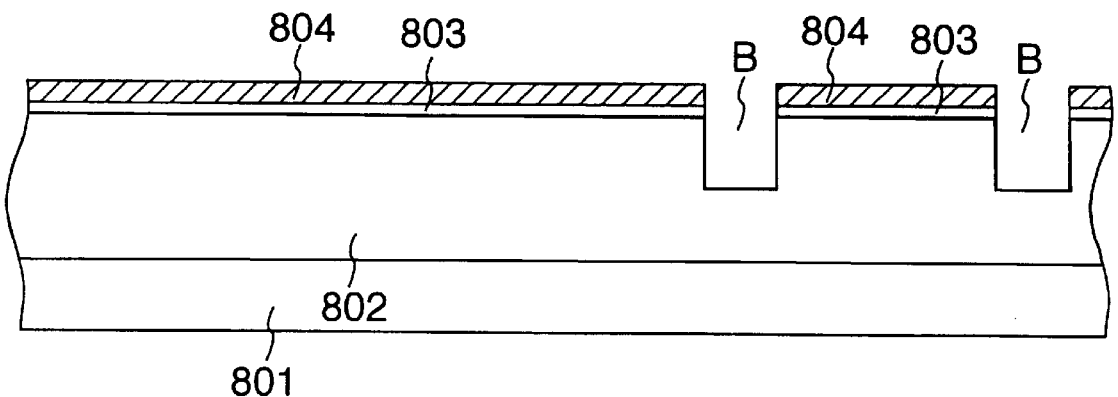
Figures 1D, 8:
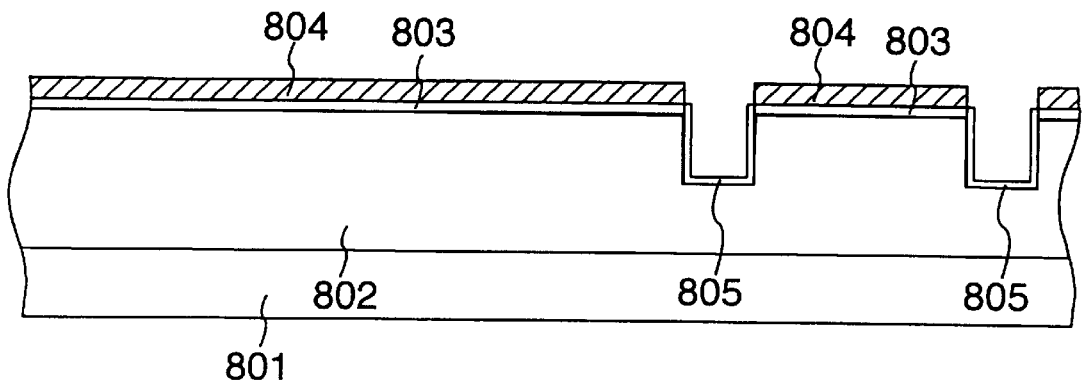
Figures 1E, 8:
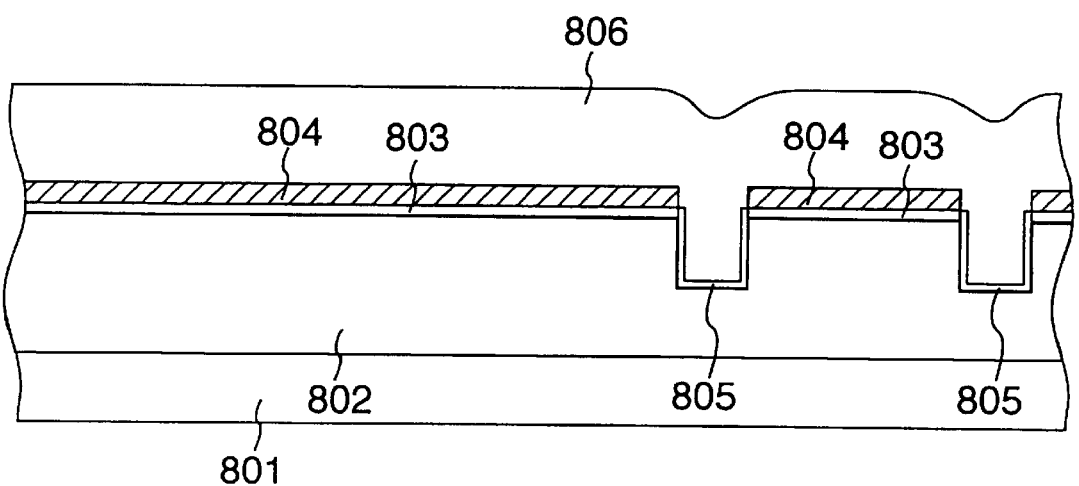
Figures 1F, 8:
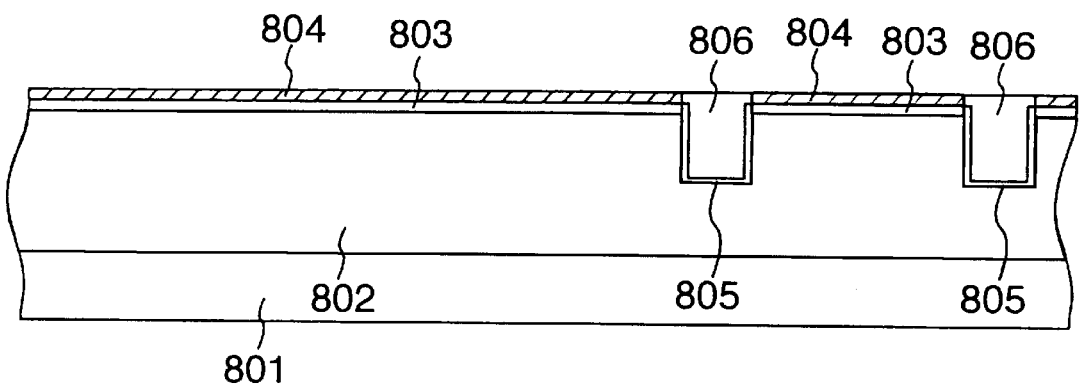
Figures 1G, 8:
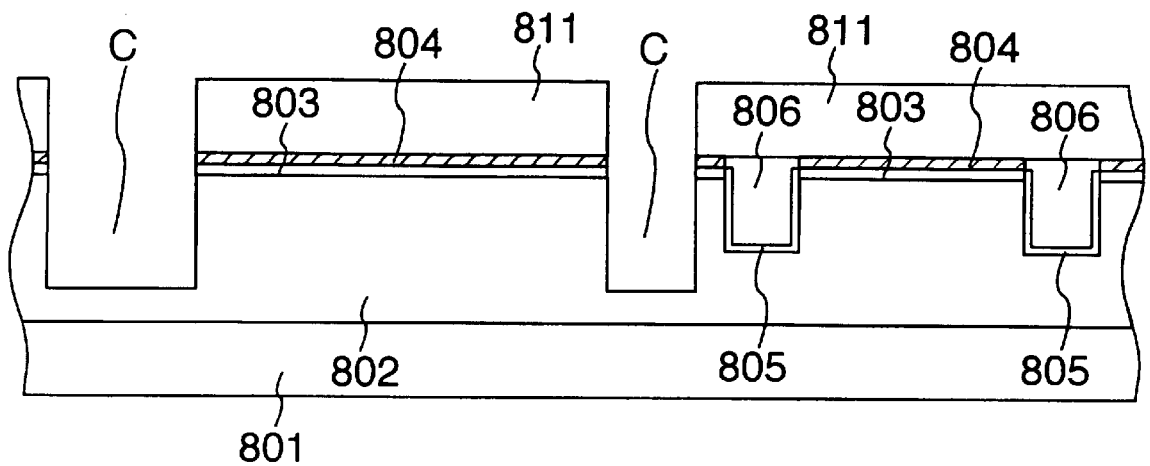
Figures 1H, 8:
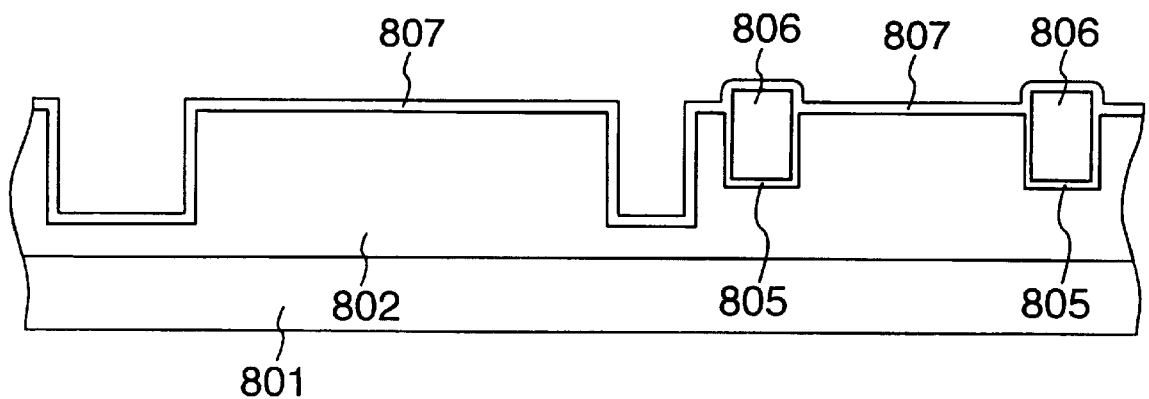
Figures 1I, 8:
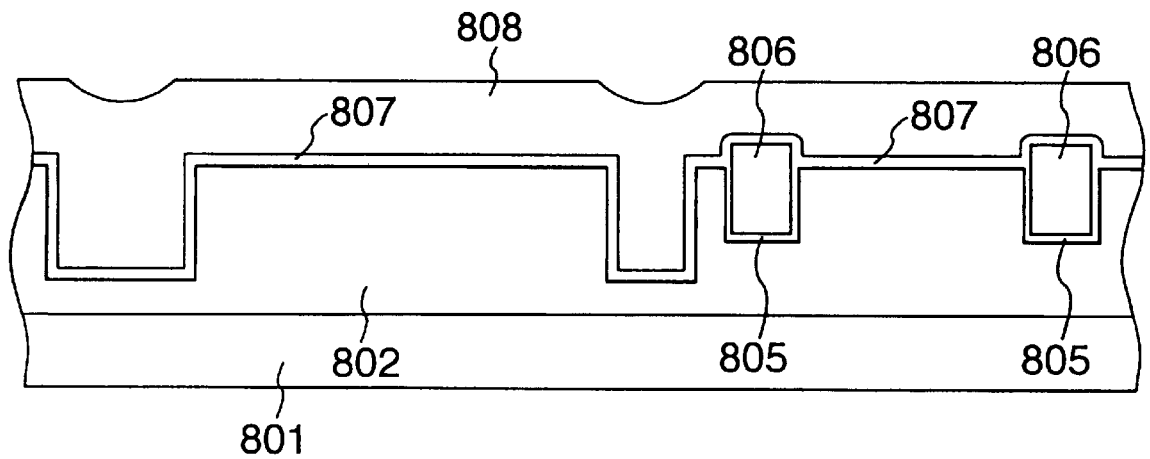
Figures 1J, 8:
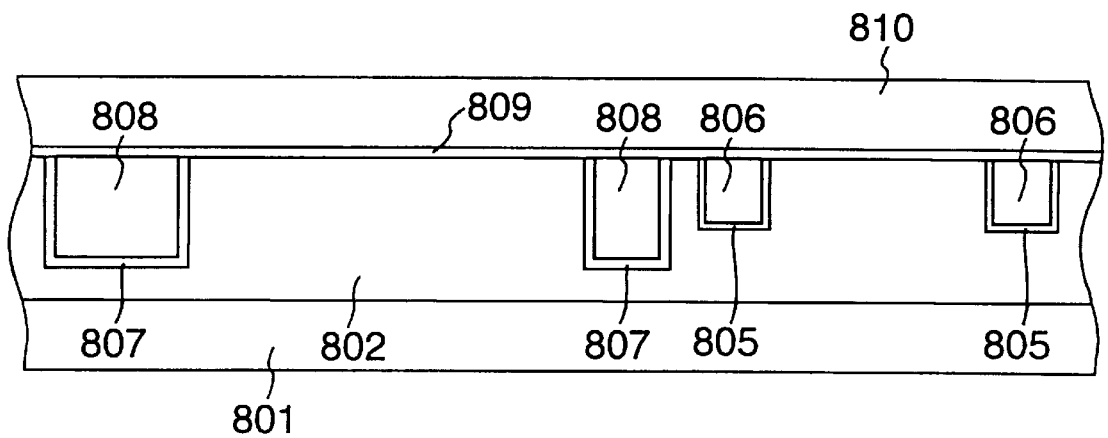
Figures 1K, 8:
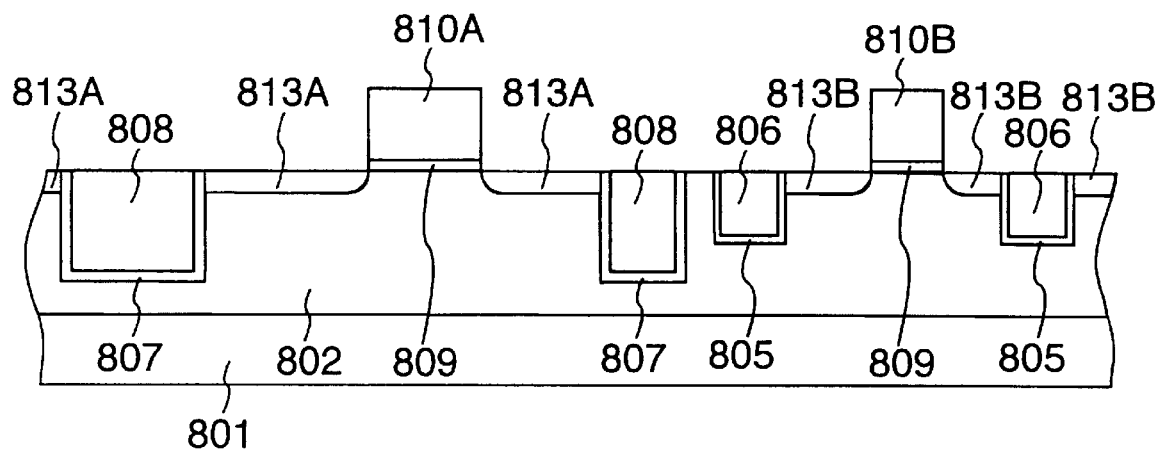
Figures 2, 8:
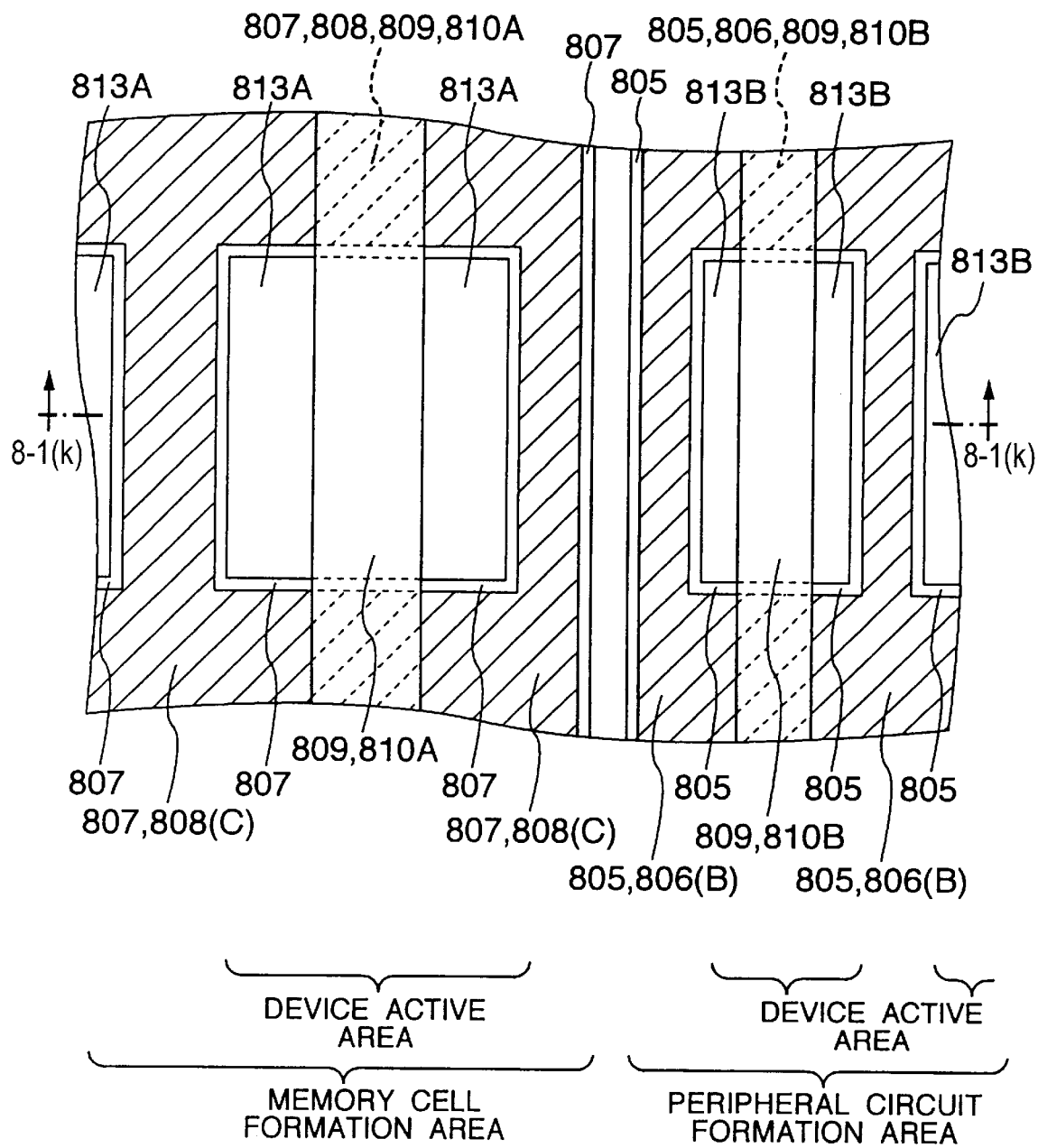

The plan view of FIG. 1—1(k) is shown in FIG. 1–2. In FIG. 1–2, reference numeral 15 denotes a silicon dioxide film as a buried insulating film and reference numerals 17, 18, 21 and 22 denote a shield gate insulating film, an electrode, a cap insulating film and a sidewall insulating film of the field shield device isolation structure, respectively. Reference numerals 23, 24 and 25 denote a gate insulating film, a gate electrode and a source-drain diffusion layer, respectively.

As shown in FIG. 1—1(l), a silicon dioxide film 26 as an inter-level insulating film is deposited to the entire surface by the CVD process, and a contact hole 26a reaching the impurity diffusion layer 25 is opened in the silicon dioxide film 26, etc. An aluminum (Al) film 27 is deposited to the entire surface by sputtering, and after this Al film 27 is etched into the pattern of a wiring by fine etching technology, a silicon dioxide film 28 is deposited to the entire surface as an inter-level insulating film.

In the first embodiment described above, the silicon dioxide film 15 formed by the selective oxidation process and having a thickness of about 400 nm is exposed by only a half of its thickness, i.e. about 200 nm, on the surface of the silicon substrate 11, whereas the sum of the thickness of the polysilicon film 28 and the silicon dioxide films 17 and 21 for the device isolation by the field shield process is 350 nm. Moreover, these films exist on the surface of the silicon substrate 11 in their full thickness.

Therefore, when these device isolation areas are merely formed on the silicon substrate 11 as in the prior art devices, the areas formed by the field shield process become higher by about 150 nm than the areas using the selective oxidation process. In the embodiment of the present invention, however, the surface of the areas using the field shield process is lower by about 200 nm, as the thickness $\underline{a}$ as shown in FIG. 1—1(e), than the surface of the areas using the selective oxidation process. For this reason, after the device isolation area is formed, a step of only 50 nm exists between these areas.

In the first embodiment, the areas shown on the right side of FIGS. 1—1(a) to 1—1(l) and FIG. 1–2 are the peripheral circuit areas and the areas shown on the left side are memory cell areas such as DRAMs, EEPROMs, and so forth. This is because the device isolation areas by the selective oxidation process are more suitable for the CMOS circuit formed in the peripheral circuit areas than the device isolation areas by the field shield process, and the device isolation areas by the field shield process are more suitable for the memory cell areas than the device isolation areas by the selective oxidation process.

The semiconductor device according to this first embodiment has two areas where the height of the silicon substrate 11 is mutually different. Therefore, when devices having a greater height are formed on the area having a smaller height of the surface of the silicon substrate 11, the step of the surface of the inter-level insulating film on the device can be reduced throughout the entire areas of the silicon substrate 11.

Since the first embodiment can reduce the step between the first area for forming the device isolation area by the selective oxidation process and the second area for forming the device isolation area by the field shield process, the wiring can be easily formed on the semiconductor substrate, and the semiconductor device having high reliability can be produced.

Since the first area is suitable for the CMOS circuit and the second area has an excellent device isolation capacity, the memory cell area having a high integration density and the peripheral circuit area having the CMOS structure can be obtained, and the wiring can be easily formed on the semiconductor substrate. Further, reliability is high.

The step of the surface of the inter-level insulating film on the device can be reduced in the entire area of the semiconductor substrate by disposing the devices having a large height on the lower surface area of the semiconductor substrate, and the wiring can be easily formed on this inter-level insulating film and reliability can be improved.

In the peripheral circuit formation area and the memory cell formation area, the height of the respective gate electrodes 24 (the height from the surface layer of the semiconductor substrate to the surface layer of the gate electrode) is made mutually different so that the surface layers of the respective gate electrodes exist substantially at the same level. According to this structure, the step of the surface of the inter-level insulating film on the device can be further reduced.

In this instance, the difference of the height of the respective gate electrodes in both the peripheral circuit formation area and the memory cell formation area is substantially equal to the difference of the height of the device active areas in both these areas, and is substantially at least ½ of the silicon dioxide film 15 (formed by the selective oxidation process) in the peripheral circuit formation area. In other words, this value is determined depending on how much the surface of the surface of the silicon substrate 11 is oxidized (its thickness $\underline{a}$). Since the thickness of the silicon dioxide film 15 is about 400 nm and $\underline{a}$ is about 200 nm, for example, in this embodiment, the difference of the height of the gate electrodes in these areas is about ½ of the silicon dioxide film 15.

Incidentally, the structure wherein the surface layers of the gate electrodes of the peripheral circuit formation area and the memory cell formation area are so arranged as to exist at substantially the same level by varying the height of the respective gate electrodes can be applied to all the embodiments of the invention other than Embodiment 8, and will be described in detail particularly in Embodiments 9 and 10 with reference to the drawings.

Furthermore, such a structure can be similarly applied to all the electrodes other than the gate electrodes described above.

Embodiment 2:

Next, the second embodiment of the present invention will be explained with reference to FIGS. 2-1(a) to 2-1(n) and FIG. 2—2.

Figures 1M, 2:
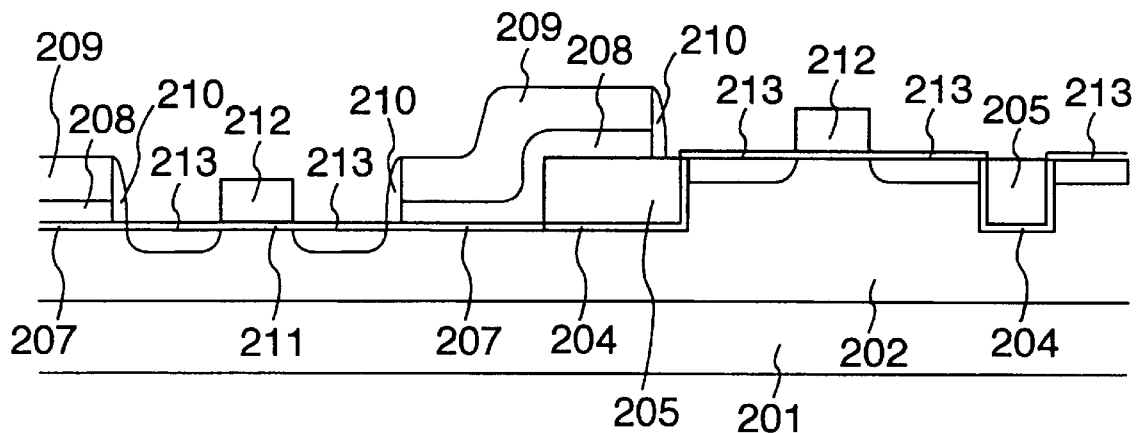
Figures 1N, 2:
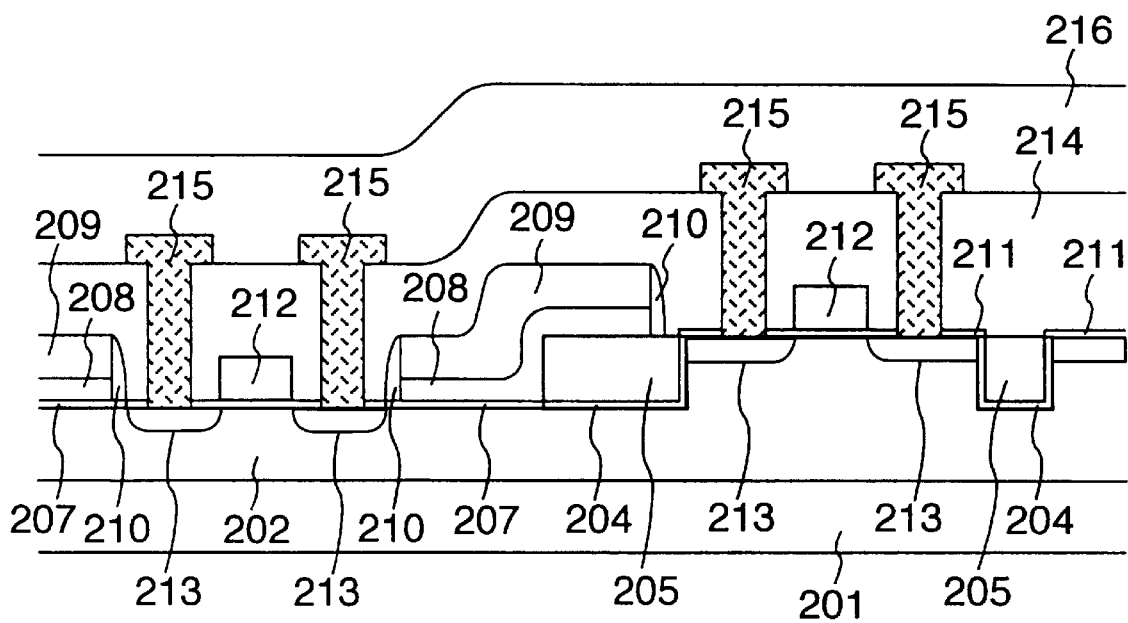
Figure 2:
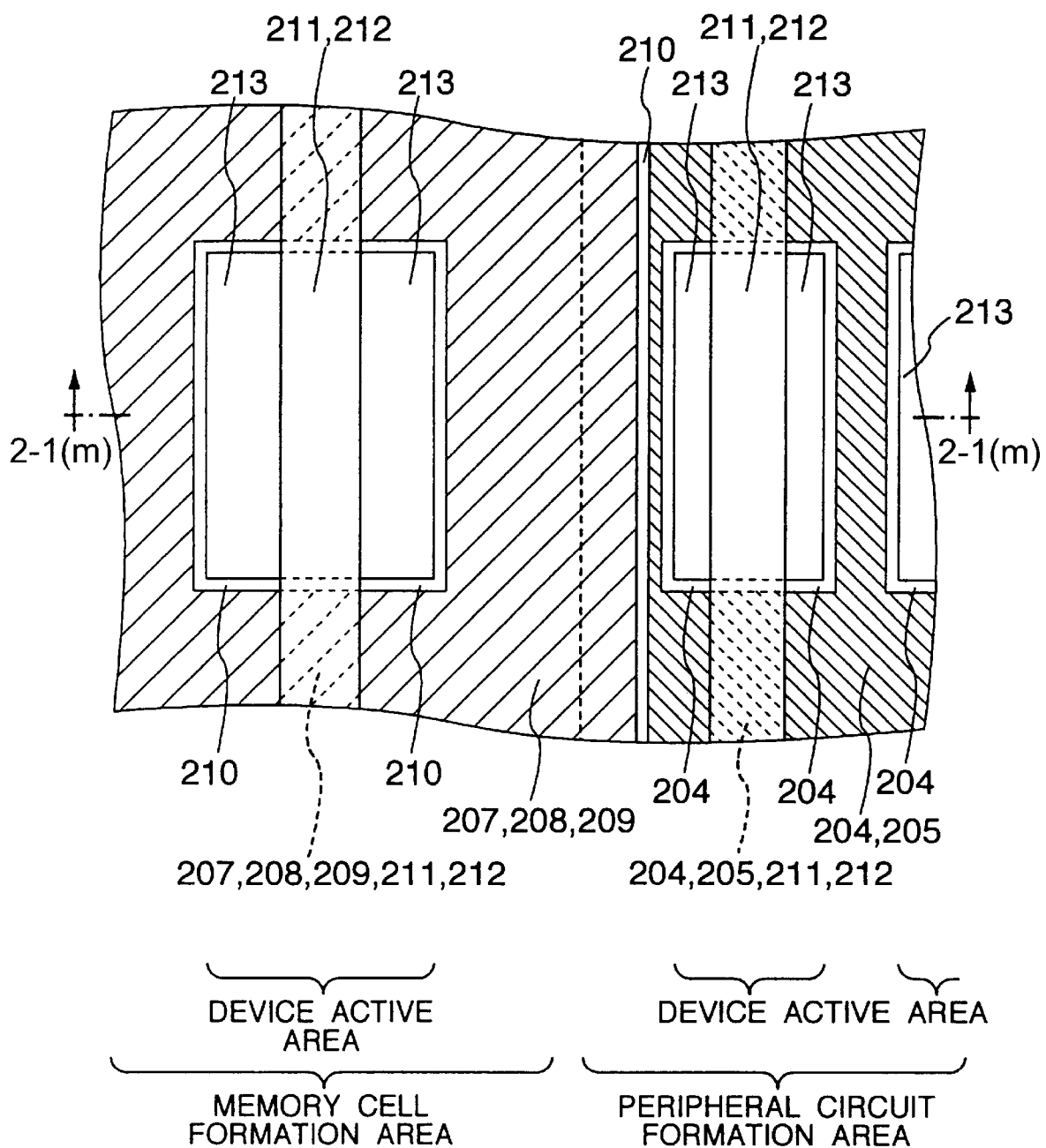

FIGS. 2-1(a) to 2-1(n) show the production steps of a production method of a semiconductor device according to the second embodiment of the present invention, and FIG. 2—2 is a plan view of FIG. 2-1(m). The transverse sectional view taken along a line A–A' of FIG. 2—2 corresponds to FIG. 2-1(m). In these drawings, the areas shown on the right side are the peripheral circuit formation areas, and the areas shown on the left sides are the memory formation areas. Further, the area encompassed by a device isolation structure in the areas on the right side is the device active area.

As shown in FIG. 2-1(a), boron ions are implanted at an implantation energy of 60 keV and in a dose of $1\times10^{13}$ cm$^{-2}$ into a P type silicon substrate 201, and impurities are then diffused and activated by heat-treatment at 1,100° C. for 6 hours, forming thereby a P type well area 202 made of boron in the silicon substrate 201.

Figures 1, 1B:
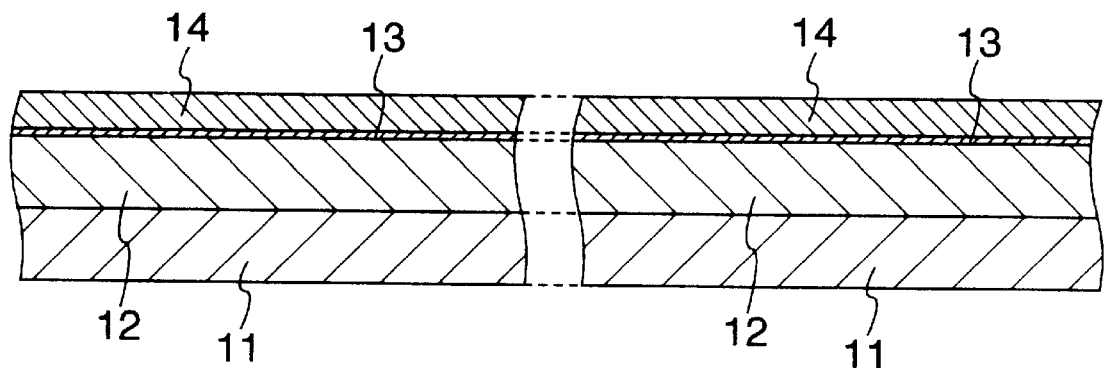

Next, as shown in FIG. 2-1(b), thermal oxidation is applied to the surface of the silicon substrate 201 on which the P type well area 202 is formed so as to form an about 40 nm-thick silicon dioxide film 203 on the silicon substrate 201. At the same time, the silicon dioxide film at portions other than the device active area of the peripheral circuit formation area is removed by etching. Needless to say, the silicon oxide film of the memory cell formation area is fully removed by etching.

Figures 1, 1C:
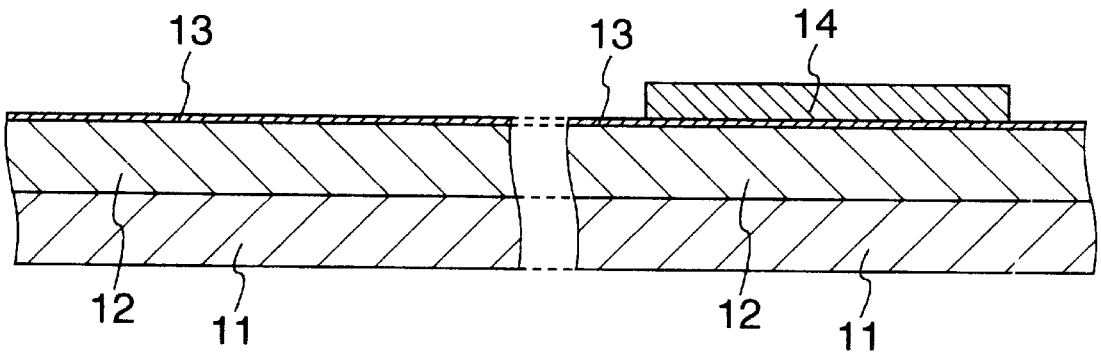

Next, the silicon substrate 201 is removed by etching in a thickness of about 400 nm by using the silicon dioxide film 203 as the mask as shown in FIG. 2-1(c), so as to form a ditch B and a recess C in the silicon substrate 201. Here, the ditch B is formed round the device active area inside the peripheral circuit formation area, and serves as a device isolation area after post-step is executed. The recess C serves as a memory cell formation area after post-step is executed, too. The ditch B communicates with the recess C at the boundary between the memory cell formation area and the peripheral circuit formation area as can be seen clearly from the drawings.

Figures 1, 1D:
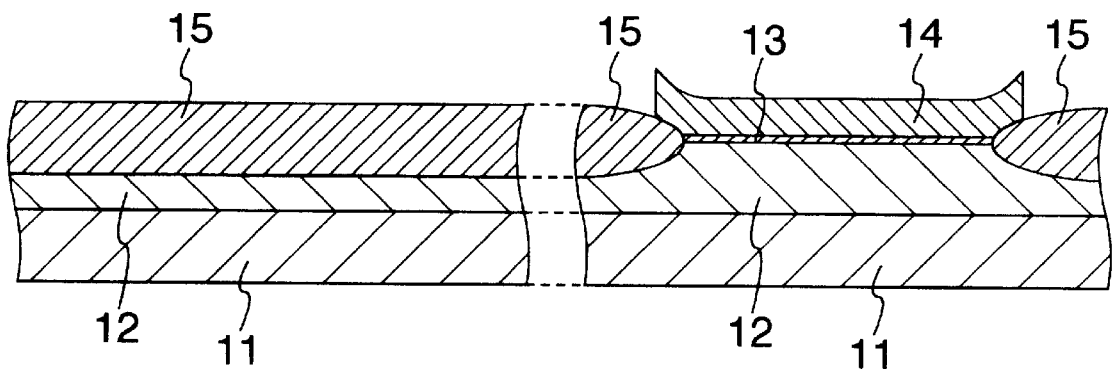
Figures 1, 1E:
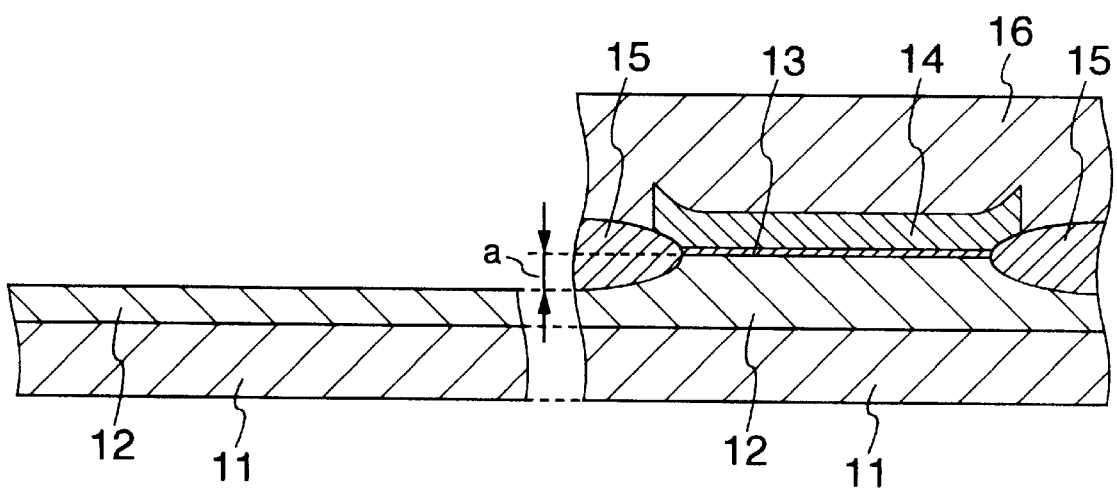

An about 20 nm-thick silicon dioxide film 204 s a thermal oxidation film is then formed on the P type silicon substrate 201 by applying thermal oxidation, as shown in FIG. 2-1(d).

An about 400 nm-thick silicon dioxide film 205 is formed by the CVD process over the entire surface of the silicon substrate 201 as shown in FIG. 2-1(e).

Figures 1, 1F:
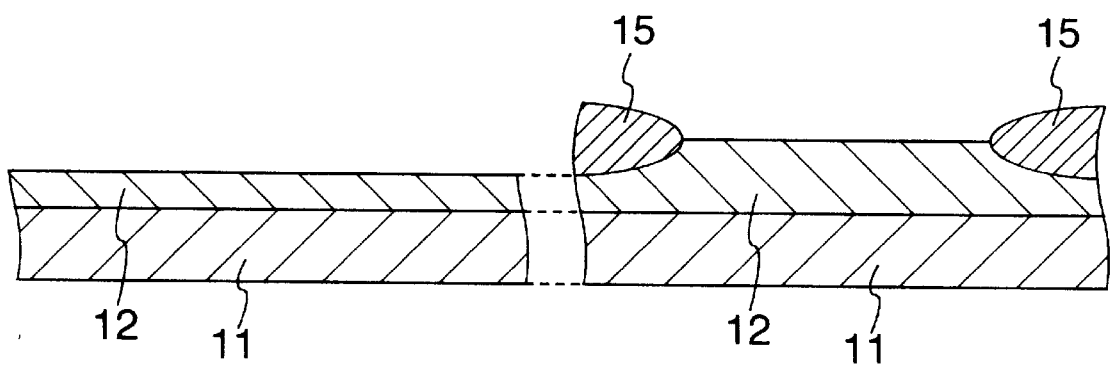

Next, as shown in FIG. 2-1(f), the peripheral circuit formation area is covered with a photoresist film 206 and etching is effected. This etching is carried out until the surface of the silicon substrate 201 of the memory cell formation area is exposed under the condition that the etching rate of the photoresist film 205 is substantially equal to that of the silicon dioxide film 205.

Figures 1, 1G:
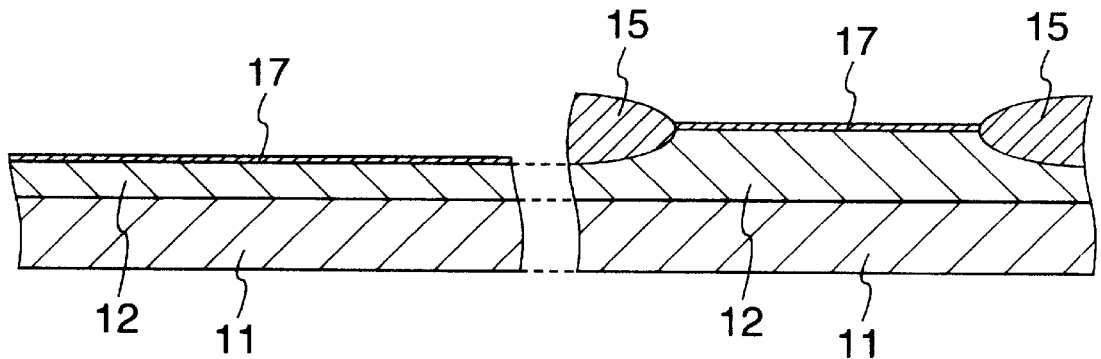

In consequence, the silicon dioxide film 205 which is to serve as a buried insulating film is formed round the device active area of the peripheral circuit formation area, as shown in FIG. 2-1(g).

The surface of the p type silicon substrate 201 is then thermally oxidized as shown in FIG. 2-1(k), and an about 40 nm-thick shield gate insulating film 7 is formed. At this time, the insulating film is formed on the exposed surface of the peripheral circuit formation area, too.

Figures 1, 1H:
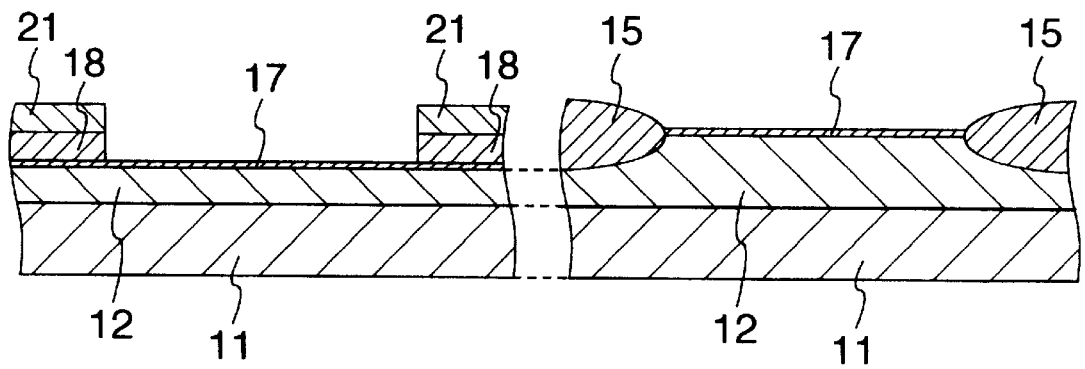
Figures 1, 1I:
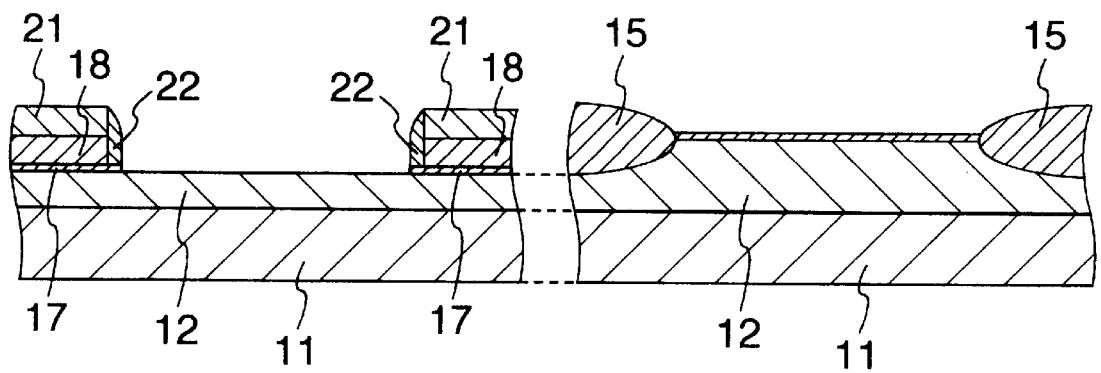

Next, an about 100 nm-thick polysilicon film 208 which will later serve as a field shield electrode is formed by the CVD process as shown in FIG. 2-1(i), and phosphorus is thermally diffused so as to lower the resistance. A silicon dioxide film 209 (which will later serve as a cap insulating film) covering the polysilicon film 208 is then formed into a thickness of about 300 nm by the CVD process.

Next, a photoresist film, not shown, is formed on the silicon dioxide film 209, and is patterned into the shape of the device isolation area using the field shield device isolation method, as shown in FIG. 2-1(j). The silicon dioxide film 209 and the polysilicon film 208 are selectively etched and removed by using this patterned silicon dioxide film 209, not shown, so as to form the field shield electrode 208 and the cap insulating film 209, respectively. At this time, a part of each of the field shield electrode 208 and the cap insulating film 209 is formed in superposition on, and with, a part of the silicon dioxide film 205 serving as the buried insulating film, at the boundary between the memory formation area and the peripheral circuit formation area.

Next, an about 200 nm-thick silicon dioxide film 210 is deposited over the entire surface by the CVD process as shown in FIG. 2-1(k), and is then etched back anisotropically so as to form a sidewall insulating film 210 comprising the silicon dioxide film on the sidewall surface of each of the field shield electrode 208 and the cap insulating film 209. At this time, the shield gate insulating film 207 is removed from the device active areas of both of the peripheral circuit formation area and the memory cell formation area. As a result of the process steps described above, a field shield device isolation structure (comprising the shield gate insulating film 207, the shield gate electrode 208, the cap oxide film 209 and the sidewall insulating film 210) is formed in the memory cell formation area, and a part of each of the shield gate electrode 208, the cap oxide film 209 and the sidewall insulating film 210 is formed on a part of the silicon dioxide film 205 to serve as a buried insulating film, too.

Next, the exposed surface of the silicon substrate 201 is thermally oxidized to form an about 15 nm-thick gate insulating film 211 as shown in FIG. 2-1(l). Next, an about 200 nm-thick polysilicon film is formed on this gate insulating film by the CVD process, and phosphorus is then thermally diffused so as to lower the resistance. A photoresist having a predetermined pattern (not shown) is then deposited on this polysilicon film, and the polysilicon film is etched into a predetermined pattern by using the photoresist as the mask so as to form a gate electrode 212.

Arsenic ions are then implanted at an implantation energy of 60 keV and in a dose of $5 \times 10^{15}$ cm$^{-2}$ for heat treatment by using the gate electrode 21, the field device isolation structure (comprising the shield gate insulating film 207, the shield gate electrode 208, the cap oxide film 209 and the sidewall insulating film 210) and the silicon dioxide film 205 as the mask so as to form a source-drain diffusion layer 213.

FIG. 2—2 shows the plan view of FIG. 2-1(n). In FIG. 2—2, reference numeral 204 denotes the silicon dioxide film and reference numeral 205 denotes the silicon dioxide film to serve as the buried insulating film. Reference numerals 207, 208, 209 and 210 denote the shield gate insulating film, the electrode, the cap, the insulating film and the sidewall insulating film of the field shield device isolation structure, respectively. Reference numeral 211 denotes the gate insulating film, reference numeral 212 denotes the gate electrode and reference numeral 213 denotes the source-drain diffusion layer.

Thereafter, a silicon dioxide film as a first inter-level insulating film 214 is deposited over the entire surface by the CVD process, etc, as shown in FIG. 2-1(m), and contact holes are bored at predetermined positions of this first inter-level insulating film 214. Next, an aluminum wiring 215 is formed by sputtering and fine etching, and a silicon dioxide film as a second inter-level insulating film 216 is formed on the aluminum wiring 215 by the CVD process.

As a result of the process steps described above, the formation area of the field shield device isolation structure can be formed at a lower position than the formation area of the silicon dioxide film of the buried insulating film device isolation. Therefore, this process makes a great contribution to the requirement for flattening in the semiconductor device production process.

Embodiment 3:

The third embodiment of the present invention will be explained with reference to FIGS. 2-1(a) to 2-1(b), FIGS. 3-1(a) to 3-1(l) and FIG. 3-2.

Figures 1A, 3:
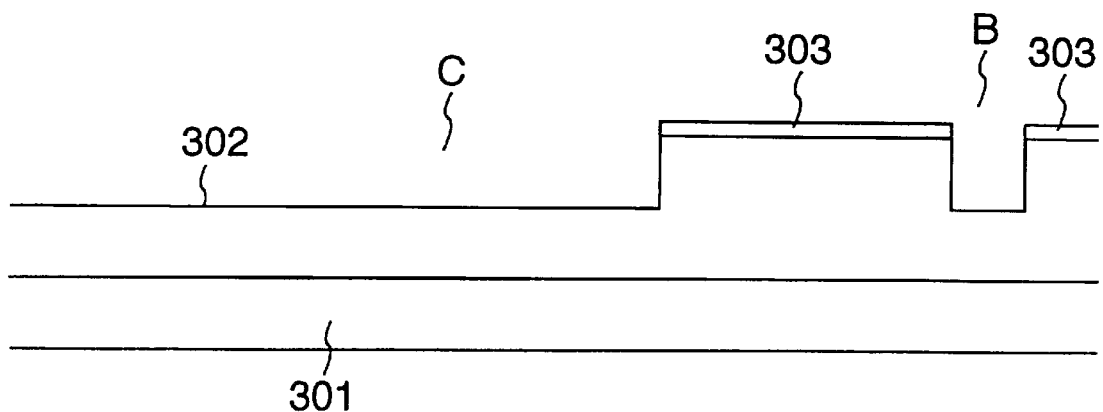
Figures 1B, 3:
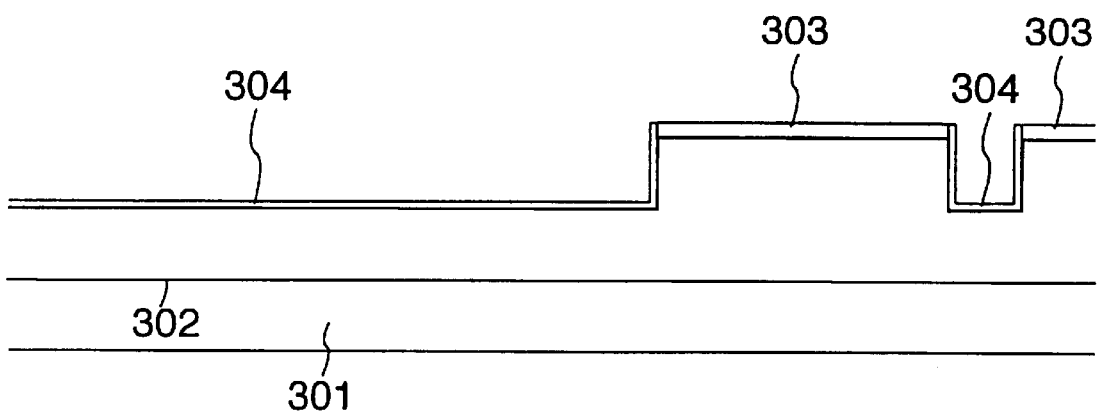
Figures 1C, 3:
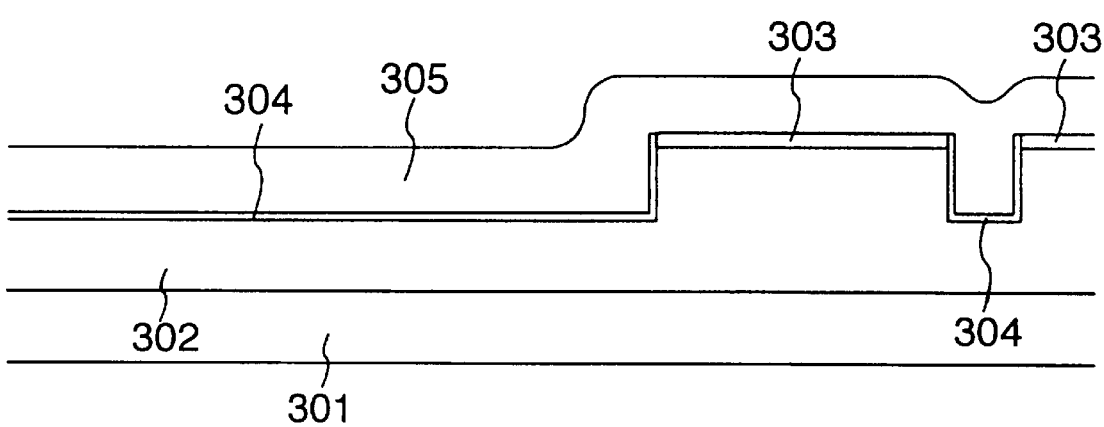
Figures 1D, 3:
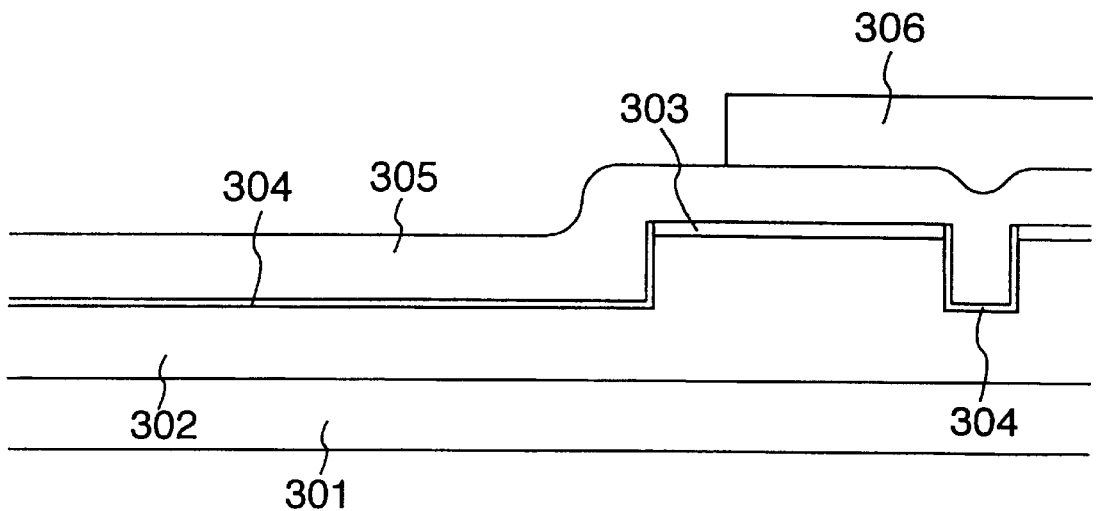
Figures 1E, 3:
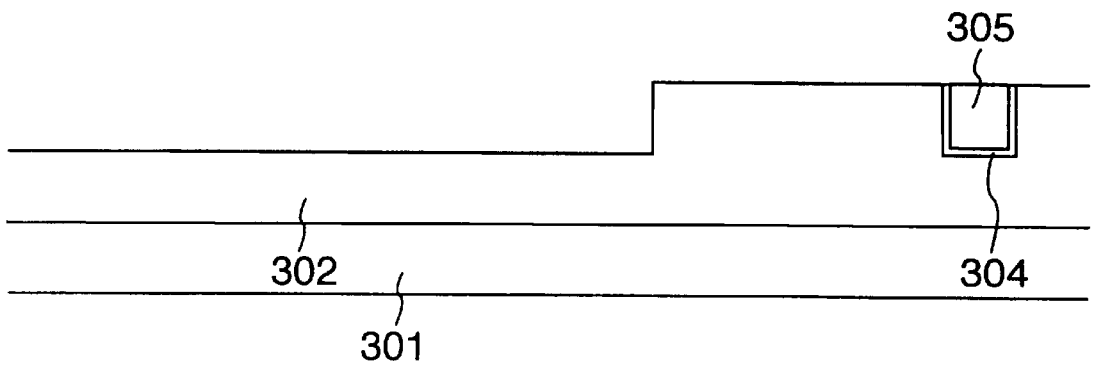
Figures 1F, 3:
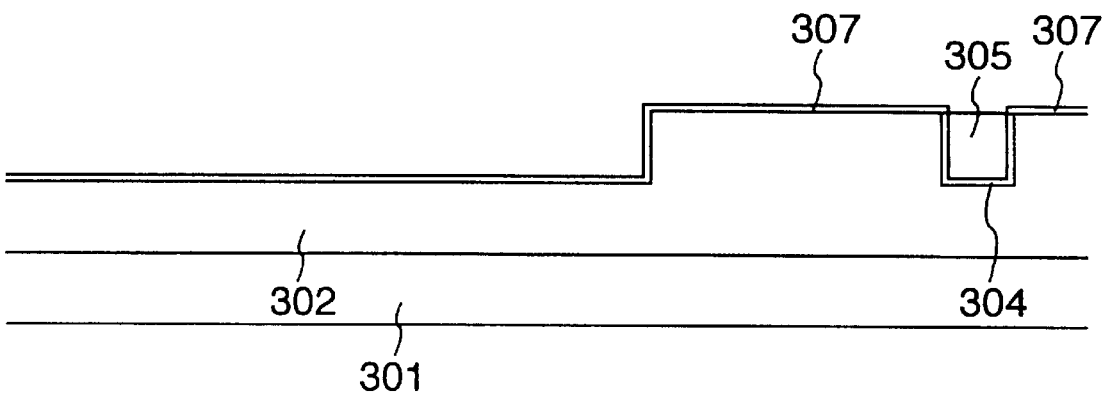
Figures 1G, 3:
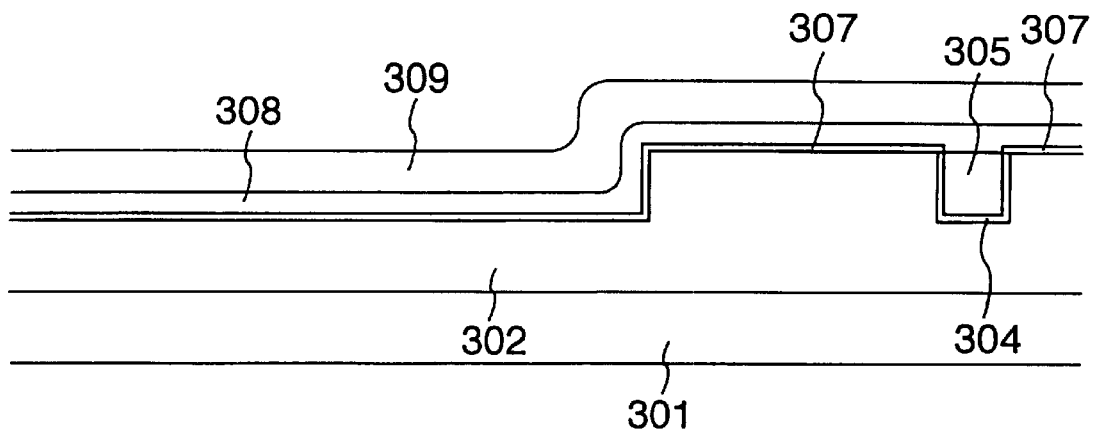
Figures 1H, 3:
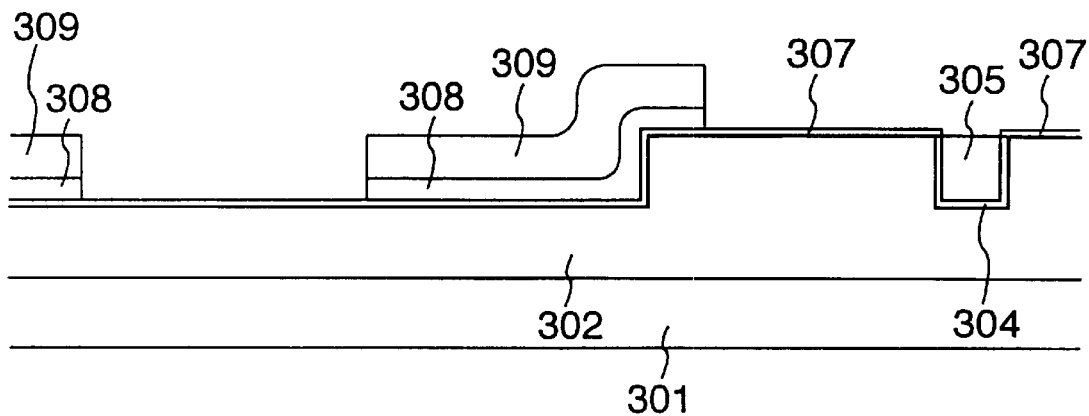
Figures 1I, 3:
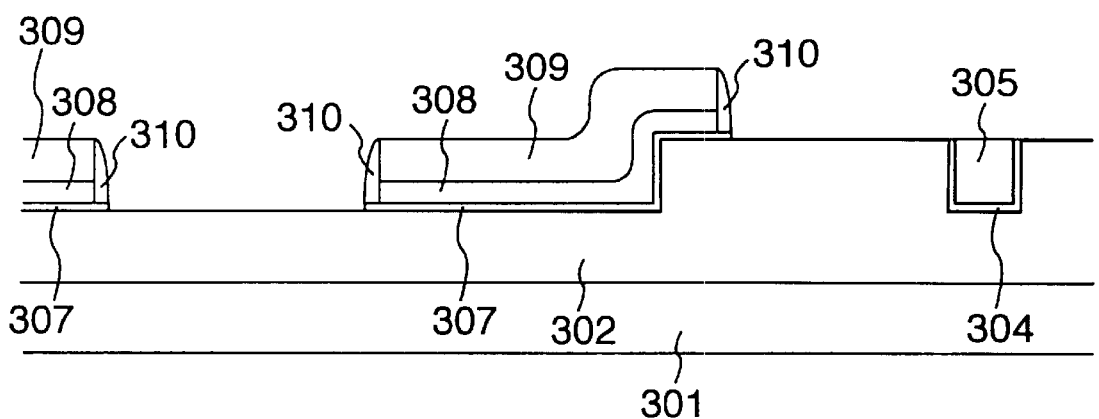
Figures 2, 3:
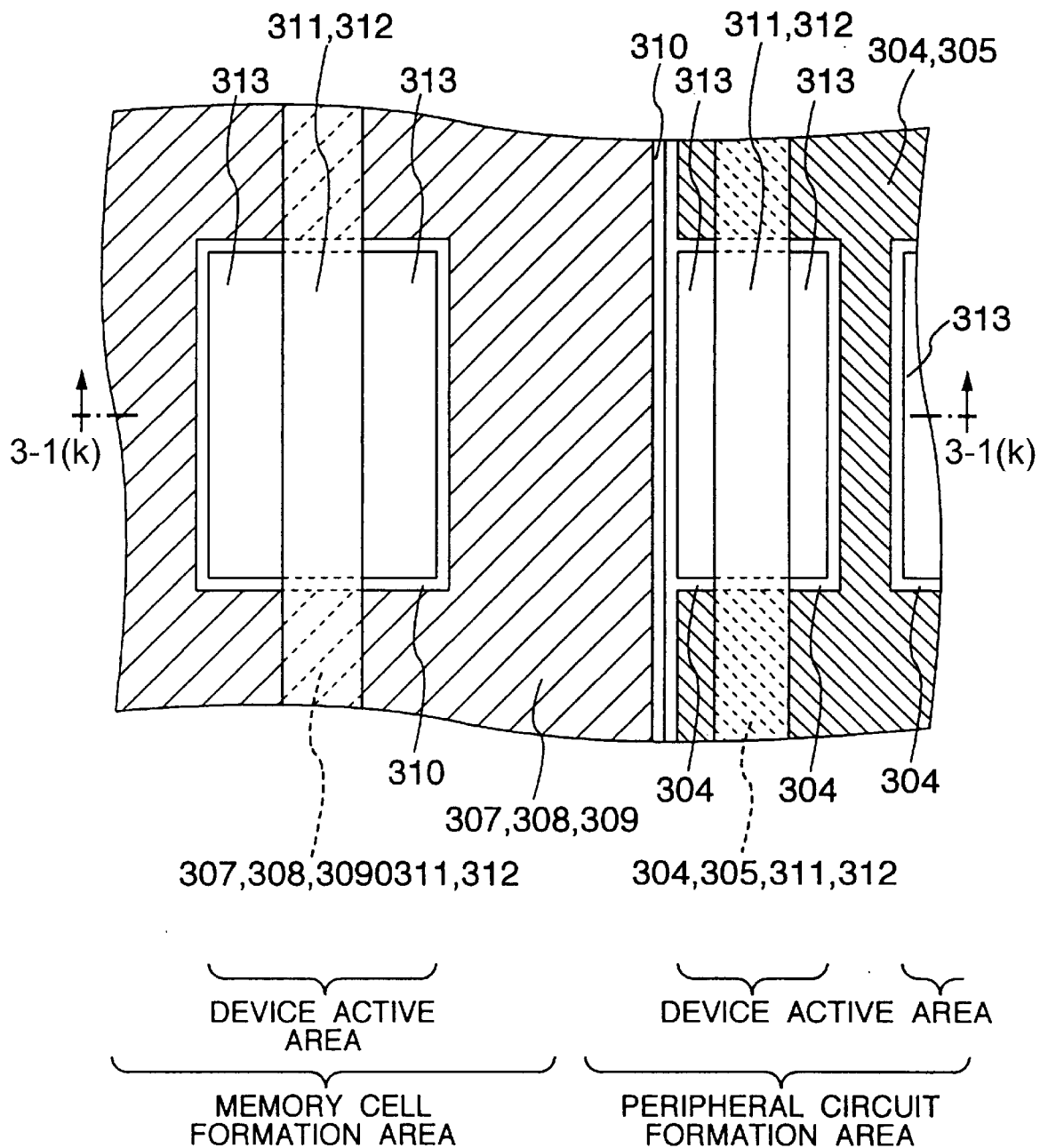

FIGS. 2-1(a) to 2-1(b) and FIGS. 3-1(a) to 3-1(l) show the production steps of a production method of a semiconductor device according to the third embodiment of the present invention. FIG. 3-2 corresponds to the plan view of FIG. 3-1(k). In other words, the transverse sectional view taken along A–A' of FIG. 3-2 shows FIG. 3-1(k). In these drawings, the area shown on the right side is a peripheral circuit formation area, and the area shown on the left side is a memory cell formation area, such as DRAMs, for example. In the areas on both the right and left sides, the area encompassed by a device isolation structure is a device active area.

In the production method of the third embodiment, the process steps up to the step shown in FIG. 3-1(b) are the same as those of the production method of the second embodiment shown in FIGS. 2-1(a) to 2-1(b). After the step shown in FIG. 2-1(b) is completed, the silicon substrate 301 is removed by etching by a thickness of about 400 nm by using the silicon dioxide film 303 as the mask in this third embodiment as shown in FIG. 3-1(a), so as to form a ditch B and a recess C inside the silicon substrate 301. Here, the ditch B is formed round the device active area inside the peripheral circuit formation area but exclusive of the boundary with the memory cell formation area (in this point, this embodiment is different from the second embodiment), and serves as the device isolation area after post-step is executed. The recess C serves as the memory cell formation area after post-step is executed, too.

Next, thermal oxidation is applied to the p type silicon substrate 301 as shown in FIG. 3-1(b) to form an about 20 nm-thick silicon dioxide film 304 as a thermal oxidation film.

Next, as shown in FIG. 3-1(c), a silicon dioxide film 305 is deposited by the CVD process over the entire surface of the silicon substrate 301.

The peripheral circuit formation area of the peripheral circuit area is covered with a photoresist film 306 as shown in FIG. 3-1(d) and etching is applied thereto. This etching is carried out until the surface of the silicon substrate 201 of the memory cell formation area is exposed under the condition that the etching rate of the photoresist film 306 is substantially equal to that of the silicon dioxide film 305.

In consequence, the silicon dioxide film 305 which will serve as the buried insulating film is formed in the peripheral circuit formation area as shown in FIG. 3-1(e). Unlike the second embodiment, however, the silicon dioxide film in this third embodiment is not formed at the boundary portion with the memory cell formation area.

The subsequent production steps are substantially the same as those of the second embodiment. In other words, as shown in FIG. 3-1(f), an about 40 nm-thick shield gate oxide film 307 is formed on the surface of a p type silicon substrate 301.

Next, an about 100 nm-thick polysilicon film 308 is formed by the CVD process as shown in FIG. 3-1(g), and phosphorus is thermally diffused so as to lower the resistance. Next, an about 300 nm-thick silicon dioxide film 309 is formed over the entire surface by the CVD process.

The silicon dioxide film 309 and the polysilicon film 308 are then etched and removed selectively by using a patterned photoresist film, not shown, to form a field shield electrode 308 and a cap insulating film 309, as shown in FIG. 3-1(k). The field shield electrode 308 and cap insulating film 309 constitute a field shield device isolation structure inside the memory cell formation area in cooperation with the field gate insulation film 307 and with a sidewall oxide film to be later formed (see FIG. 3-1(i)). At the same time, this field shield device isolation structure continuously extends to the boundary area with the peripheral circuit formation area, and constitutes a part of the device isolation area of the peripheral circuit formation area.

Next, a sidewall oxide film 310 is formed in the same way as in Embodiment 2 as shown in FIG. 3-1(i).

A gate insulating film 311 is then formed as shown in FIG. 3-1(j) and a gate electrode is formed on this gate insulating film 311.

A source-drain diffusion layer 313 is then formed as shown in FIG. 3-1(k).

FIG. 3-2 is the plan view of FIG. 3-1(k). In FIG. 3-2, reference numeral 304 denotes a silicon dioxide film and reference numeral 305 denotes a silicon dioxide film which will serve as a buried insulating film. Reference numerals 307, 308, 309 and 310 denote the shield gate insulating film, the electrode, the cap insulating film and the sidewall insulating film of the field shield device isolation structure, respectively. Reference numeral 311 denotes the gate insulating film, reference numeral 312 denotes the gate electrode and reference numeral 313 denotes the source-drain diffusion layer.

Subsequently, a first inter-level insulating film 314, an aluminum wiring 315 and a second inter-level insulating film 316 are formed as shown in FIG. 3-1(l).

According to this third embodiment, too, the area for forming the field device isolation structure is formed lower than the area for forming the silicon dioxide film of buried insulating film device isolation. Therefore, this embodiment contributes to the requirement for flattening in the production process of the semiconductor device.

Because the field shield device isolation structure serves also as the device isolation structure between the peripheral circuit formation area and the memory cell formation area at their boundary, the space factor can be improved.

Embodiment 4:

Next, the fourth embodiment of the present invention will be explained with reference to FIGS. 4-1(a) to 4-1(n) and FIG. 4-2.

Figures 1A, 4:
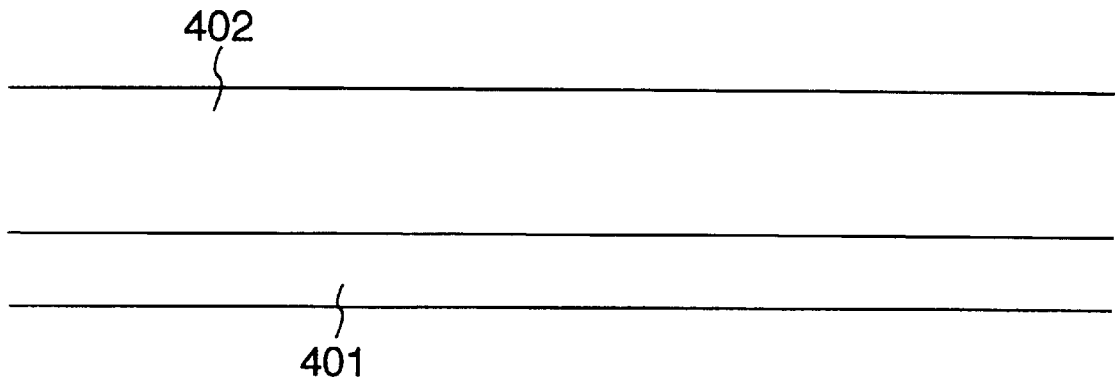
Figures 1B, 4:
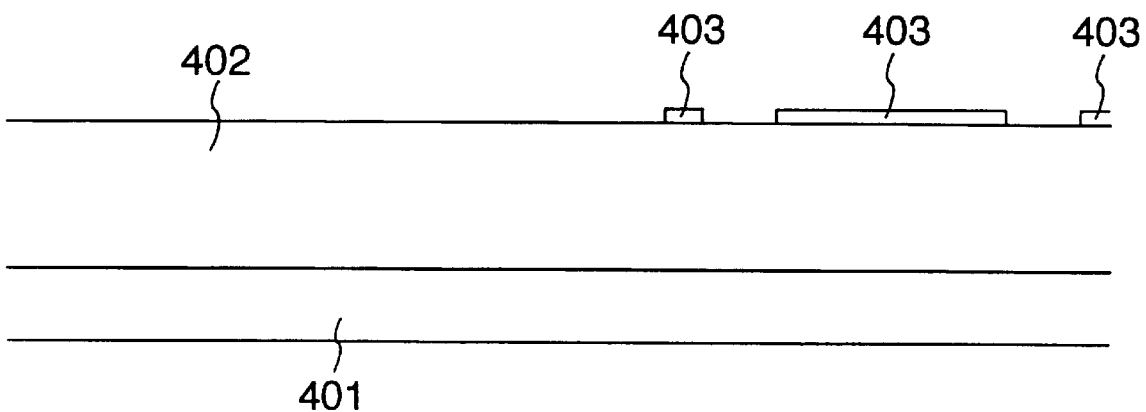
Figures 1C, 4:
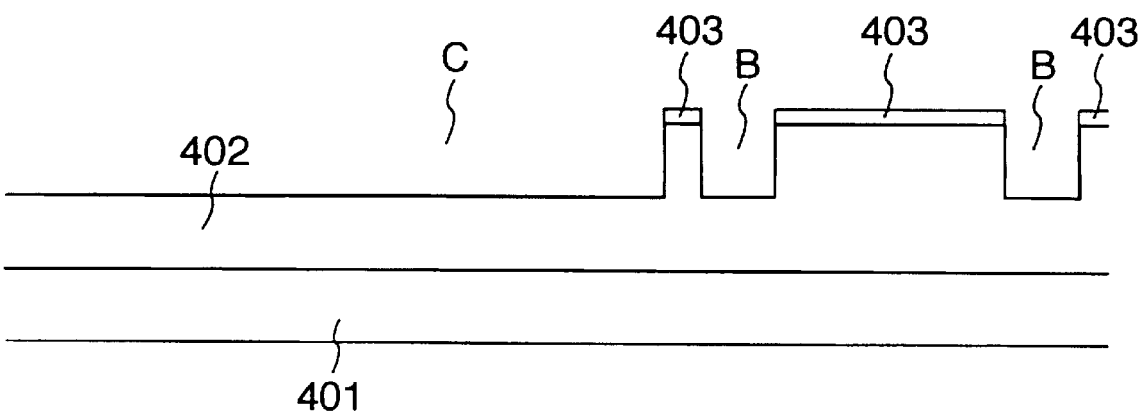
Figures 1D, 4:
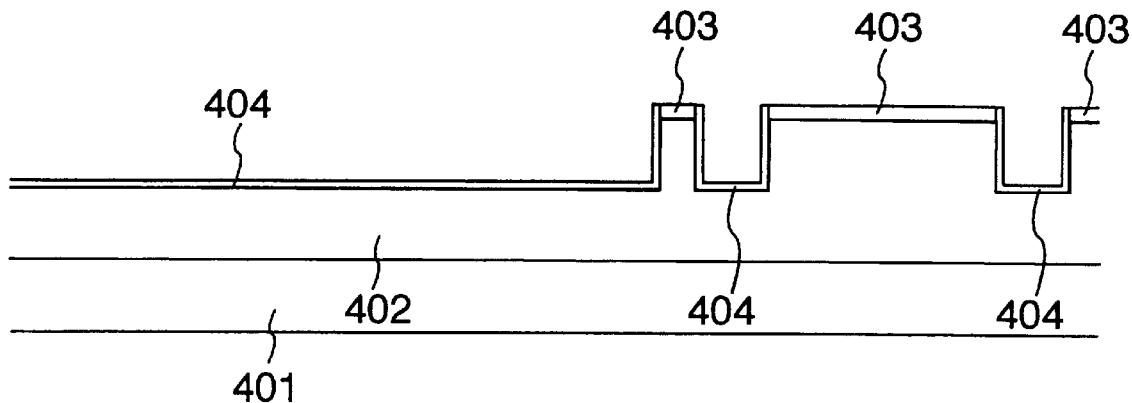
Figures 1E, 4:
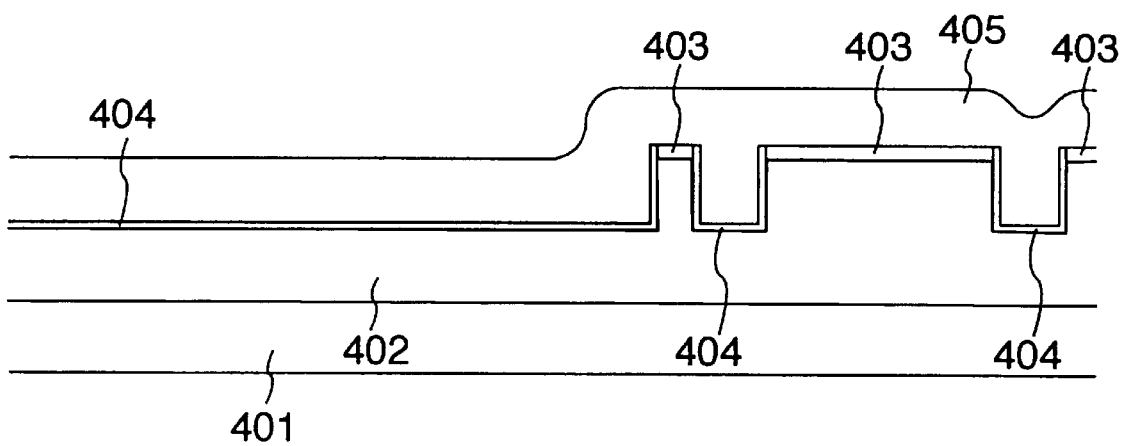
Figures 1F, 4:
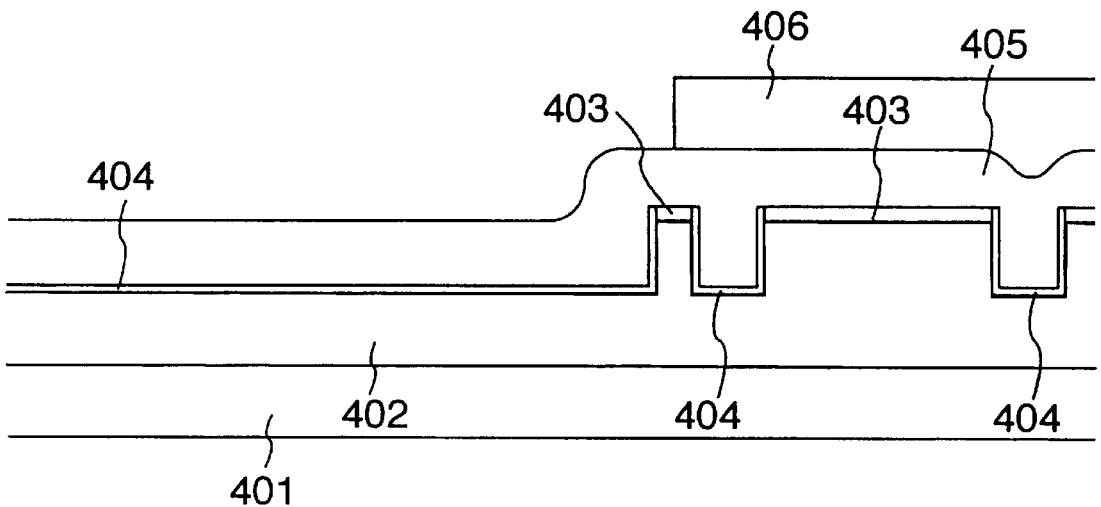
Figures 1G, 4:
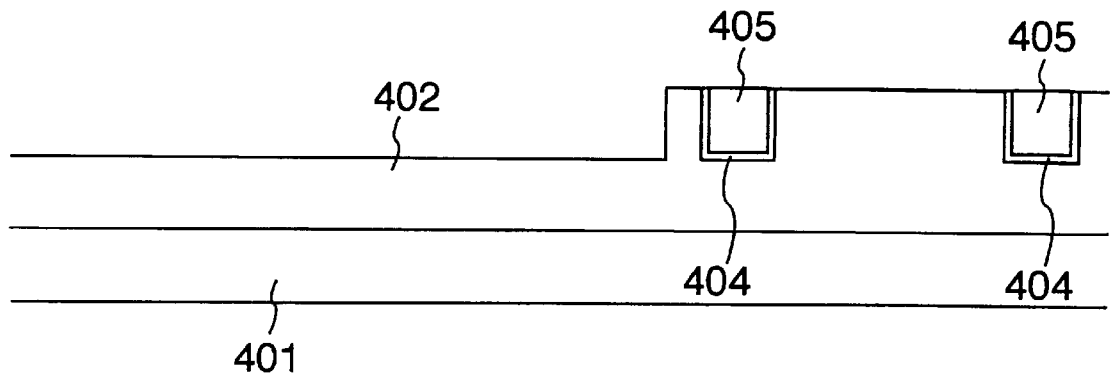
Figures 1H, 4:
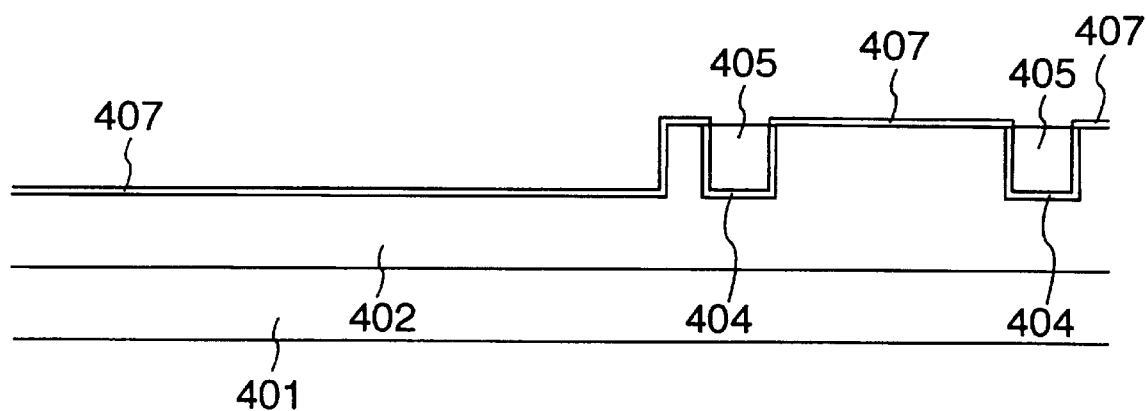
Figures 1I, 4:
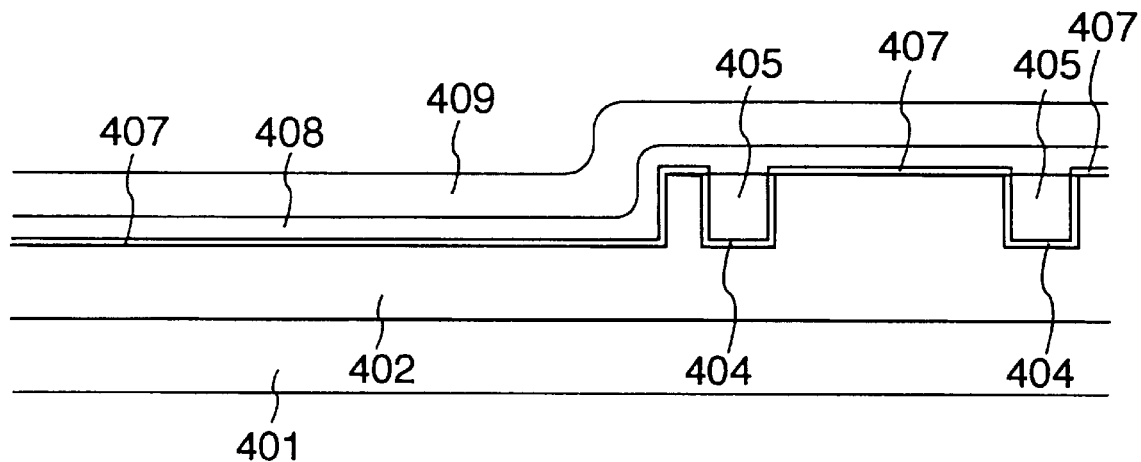
Figures 1M, 4:
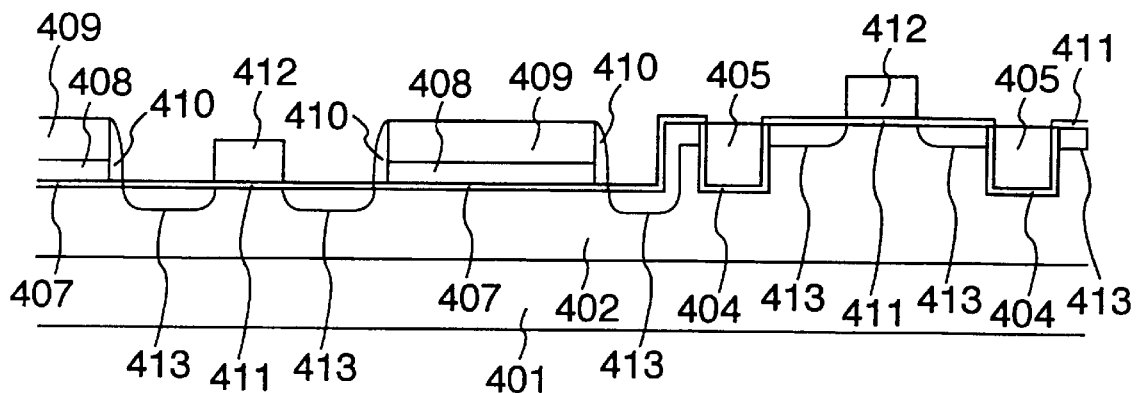
Figures 1N, 4:
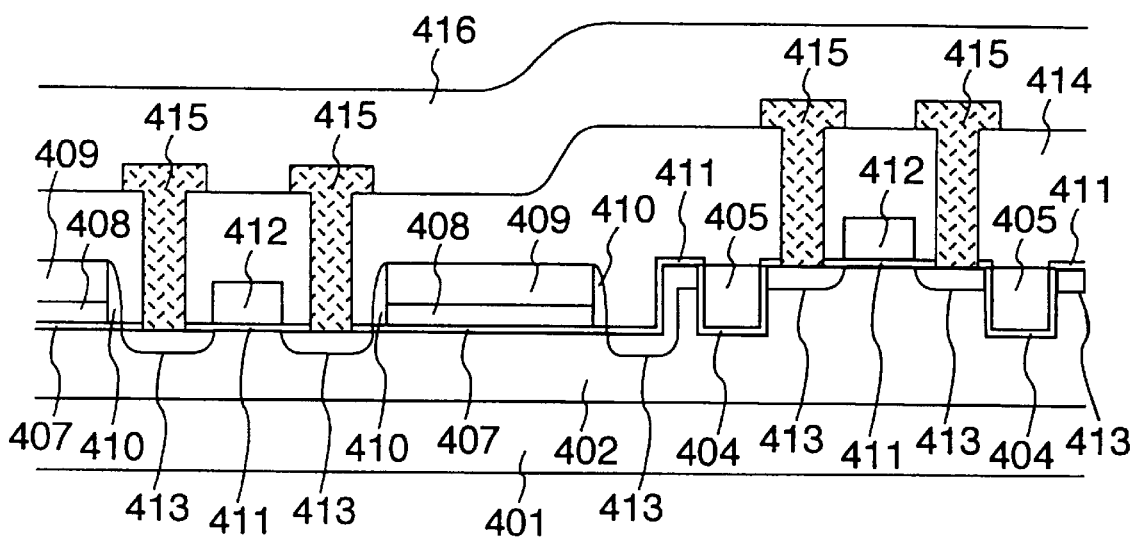
Figures 2, 4:
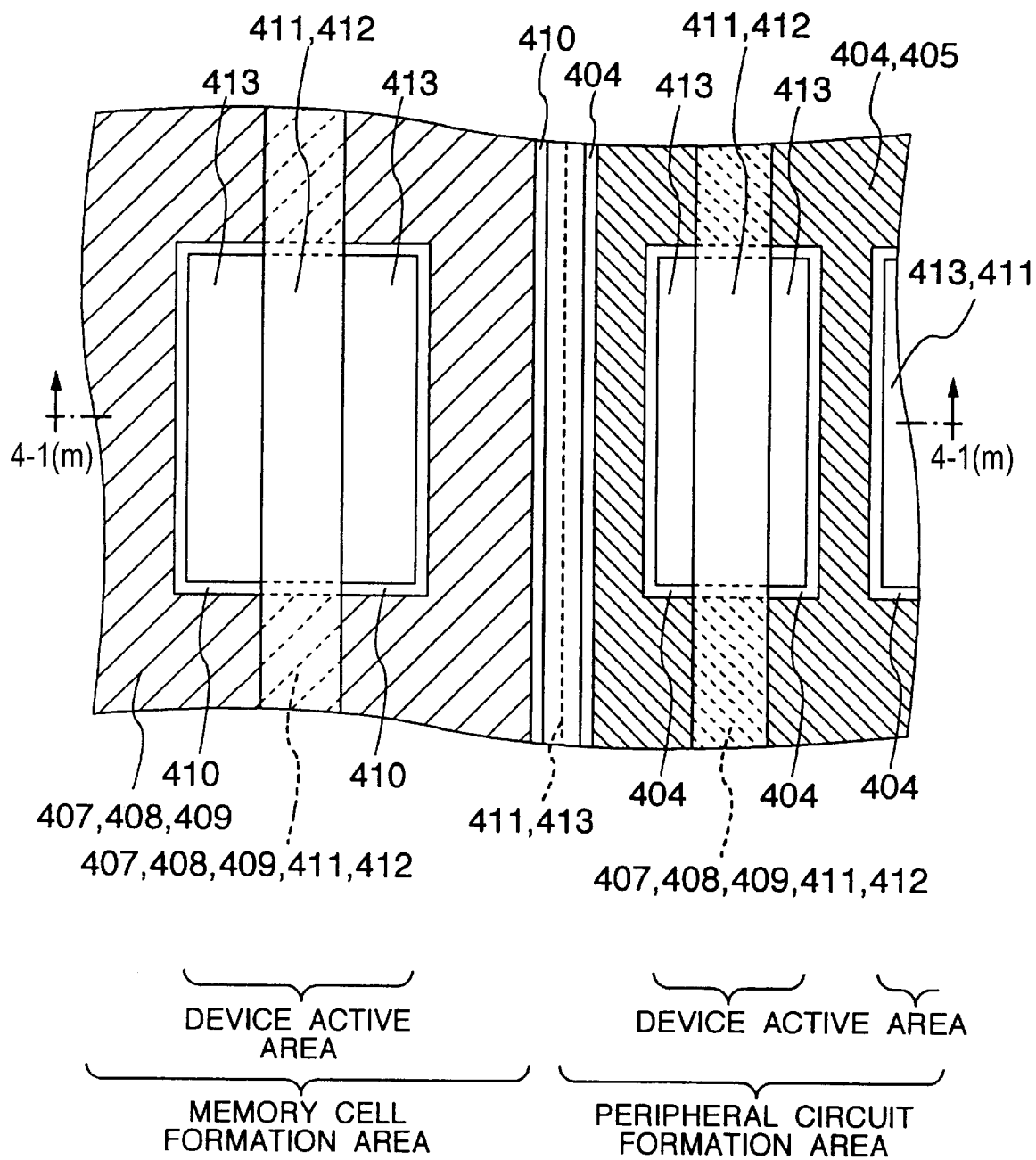

FIGS. 4-1(a) to 4-1(m) show the production steps of a production method of a semiconductor device according to the fourth embodiment of the present invention. FIG. 4-2 corresponds to the plan view of FIG. 4-1(m). In other words, the transverse sectional view taken along a line A–A' shows FIG. 4-1(m). In these drawings, the areas shown on the right side are the peripheral circuit formation areas and the areas shown on the left side are the memory cell formation areas such as DRAMs, for example.

In the areas on both right and left sides, the area encompassed by the device isolation structure is a device active area.

As shown in FIG. 4-1(a), boron ions, for example, are implanted into a p type silicon substrate 401 at an implantation energy of 60 keV and in a dose of $1 \times 10^{13}$ cm$^{-2}$, for example, and impurities are diffused and activated by heat-treatment at 1,100° C. for 6 hours, for example, forming thereby a P type well area 402 made of boron in the silicon substrate 401.

Next, as shown in FIG. 4-1(b), thermal oxidation is applied to the silicon substrate 401 in which the P type well area 402 is formed, so as to form a silicon dioxide film 403 having a film thickness of about 40 nm on the silicon substrate 401. The silicon dioxide film 403 and a silicon nitride film 417 are etched and removed by using a photoresist film, which is patterned and is not shown in the drawings, as a mask in such a manner as to leave the device active area of the peripheral circuit formation area and the boundary area between the peripheral circuit formation area and the memory cell formation area.

Next, the silicon substrate 401 is etched and removed by about 40 nm by using the silicon dioxide film 403 as the mask so as to form a ditch B and a recess C in the silicon substrate 401 as shown in FIG. 4-1(c). Here, the ditch B is formed round the device active area inside the peripheral circuit formation area, and will serve as a device isolation area after post-step is executed. The recess c will serve as a memory cell formation area when post-step is executed.

Thermal oxidation is then applied to the p type silicon substrate 401 as shown in FIG. 4-1(d) to form a silicon dioxide film as a thermal oxidation film having a film thickness of about 20 nm.

A silicon dioxide film 405 is deposited into a film thickness of 400 nm by the CVD process over the entire surface of the silicon substrate 401 as shown in FIG. 4-1(e).

Next, the peripheral circuit formation area is covered with a photoresist film 406 (at this time, the photoresist film 406 covers a part of the silicon dioxide film 403 existing in the boundary area between the memory cell formation area and the peripheral circuit formation area), and etching is carried out.

This etching is carried out unit the surface of the silicon substrate 401 of the memory cell formation area is exposed under the condition that the etching rate of the photoresist film 406 is substantially equal to that of the silicon dioxide film 405.

In consequence, the silicon dioxide film 405 which will later serve as a buried insulating film is formed round the device active area of the peripheral circuit formation area as shown in FIG. 4-1(g).

Figures 1A, 7:
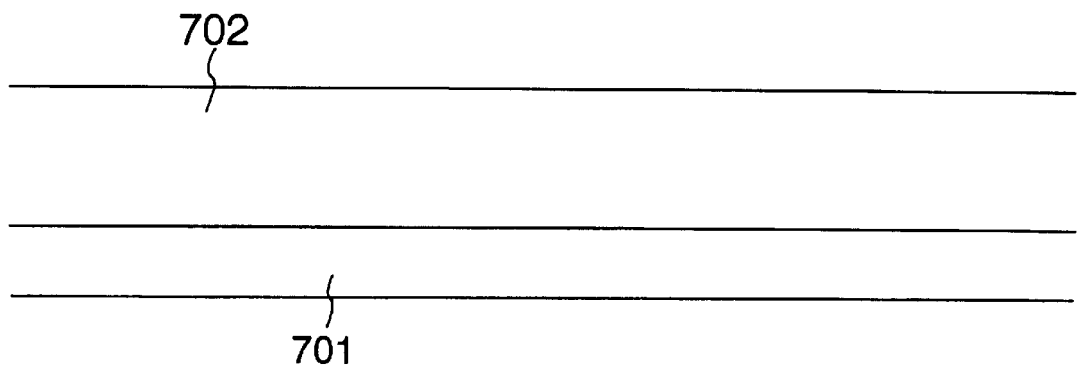
Figures 1B, 7:
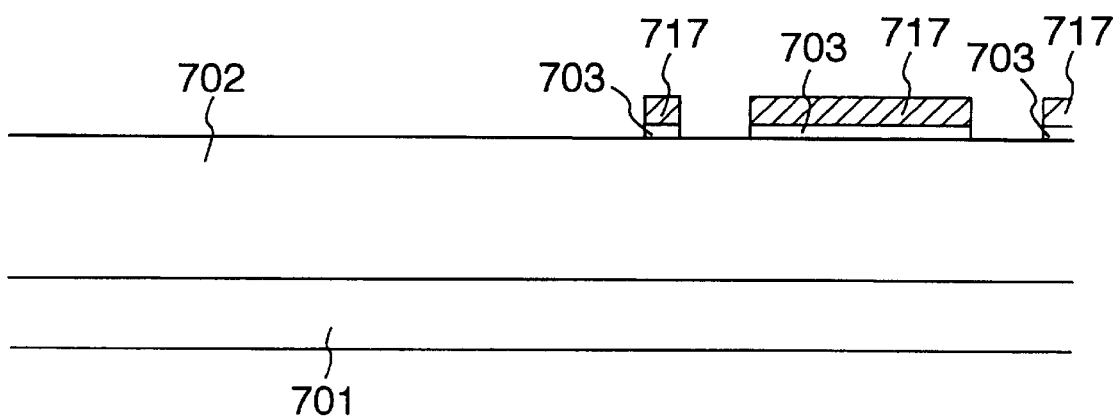
Figures 1C, 7:
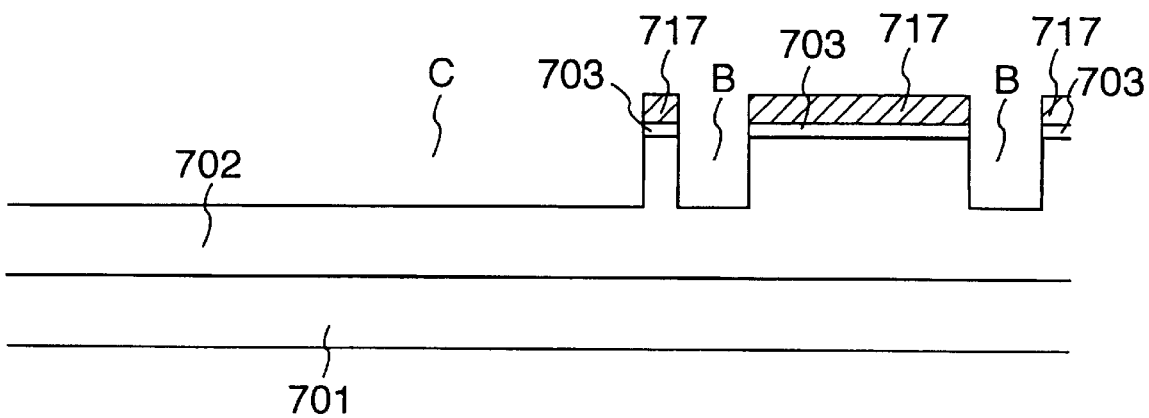
Figures 1D, 7:
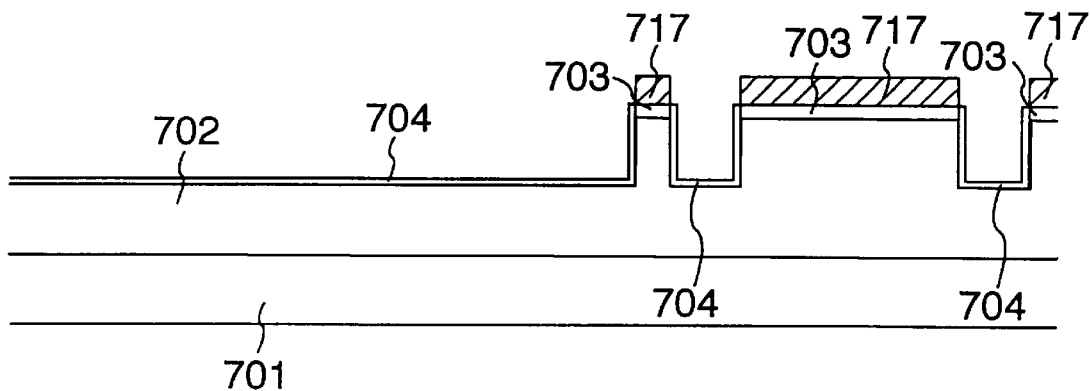
Figures 1E, 7:
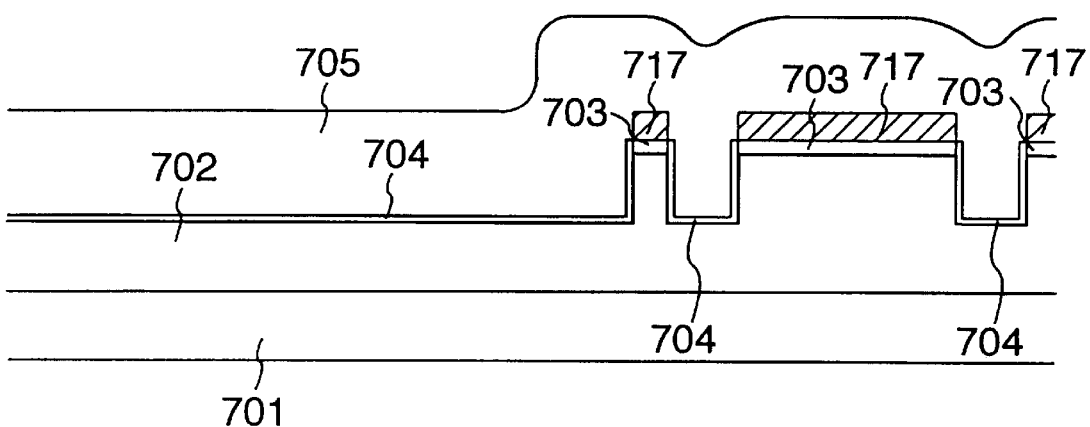
Figures 1F, 7:
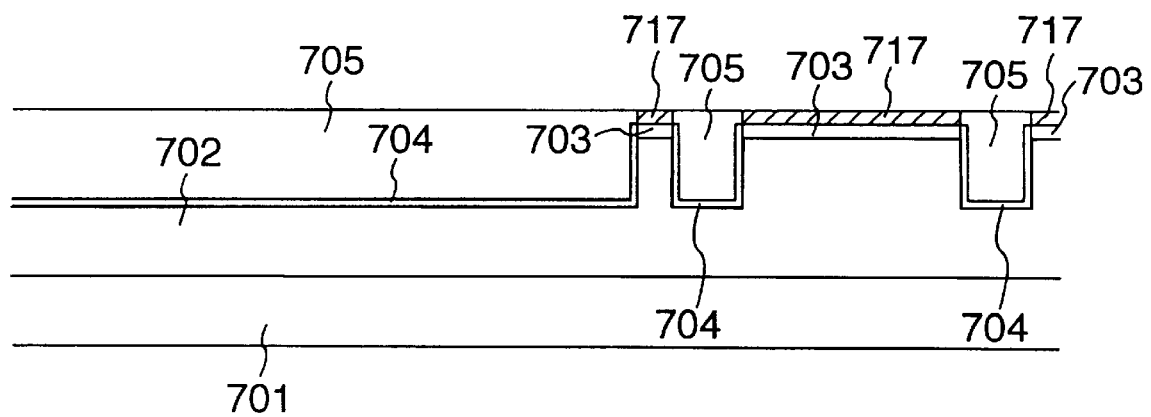
Figures 1G, 7:
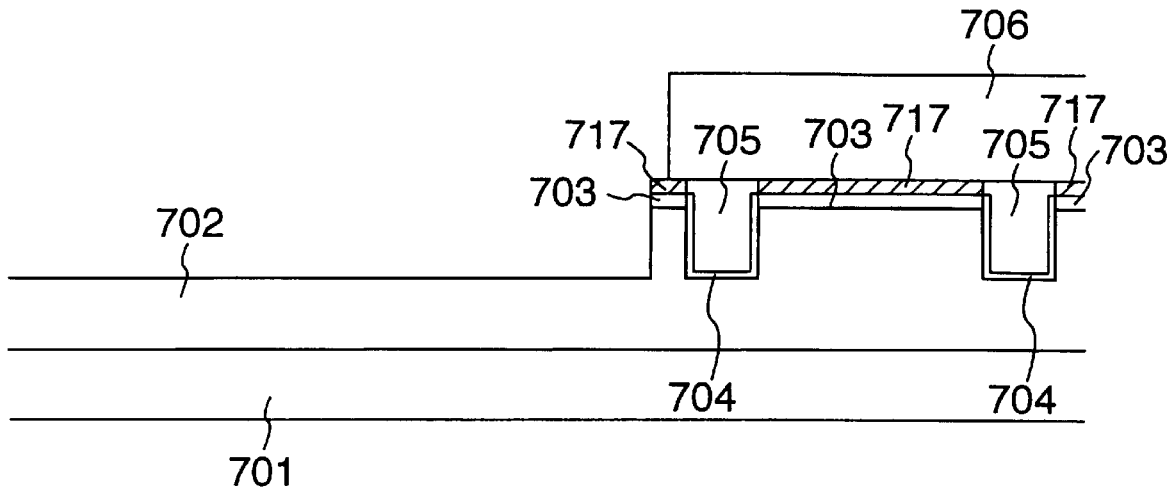
Figures 1H, 7:
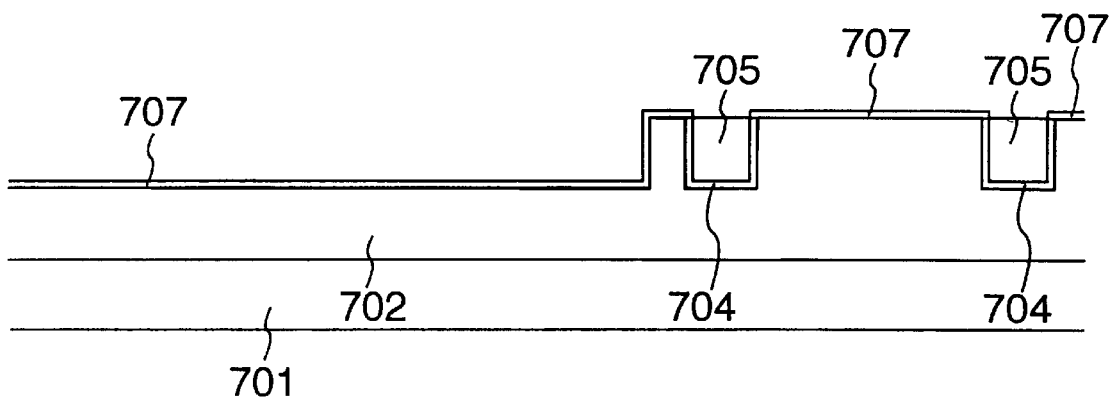
Figures 1I, 7:
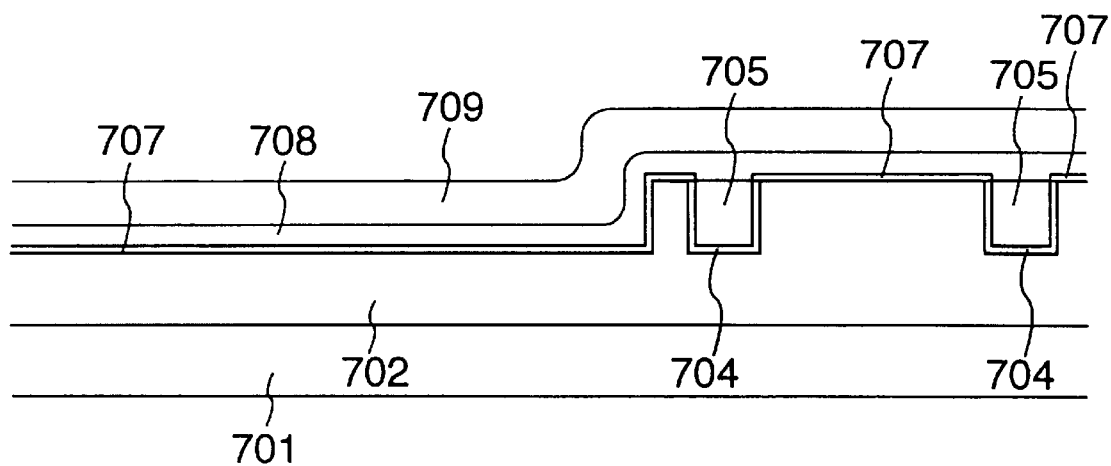
Figures 1M, 7:
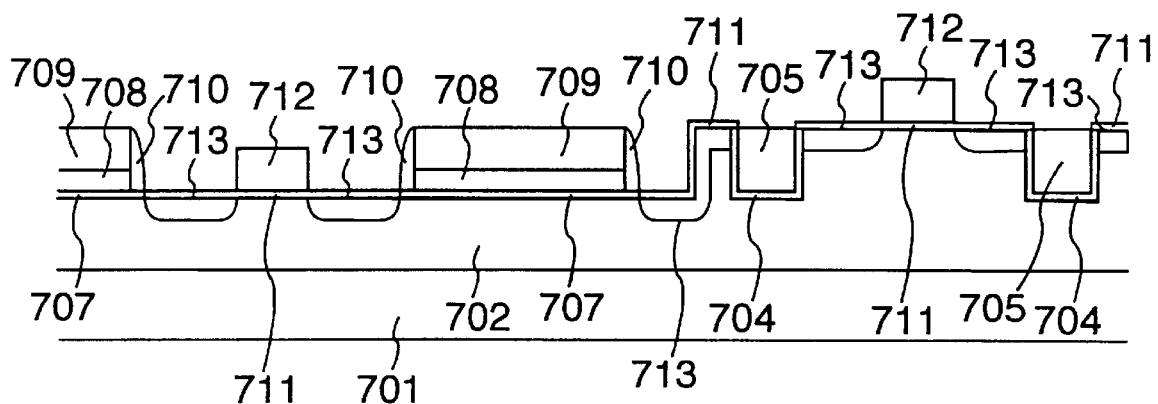
Figures 1N, 7:
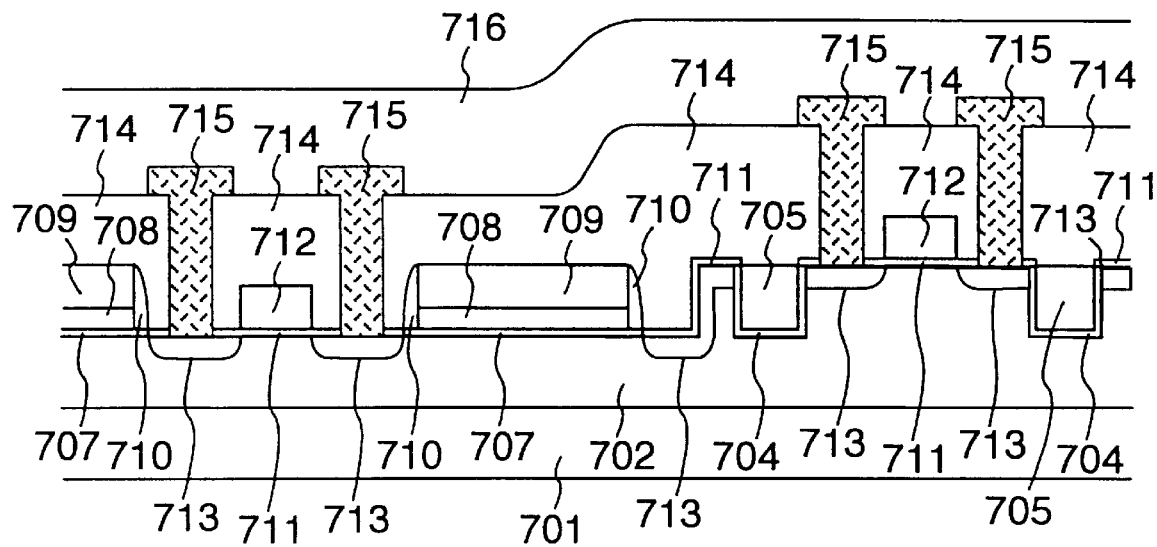

Next, thermal oxidation is applied to the surface of the p type silicon substrate 401 as shown in FIG. 7-1(k) so as to form a shield gate insulating film 407 having a film thickness of about 40 nm.

An about 100 nm-thick polysilicon film 408 (which will later serve as a field shield electrode) is formed by the CVD process as shown in FIG. 4-1(i), and phosphorus is thermally diffused to lower the resistance of this polysilicon film 408. An about 300 nm-thick silicon dioxide film 409 is then deposited over the entire surface by the CVD process. (This film will later serve as the cap insulating film of the field shield electrode).

The silicon dioxide film 409 and the polysilicon film 408 are then etched and removed selectively by using a photoresist film, which is patterned but is not shown in the drawings, as the mask, forming thereby the field shield electrode 408 and the cap insulating film 409.

The difference of this fourth embodiment from the second embodiment lies in that the field shield device isolation structure is incorporated inside the memory cell formation area and does not protrude into the peripheral circuit formation area.

Next, as shown in FIG. 4-1(k), a sidewall oxide film 410 is formed in the same way as in the second embodiment. At this time is removed the shield gate insulating film 407 from the device active areas of both of the peripheral circuit formation area and the memory cell formation area. Similarly, the shield gate insulating film 407 is removed from the boundary area (having a step) between the peripheral circuit formation area and the memory cell formation area. As a result of the process steps descried above, a field shield isolation structure (comprising the shield gate insulating film 407, the shield gate electrode 408, the cap oxide film 409 and the sidewall insulating film 410) is formed in the memory cell formation area.

Next, thermal oxidation is applied to the exposed surface of the silicon substrate 401 and an about 15 nm-thick gate insulating film 411 is formed. An about 200 nm-thick polysilicon film is formed on the gate insulating film 411 by the CVD process, and phosphorus is thermally diffused so as to lower the resistance. Subsequently, a photoresist having a predetermined pattern is disposed on this polysilicon film, and the polysilicon film is etched into a predetermined pattern by using the photoresist as the mask to form a gate electrode 412.

Arsenic ions, for example, are implanted at an implantation energy of 60 keV and in a dose of $5 \times 10^{15}$ cm$^{-2}$ by using the gate electrode 412, the field device isolation structure (comprising the shield gate insulating film 407, the shield gate electrode 408, the cap oxide film 409 and the sidewall insulating film 410) and the silicon dioxide film 405 as the mask, as shown in FIG. 4-1(m), and heat-treatment is carried out to form a source-drain diffusion layer 413. At this time, a similar diffusion layer 413 is formed in the boundary area between the memory cell formation area and the peripheral circuit formation area.

FIG. 4-2 is a plan view of FIG. 4-1(m). In FIG. 4-2, reference numeral 404 denotes the silicon dioxide film, reference numeral 405 denotes a silicon dioxide film which will serve as the buried insulating film, and reference numerals 407, 408, 409 and 410 denote the shield gate insulating film, the electrode, the cap insulating film and the sidewall insulating film of the field shield device isolation structure, respectively. Reference numeral 411 denotes the gate insulating film, reference numeral 412 denotes the gate electrode and reference numeral 413 denotes the source-drain diffusion layer and the diffusion layer formed in the boundary area between the memory cell formation area and the peripheral circuit formation area.

Thereafter, a silicon dioxide film as a first inter-level insulating film 414 is deposited to the entire surface by the CVD process, etc., as shown in FIG. 2-1(n), and contact holes are then bored at predetermined positions of this inter-level insulating film 414. An aluminum wiring 415 is formed on this inter-level insulating film 414 by sputtering and fine etching, and a silicon dioxide film as a second inter-level insulating film 416 is deposited on the wiring layer by the CVD process, or the like.

In this embodiment, the area for forming the field shield device isolation structure is formed lower than the area for forming the silicon dioxide film of the buried insulating film device isolation structure. Therefore, this embodiment can contribute to the requirement for flattening in the production process of the semiconductor device. Further, since the diffusion layer exists in the boundary area between the two areas described above, isolation between these areas can be made more reliable by using this diffusion layer (by setting it to the ground potential, for example).

Embodiment 5:

Next, the fifth embodiment of the present invention will be explained with reference to FIGS. 5-1(a) to 5-1(n) and FIG. 5-2.

Figures 1A, 5:
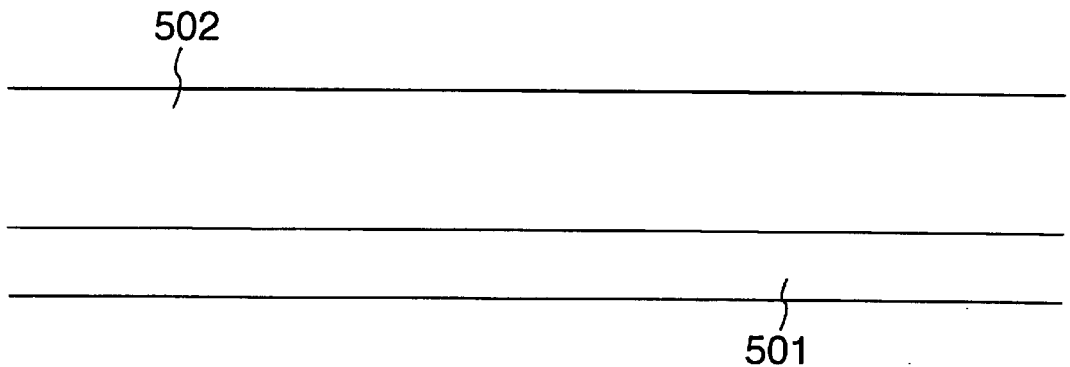
Figures 1B, 5:
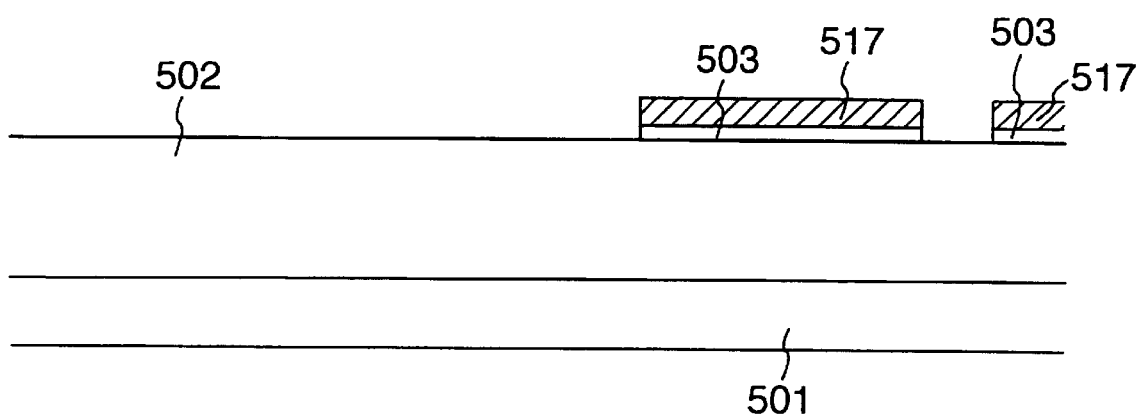
Figures 1C, 5:
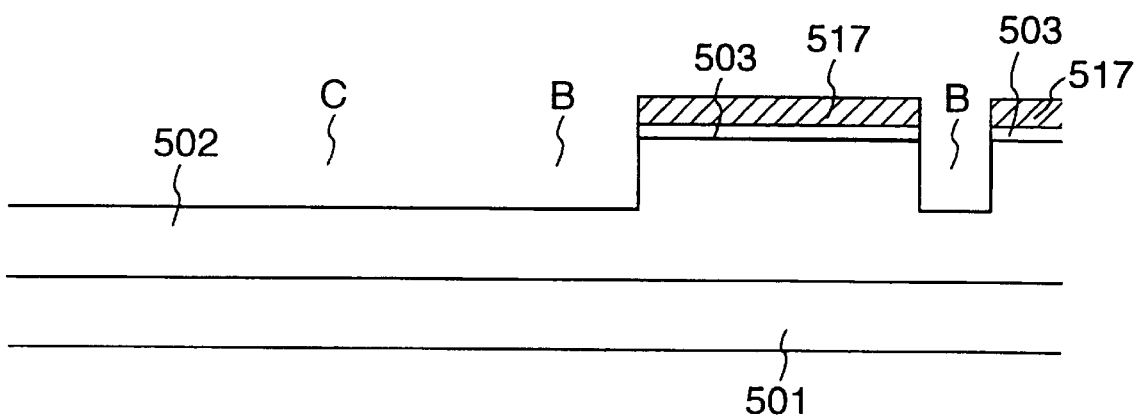
Figures 1D, 5:
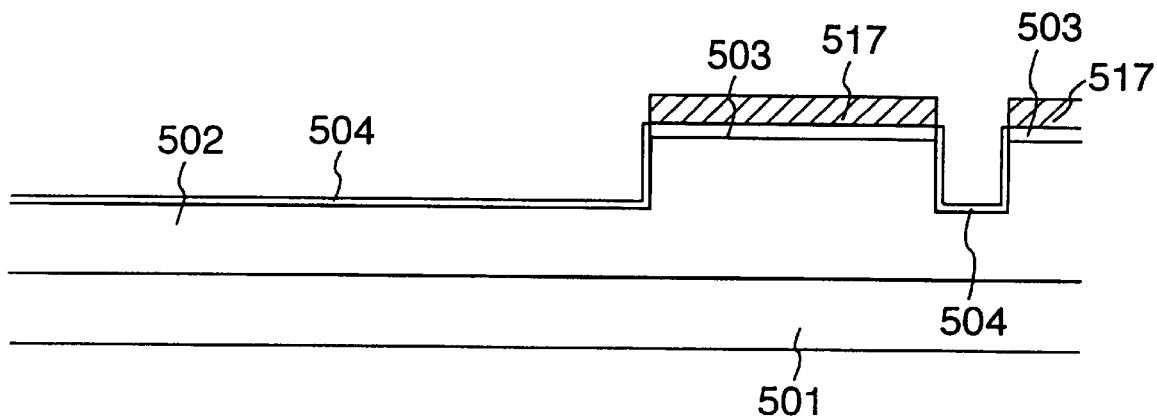
Figures 1E, 5:
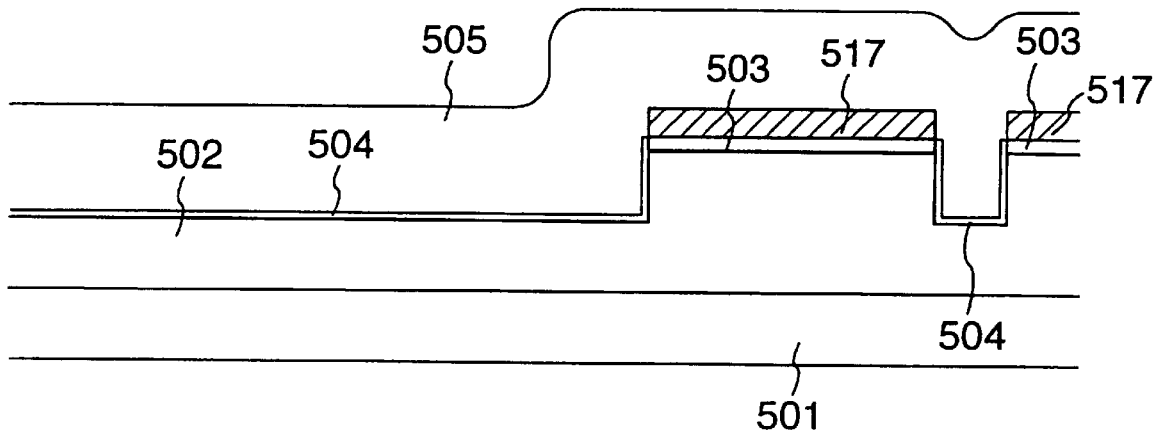
Figures 1F, 5:
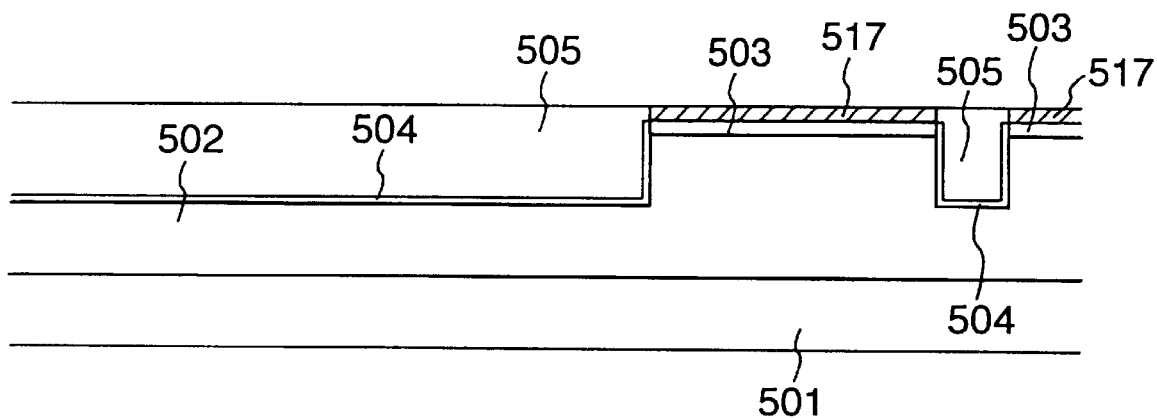
Figures 1G, 5:
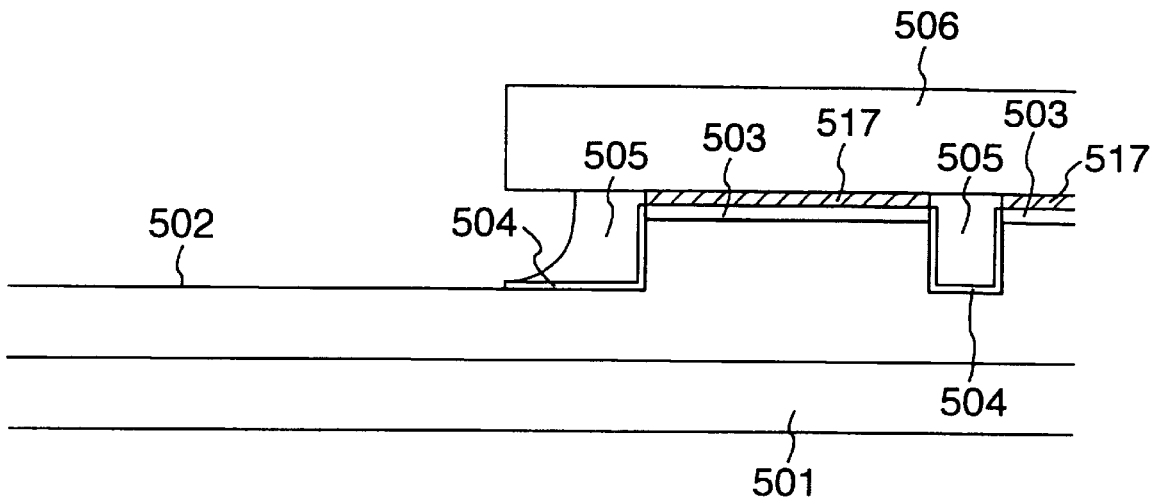
Figures 1H, 5:
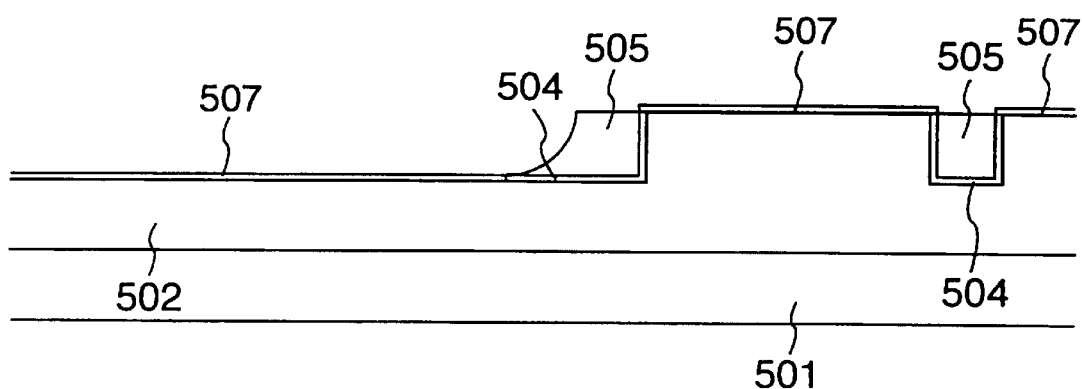
Figures 1I, 5:
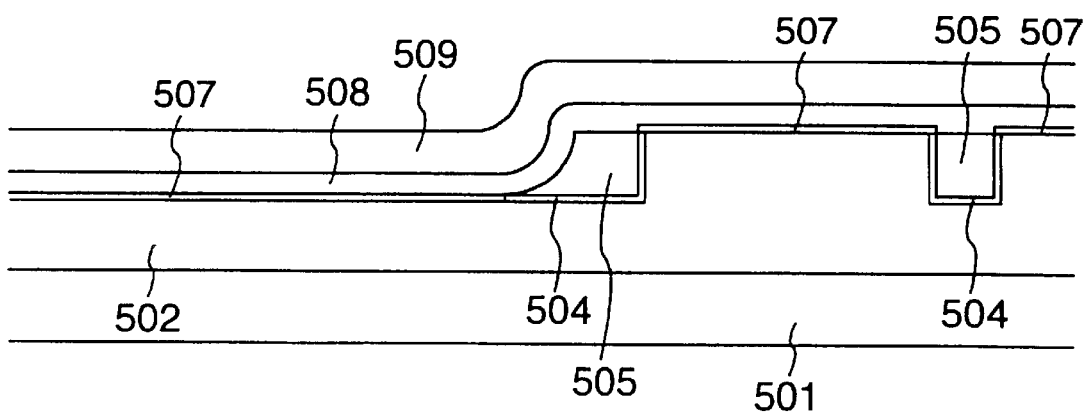
Figures 1M, 5:
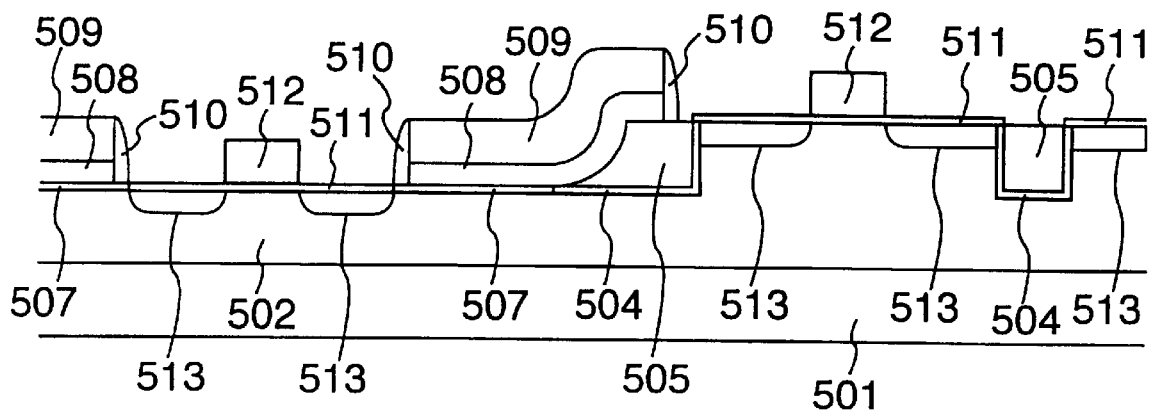
Figures 1N, 5:
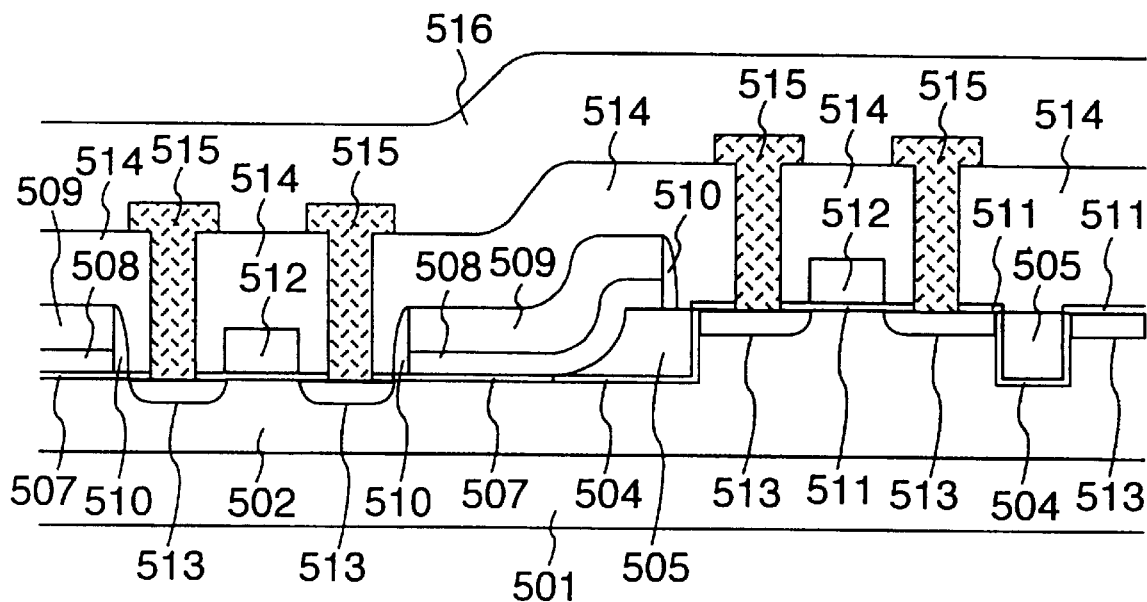
Figures 2, 5:
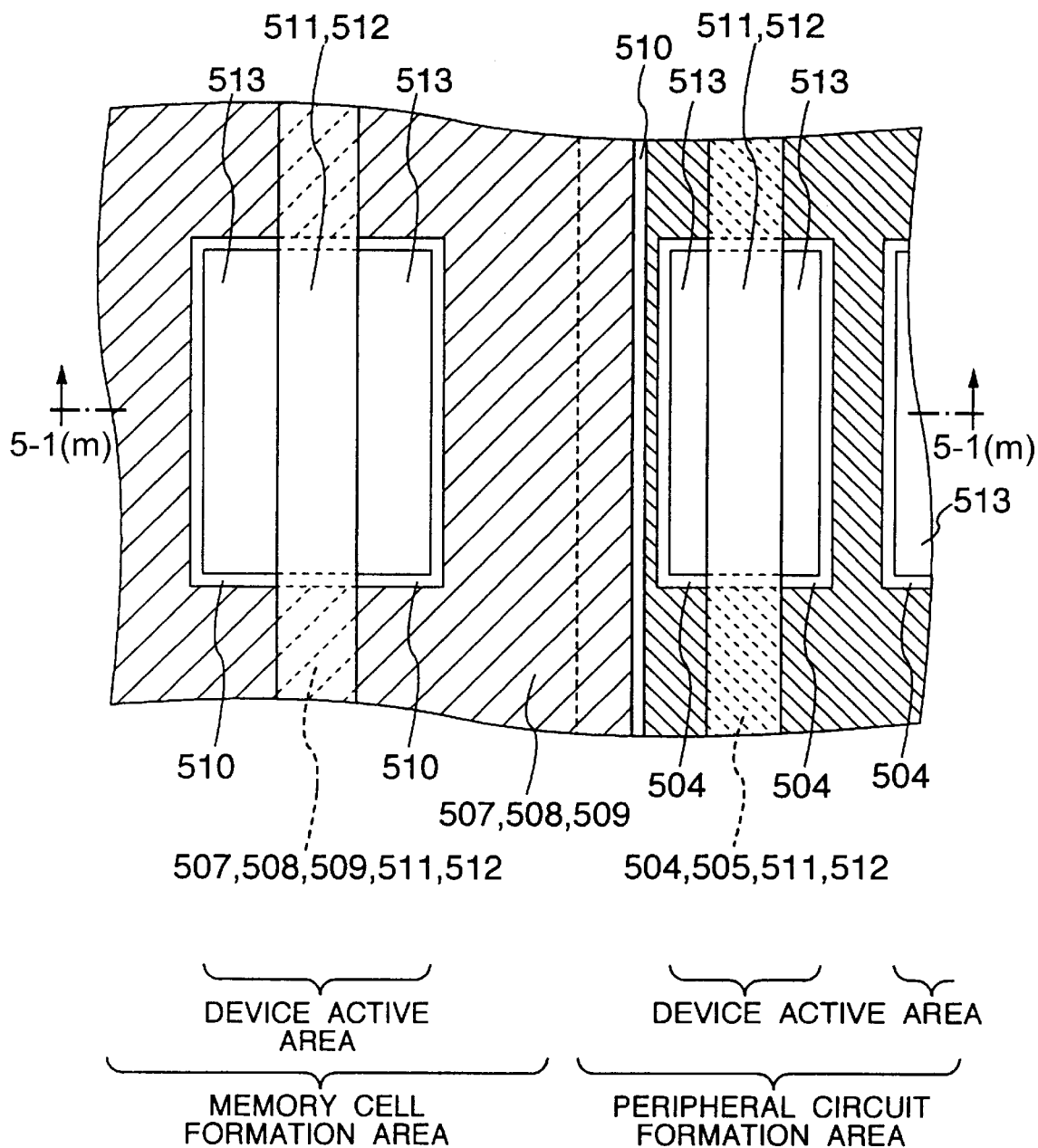

FIGS. 5-1(a) to 5-1(n) show the production steps of a production method of a semiconductor device according to the fifth embodiment of the present invention. FIG. 5-2 is a plan view of FIG. 5-1(m), and the transverse sectional view taken along a line A–A' of FIG. 5-2 corresponds to FIG. 5-1(m). In these drawings, the areas on the right side are the peripheral circuit formation areas and the areas shown on the left side are the memory formation area. Further, in the areas on both the right and left sides, the area encompassed by the device isolation structure is the device active area.

As shown in FIG. 5-1(a), boron ions, for example, are implanted into a p type silicon substrate 501 at an implantation energy of 60 keV and in a dose of $1 \times 10^{13}$ cm$^{-2}$, and impurities are diffused and activated by heat-treatment at 1,100° C. for 6 hours, for example, so as to form a P type well area 502 made of boron in the silicon substrate 501.

Next, as shown in FIG. 5-1(b), thermal oxidation is applied to the surface of the silicon substrate 501 in which the P type well area 502 is formed, so as to form an about 40 nm-thick silicon dioxide film 503 on the silicon substrate 501. Next, a silicon nitride film 517 is deposited by the CVD process to a thickness of about 150 nm. The silicon dioxide film 503 and the silicon nitride film 517 are then etched and removed from the areas other than the device active area of the peripheral circuit formation area by using a photoresist, which is patterned and is not shown in the drawings, as the mask. Needless to say, the silicon dioxide film and the silicon nitride film of the memory cell formation area are completely etched and removed at this time.

Next, the silicon substrate 501 is etched and removed by about 400 nm by using the silicon dioxide film 503 and the silicon nitride film 517 as the mask as shown in FIG. 5-1(c), so as to form a ditch B and a recess C inside the silicon substrate 501. Here, the ditch B is formed round the device active area inside the peripheral circuit formation area, and will serve as the device isolation area after post-step is executed. The recess C will serve as the memory cell formation area after post-step is similarly executed. The ditch B communicates continuously with the recess C at the boundary between the memory cell formation area and the peripheral circuit formation area as can be clearly seen from the drawing.

Next, thermal oxidation is applied to the P type silicon substrate 501 to form a silicon dioxide film 504 as a thermal oxide film having a film thickness of about 20 nm as shown in FIG. 5-1(d).

A silicon dioxide film 505 is then deposited to the entire surface of the silicon substrate 501 by the CVD process to a thickness of about 600 nm as shown in FIG. 5-1(e).

Next, the silicon dioxide film 505 is removed by CMP (Chemical Mechanical Polishing) until the silicon nitride film 517 is exposed, as shown in FIG. 5-1(f).

The peripheral circuit formation area is covered with a photoresist film 506 as shown in FIG. 5-1(g) and then wet etching is executed. This wet etching is carried out by using hydrofluoric acid until the surface of the P type silicon substrate of the memory cell formation area is exposed. In consequence, a buried insulating film 505 to serve as the device isolation area is formed round the device active area of the peripheral circuit formation area. This buried isolating film 505 has a forward taper at the boundary between the memory cell formation area and the peripheral circuit formation area as shown in FIG. 5-1(g). Next, after the photoresist film 506 is removed, the silicon nitride film 517 is removed by etching by using hot phosphoric acid and the silicon dioxide film 503 is then removed by etching by using hydrofluoric acid.

Next, the surface of the P type silicon substrate 501 is thermally oxidized to form an about 40 nm-thick shield gate insulating film 507 as shown in FIG. 5-1(k). At this time, the insulating film 507 is also formed on the exposed surface of the peripheral circuit formation area.

An about 100 nm-thick polysilicon film 508 (which will later serve as a field shield electrode) is deposited by the CVD process as shown in FIG. 5-1(i), and phosphorus is thermally diffused so as to lower the resistance of this polysilicon film 508. An about 300 nm-thick silicon dioxide film 509 is then deposited over the entire surface by the CVD process. (This film 509 will later serve as a cap insulating film of the field shield electrode).

The silicon dioxide film 509 and the polysilicon film 508 are selectively removed by etching by using a photoresist film, which is patterned and is not shown in the drawing, as the mask, as shown in FIG. 5-1(j), forming thereby the field shield electrode 508 and the cap insulating film 509. At this time, a part of each of the field shield electrode 508 and the cap insulating film 509 is formed in superposition with a part of the silicon dioxide film 505 which has the forward taper shape and serves as the buried insulating film, at the boundary between the memory formation area and the peripheral circuit formation area.

Next, an about 200 nm-thick silicon dioxide film 10 is deposited over the entire surface by the CVD process as shown in FIG. 5-1(k), and is then etched back anisotropically to form a sidewall insulating film 510 comprising the silicon dioxide film on the side surfaces of the field shield electrode 508 and the cap insulating film 509. At this time, the shield gate insulating film 507 is removed from the device active areas of both of the peripheral circuit formation area and the memory cell formation area. As a result of the process steps described above, a field shield device isolation structure (comprising the shield gate insulating film 507, the shield gate electrode 508, the cap oxide film 509 and the sidewall insulating film 510) is formed in the memory cell formation area, and a part of each of the shield gate electrode 508, the cap oxide film 509 and the sidewall insulating film 510 is also formed on a part of the silicon oxide film 505 having the forward taper shape and serving as the buried insulating film.

Thermal oxidation is then applied to the exposed surface of the silicon substrate 501 as shown in FIG. 5-1(l) so as to form an about 15 nm-thick gate insulating film 511. Next, an about 200 nm-thick polysilicon film is formed on this gate insulating film 511 by the CVD process, and phosphorus is thermally diffused so as to lower the resistance of the polysilicon film. Subsequently, a photoresist having a predetermined pattern is disposed on this polysilicon film, and the polysilicon film is etched into a predetermined pattern by using the photoresist as the mask to form a gate electrode 512.

Boron ions, for example, are then implanted at an implantation energy of 60 keV and in a dose of $5 \times 10^{15}$ $cm^{-2}$, for example, by using the gate electrode 512, the field device isolation structure (comprising the shield gate insulating film 507, the shield gate electrode 508, the cap oxide film 509 and the sidewall insulating film 510) and the silicon dioxide film 505 as the mask, and heat-treatment is carried out to form a source-drain diffusion layer 513 as shown in FIG. 5-1(m).

FIG. 5-2 shows a plan view of FIG. 5-1(m). In FIG. 5-2, reference numeral 504 denotes the silicon dioxide film, reference numeral 505 denotes the silicon dioxide film which will serve as the buried insulating film and reference numerals 507, 508, 509 and 510 denote the shield gate insulating film, the electrode, the cap insulating film and the sidewall insulating film of the field shield device isolation structure, respectively. Reference numeral 501 denotes the gate insulating film, reference numeral 512 denotes the gate electrode and reference numeral 513 denotes the source-drain diffusion layer.

Thereafter, the silicon dioxide film as the first inter-level insulating film 514 is deposited to the entire surface by the CVD process as shown in FIG. 5-1(n), and contact holes are bored at predetermined positions of this first inter-level insulating film 514. Next, an aluminum wiring 215 is formed on this film 514 by sputtering and fine etching, and a silicon dioxide film as the second inter-level insulating film 516 is further deposited on the aluminum wiring 215 by the CVD process.

As a result of the process steps described above, the area for forming the field shield device isolation structure is formed at a position lower than the position of the area for forming the silicon dioxide film for buried insulating film device isolation. Therefore, this embodiment makes a great contribution to the requirement for flattening in the semiconductor production process. Furthermore, since the silicon dioxide film 505 as the buried insulating film at the boundary between the memory formation area the peripheral circuit formation area has the forward tapered shape, flattening can be further improved.

Embodiment 6:

Next, the sixth embodiment of the present invention will be explained with reference to FIGS. 5-1(a) to 5-1(b), FIGS. 6-1(a) to 6-1(l) and FIG. 6-2.

Figures 1A, 6:
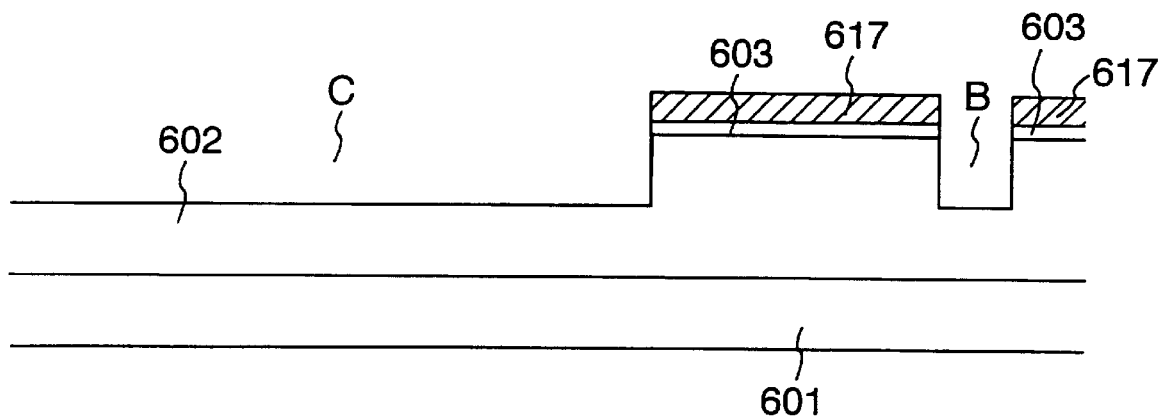
Figures 1B, 6:
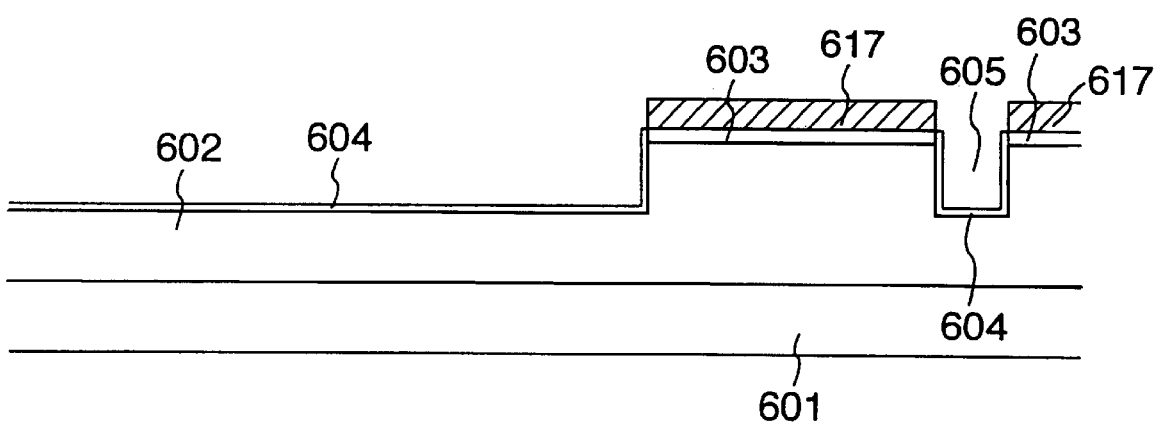
Figures 1C, 6:
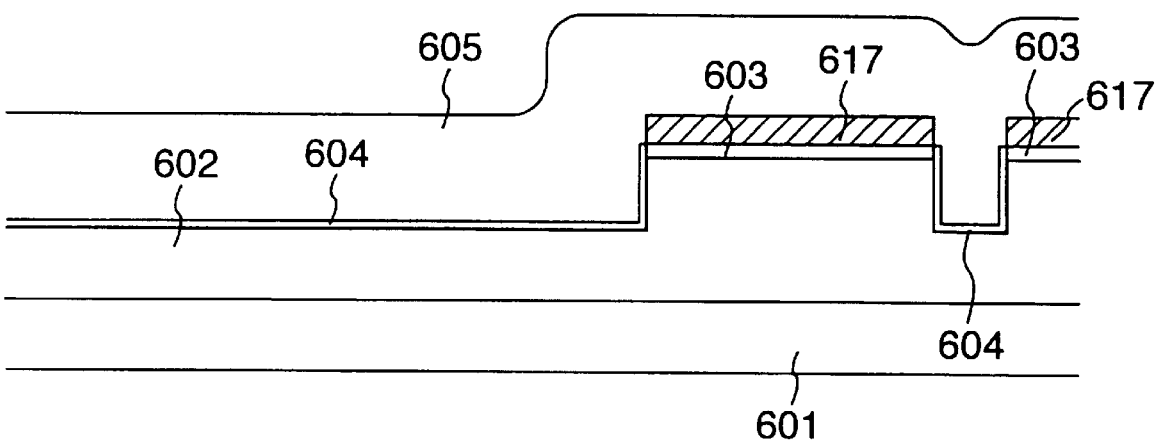
Figures 1D, 6:
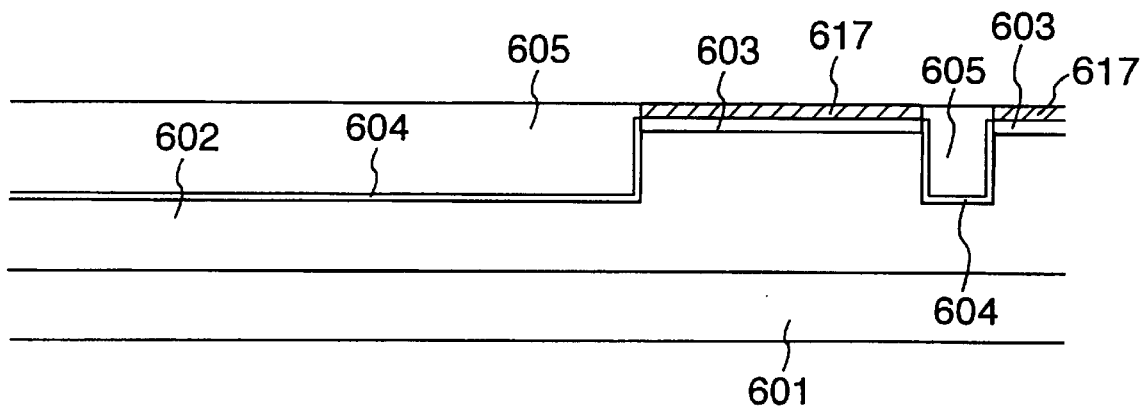
Figures 1E, 6:
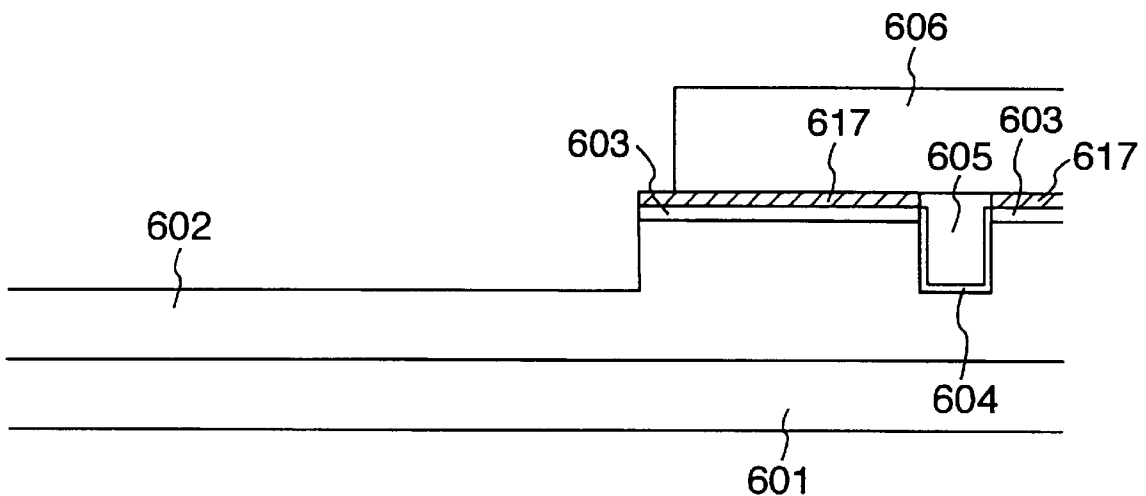
Figures 1F, 6:
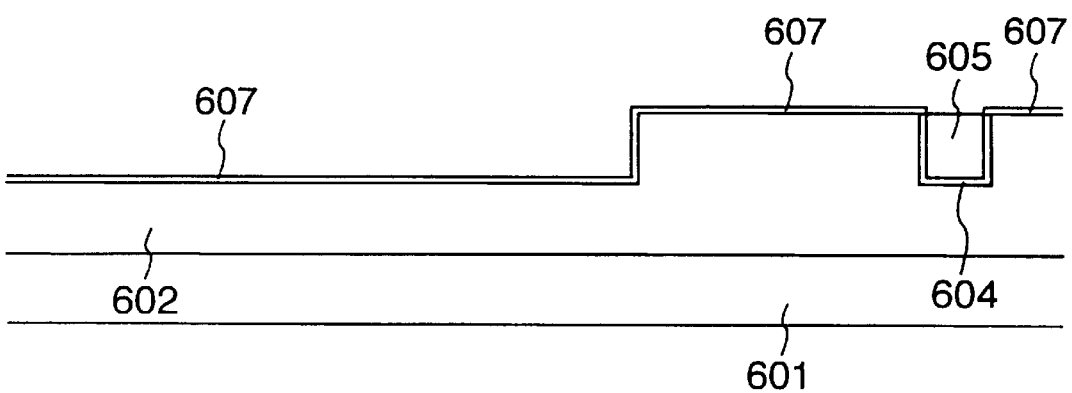
Figures 1G, 6:
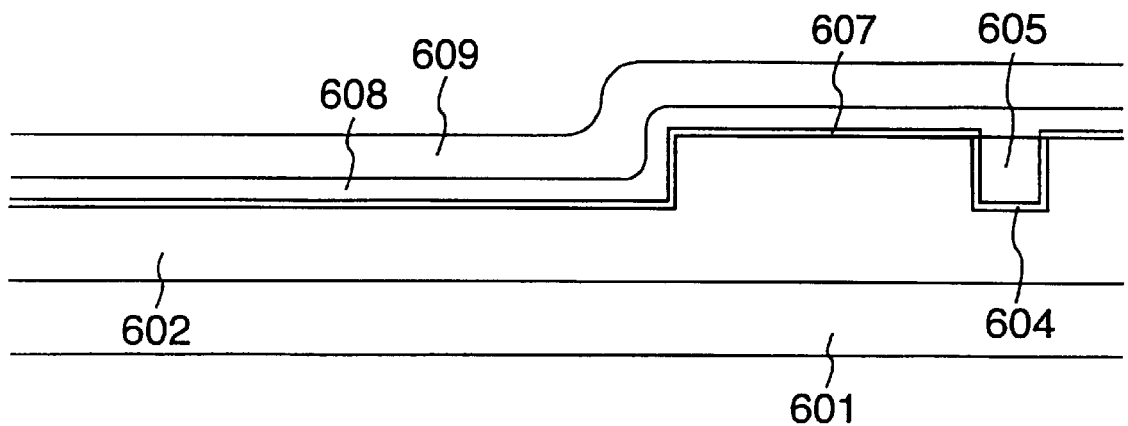
Figures 1H, 6:
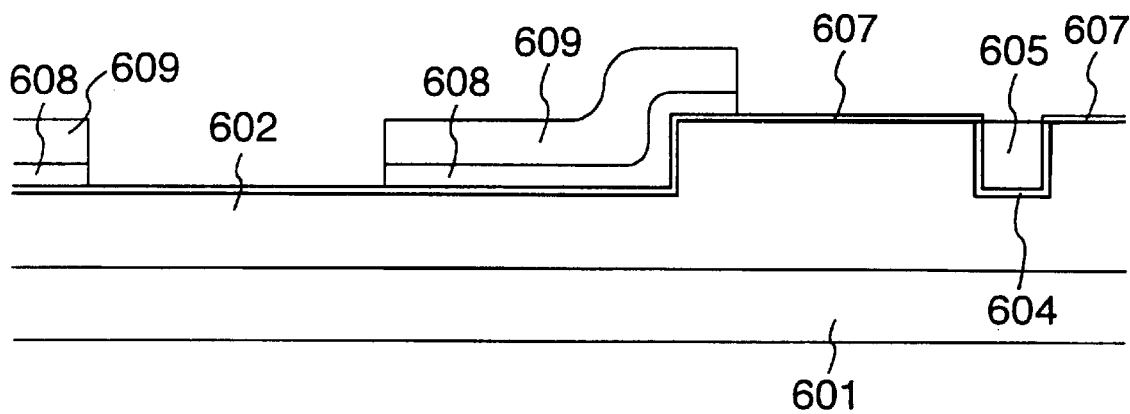
Figures 1I, 6:
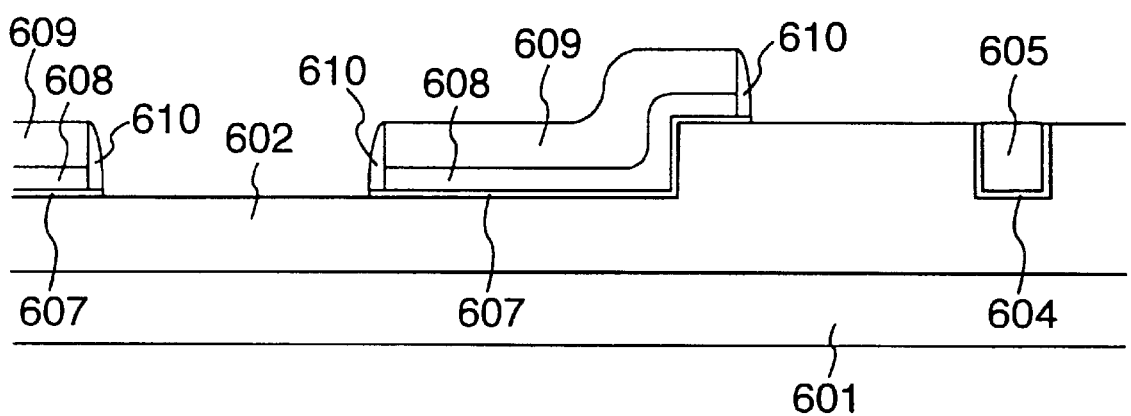
Figures 2, 6:
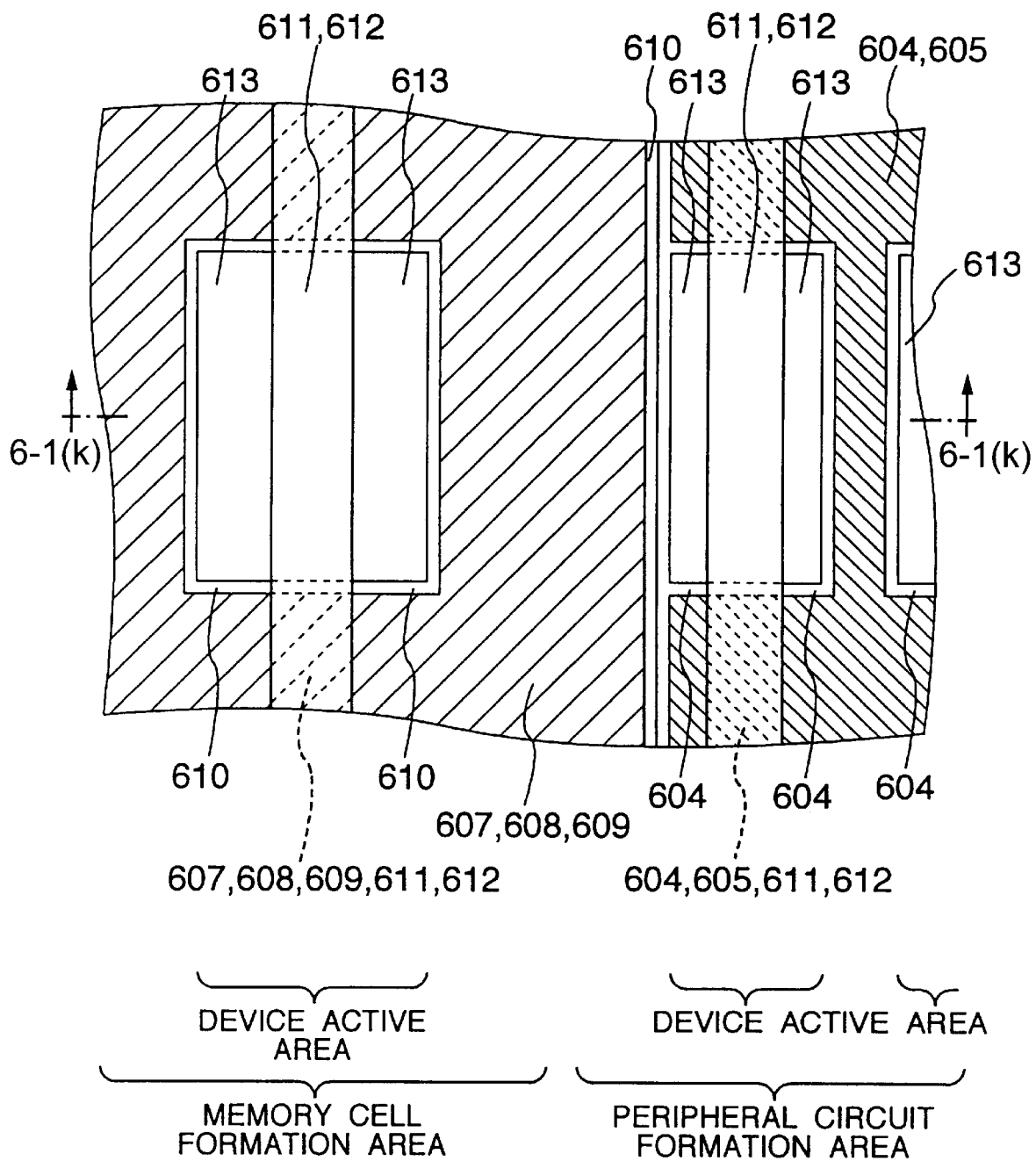

FIGS. 5-1(a) to 5-1(b) and FIGS. 6-1(a) to 6-1(l) show the production steps of a production method of a semiconductor device according to the sixth embodiment of the present invention, and FIG. 6-2 corresponds to a plan view of FIG. 6-1(k). In other words, the transverse sectional view taken along a line A–A' of FIG. 6-2 shows FIG. 6-1(k). In these drawings, the areas shown on the right side are the peripheral circuit formation areas and the areas shown on the left side are the memory cell formation areas such as DRAMs. Further, the areas encompassed by the device isolation structure on both of the right and left sides are the device active areas.

In the production method according to the sixth embodiment, the process steps up to FIG. 6-1(a) are the same as the process steps shown in FIGS. 5-1(a) to 5-1(b) of the production method of the fifth embodiment. After the step shown in FIG. 5-1(b), the silicon substrate 601 is removed by etching by about 400 nm by using the silicon dioxide film 603 and the silicon nitride film 617 as the mask in this sixth embodiment as shown in FIG. 6-1(a) in order to form the ditch B and the recess C inside the silicon substrate 601. Here, the ditch B is formed round the device active area of the peripheral circuit formation area with the exception of the boundary with the memory cell formation area (and in this point, the sixth embodiment is different from the fifth embodiment), and will serve as the device isolation area after post-step is executed. The recess C, too, will serve as the memory cell formation area after the post-step is executed.

Next, thermal oxidation is applied to the P type silicon substrate 601 as shown in FIG. 6-1(b) so as to form the silicon dioxide film 604 as a thermal oxide film having a film thickness of about 20 nm.

The silicon dioxide film 605 is then deposited over the entire surface of the silicon substrate 601 by the CVD process as shown in FIG. 6-1(c) to a thickness of about 600 nm.

The silicon dioxide film 605 is then removed by CMP (Chemical Mechanical Polishing) until the silicon nitride film 617 is exposed.

The peripheral circuit formation area other than some parts of the boundary area with the memory cell formation area is covered with the photoresist film 606 (in this point, this embodiment is different from the fifth embodiment) as shown in FIG. 6-1(e), and wet etching is then carried out. This wet etching is effected by using hydrofluoric acid until the surface of the P type silicon substrate of the memory cell formation area is exposed. In consequence, the buried insulating film 605 serving as the device isolation area is formed round the device active area of the peripheral circuit formation area with the exception of the boundary area between the memory cell formation area and the peripheral circuit formation area (in this point, this embodiment is different from the fifth embodiment). Subsequently, the photoresist film 606 is removed, and the silicon nitride film 617 is removed by etching by using hot phosphoric acid. Next, the silicon dioxide film 603 is removed by etching by using hydrofluoric acid.

The subsequent process steps are substantially the same as those of the fifth embodiment. In other words, an about 40 nm-thick shield gate oxide film 607 is formed on the surface of the P type silicon substrate 601 as shown in FIG. 6-1(f). Next, an about 100 nm-thick polysilicon film 608 is formed by the CVD process as shown in FIG. 6-1(g) and phosphorus is thermally diffused so as to lower the resistance of this polysilicon film 608. Then, an about 300 nm-thick silicon dioxide film 609 is deposited over the entire surface by the CVD process.

Next, the silicon dioxide film 609 and the polysilicon film 608 are selectively etched and removed by using a photoresist, not shown, as shown in FIG. 6-1(h) so as to form a field shield electrode 608 and a cap insulating film 609. At this time, a part of each of the field shield electrode 608 and the cap insulating film 609 is formed in superposition with the peripheral circuit formation area at the boundary between the memory cell formation area and the peripheral circuit formation area.

Thereafter, a sidewall insulating film 610 comprising a silicon dioxide film is formed in the same way as in the fifth embodiment as shown in FIG. 6-1(i). At this time, the shield gate insulating film 607 is removed from the device active areas of both of the peripheral circuit formation area and the memory cell formation area.

Next, a gate insulating film 611 is formed as shown in FIG. 6-1(j), and a gate electrode 612 is then formed on the former.

Further, a source-drain diffusion layer 613 is formed as shown in FIG. 6-1(k).

FIG. 6-2 is a plan view of FIG. 6-1(k).

In FIG. 6-2, reference numeral 604 denotes the silicon dioxide film, reference numeral 605 denotes the silicon dioxide film which is to serve as the buried insulating film and reference numerals 607, 608, 609 and 610 denote the shield gate insulating film, the electrode, the cap insulating film and the sidewall insulating film of the field shield device isolation structure, respectively. Reference numeral 611 denotes the gate insulating film, reference numeral 612 denotes the gate electrode and reference numeral 613 denotes the source-drain diffusion layer.

Subsequently, a first inter-level insulating film 614, an aluminum wiring 615 and a second inter-level insulating film 616 are formed as shown in FIG. 6-1(l).

According to this sixth embodiment, too, the area for forming the field device isolation structure is formed at the position lower than the area for forming the silicon dioxide film of the buried insulating film device isolation. Therefore, this embodiment makes a great contribution to the requirement for flattening in the production process of the semiconductor device.

Because the field shield device isolation structure serves also as the device isolation structure for both of the peripheral circuit formation area and the memory cell formation area at their boundary, the space factor can be improved, as well.

Embodiment 7:

The seventh embodiment according to the present invention will be explained with reference to FIGS. 7-1(a) to 7-1(n) and FIG. 7-2.

FIGS. 7-1(a) to 7-1(n) show the production steps of a production method of a semiconductor device according to the seventh embodiment of the present invention. FIG. 7-2 is a plan view of FIG. 7-1(m), and the transverse sectional view taken along a line A–A' of FIG. 7-2 corresponds to FIG. 7-1(m). In these drawings, the areas shown on the right side are the peripheral circuit formation areas and the areas shown on the right side are the memory cell formation areas. Further, the areas encompassed by the device isolation structure in both the right and left areas are the device active area.

Boron ions, for example, are implanted into a P type silicon substrate 701 at an implantation energy of 60 keV and in a dose of 1×10$^{13}$ cm$^{-2}$ s shown in FIG. 7-1(a), and the impurities are diffused and activated by heat-treatment at 1,100° C. for 6 hours, for example, so as to form a P type well area 702 made of boron in the silicon substrate 701.

Next, thermal oxidation is applied to the surface of the silicon substrate 701 in which the P type well area 702 is formed, as shown in FIG. 7-1(b), so as to form an about 40 nm-thick silicon dioxide film 703 on the silicon substrate 701. An about 150 nm-thick silicon nitride film 717 is then deposited to this silicon dioxide film 703 by the CVD process. The silicon dioxide film 703 and silicon nitride film 717 are then removed by etching by using a photoresist film, which is patterned and is not shown in the drawings, as the mask in such a manner as to leave the device active area of the peripheral circuit formation area and some parts of the boundary area between the peripheral circuit formation area and the memory cell formation area.

Next, as shown in FIG. 4-1(c), the silicon substrate 701 is removed by about 400 nm by etching by using the silicon dioxide 703 as the mask so as to form a ditch B and a recess C inside the silicon substrate 701. Here, the ditch B is formed round the device active area inside the peripheral circuit formation area and will serve as the device isolation area after post-step is executed. The recess C will serve as the memory cell formation area after post-step is similarly executed.

Thermal oxidation is then applied to the P type silicon substrate 701 as shown in FIG. 7-1(d) to form a silicon dioxide film 704 as a thermal oxide film having a film thickness of about 20 nm.

A silicon oxide film 705 is then deposited to a thickness of about 400 nm over the entire surface of the silicon substrate 701 by the CVD process as shown in FIG. 7-1(e).

Next, the silicon dioxide film 705 is removed by CMP (Chemical Mechanical Polishing) until the silicon nitride film 717 is exposed as shown in FIG. 7-1(f).

Subsequently, the peripheral circuit formation area is covered with a photoresist film 706 and wet etching is applied as shown in FIG. 7-1(g). This wet etching is carried out by using hydrofluoric acid until the surface of the P type silicon substrate of the memory cell formation area is exposed. In consequence, a buried insulating film 705 to serve as a device isolation area is formed round the device active area of the peripheral circuit formation area. Next, the photoresist film 706 is removed, the silicon nitride film 717 is removed by etching by using hot phosphoric acid, and thereafter the silicon dioxide film 703 is removed by etching by using hydrofluoric acid.

Next, as shown in FIG. 7-1(h), the surface of the P type silicon substrate 701 is thermally oxidized so as to form an about 40 nm-thick shield gate insulating film 707.

A polysilicon film 708 (which will later serve as a field shield electrode) is formed to a film thickness of about 100 nm by the CVD process as shown in FIG. 7-1(c), and phosphorus is thermally diffused to lower the resistance of this polysilicon film 708. An about 300 nm-thick silicon dioxide film 709 is deposited to the entire surface by the CVD process. (This film 709 will later serve as a cap insulating film of the field shield electrode).

Next, the silicon dioxide film 709 and the polysilicon film 708 are selectively etched and removed by using a photoresist having a predetermined pattern and not shown in the drawing, as shown in FIG. 7-1(j), so as to form the field shield electrode 708 and the cap insulating film 709.

The difference of this seventh embodiment from the fourth embodiment resides in that the field shield device isolation structure is incorporated in the memory cell formation area but does not protrude to the peripheral circuit formation area.

Next, as shown in FIG. 7-1(k), an about 200 nm-tick silicon dioxide film 710 is deposited to the entire surface by the CVD process, and is thereafter etched back anisotropically to form sidewall insulating film 710 comprising the silicon dioxide film on the side surfaces of the field shield electrode 708 and the cap insulating film 709. At this time, the shield gate insulating film 707 is removed from the device active areas of both of the peripheral circuit formation area and the memory cell formation area. Similarly, the shield gate insulating film 707 is removed from the boundary area (at which a step exists) between the peripheral circuit formation area and the memory cell formation area. As a result of the process steps described above, a field shield device isolation structure (comprising the shield gate insulating film 707, the shield gate electrode 708, the cap oxide film 709 and the sidewall insulating film 710) is formed in the memory cell formation area.

Next, as shown in FIG. 7-1(l), thermal oxidation is applied to the exposed surface of the silicon substrate 701 to form an about 15 nm-thick gate insulating film 711. An about 200 nm-thick polysilicon film is deposited to this gate insulating film 711 by the CVD process, and phosphorus is then thermally diffused to lower the resistance of this polysilicon film. Next, a photoresist having a predetermined pattern is put on the polysilicon film, and the polysilicon film is etched into a predetermined pattern by using the photoresist as the mask so as to form a gate electrode 712.

Arsenic ions, for example, are implanted at an implantation energy of 60 keV and in a dose of 5×10$^{15}$ cm$^{-2}$ by using the gate electrode 712, the field device isolation structure (comprising the shield gate insulating film 707, the shield gate electrode 708, the cap oxide film 709 and the sidewall insulating film 710) and the silicon dioxide film 705 as the mask, and heat-treatment is then carried out to form a source-drain diffusion layer 713. At this time, a similar diffusion layer 713 is obtained in the boundary area between the memory cell formation area and the peripheral circuit formation area.

FIG. 7-2 is a plan view of FIG. 7-1(k). In FIG. 7-2, reference numeral 704 denotes the silicon dioxide film, reference numeral 705 denotes the silicon dioxide film which is to serve as the buried insulating film and reference numerals 707, 708, 709 and 710 denote the shield gate insulating film, the electrode, the cap insulating film and the sidewall insulating film of the field shield device isolation structure, respectively. Reference numeral 711 denotes the gate insulating film, reference numeral 712 denotes the gate electrode and reference numeral 713 denotes the source-drain diffusion layer and the diffusion layer formed in the boundary area between the memory cell formation area and the peripheral circuit formation area.

Thereafter, a silicon dioxide film as a first inter-level insulating film 714 is deposited to the entire surface by the CVD process, etc, and contact holes are bored at predetermined positions of this first inter-level insulating film 714. Next, an aluminum wiring 715 is formed on the inter-level insulating film 714 by sputtering and fine etching, and a silicon dioxide film as a second inter-level insulating film 716 is deposited on the aluminum wiring 715 by the CVD process, or the like.

According to this embodiment, the area for forming the field shield device isolation structure is formed at the position lower than the area for forming the silicon dioxide film for buried insulating film device isolation. Therefore, this embodiment can make a great contribution to the requirement for flattening in the production process of a semiconductor device. Further, because the diffusion layer exists in the boundary area between the two areas described above, isolation between these areas can be insured more reliably by using this diffusion area (by setting it to the ground potential, for example).

Embodiment 8:

A production method of a semiconductor device according to the eighth embodiment of the present invention will be explained with reference to FIGS. 8-1(a) to 8-1(k) and FIG. 8-2.

FIGS. 8-1(a) to 8-1(k) show the production method of a semiconductor device according to the eigth embodiment. The areas shown on the right side of FIGS. 8-1(a) to 8-1(k) are the peripheral circuit formation areas and the areas shown on the left side are the memory cell formation areas such as DRAMs. FIG. 8-2 is a plan view corresponding to the longitudinal sectional view of FIG. 8-1(k).

As shown in FIG. 8-1(a), boron ions, for example, are implanted into a P type silicon substrate 801 at an implantation energy of 60 keV and in a dose of $1 \times 10^{13}$ cm$^{-2}$, and heat-treatment is carried out at a temperature of 1,100° C. for 6 hours, for example, so as to diffuse and activate boron as the impurity into the silicon substrate 801 to form a P type well area 802 made of boron in the silicon substrate 801.

Next, as shown in FIG. 8-1(b), thermal oxidation is applied to the surface of the silicon substrate 801 on which the P type well area 802 is formed, so as to form an about 40 nm-thick silicon dioxide film 803. Further, a silicon nitride film 804 is deposited on the silicon dioxide film 803 to a thickness of about 150 nm by the CVD process.

The silicon nitride film 804 and the silicon dioxide film 803 are then removed serially and selectively by etching in such a manner as to encompass the device active area of the peripheral circuit formation area shown on the right side of FIG. 8-1(c). However, the silicon nitride film 804 and the silicon dioxide film 803 of the device active area of the memory cell formation area and of the device active area of the memory cell formation area are not removed by etching. The area from which the silicon nitride film 804 is removed will serve as the device active area of the peripheral circuit formation area when post-step is executed. Next, the silicon substrate 1 is removed by about 400 nm by etching by using the silicon nitride film 804 as the mask so as to form a ditch B inside the silicon substrate 1. This ditch B serves as the device active areas 805 and 806 of the peripheral circuit formation area shown on the right side of FIG. 8.

Thermal oxidation is then applied to the silicon substrate 801 of the ditch portion B as shown in FIG. 8-1(d) to form a silicon dioxide film 805 as a thermal oxide film having a thickness of about 20 nm inside the ditch B.

Subsequently, a silicon dioxide film 806 is deposited to a thickness of about 600 nm over the entire surface of the silicon substrate 1 by the CVD process as shown in FIG. 8-1(e).

This silicon dioxide film 806 is then removed by CMP (Chemical Mechanical Polishing) until the surface of the silicon nitride film 804 over the silicon substrate 801 is exposed. Then, the silicon oxide film 806 is buried into the ditch B, and the silicon dioxide film 806 formed in other areas is removed.

Next, the silicon nitride film 804 and the silicon dioxide film 803 are removed serially and selectively by etching by using a photoresist film 811 having a pattern shown on the left side of FIG. 8-1(g) in such a manner as to encompass the device active area of the memory cell formation area. However, the silicon nitride film 804 and the silicon dioxide film 803 of the device active areas of both of the peripheral circuit formation area and the memory cell formation area are covered with the patterned photoresist 811 and are not therefore removed by etching. After this removal by etching, the patterned photoresist film 811 is removed. Incidentally, the removal area of the silicon nitride film 804 will serve as the device isolation area inclusive of the field shield electrode of the memory cell formation area after post-step is executed. Thereafter, the silicon substrate 801 is removed by about 400 nm by etching by using the silicon nitride film 804 as the mask, forming thereby a ditch C inside the silicon substrate 801. This ditch C serves as the device isolation areas 807 and 808 of the memory cell formation area on the left side of FIG. 8.

Next, the silicon nitride film 804 and the silicon dioxide film 803 formed over the silicon substrate are serially etched and removed as shown in FIG. 8-1(h) so as to expose the surface of the silicon substrate 801 of the device active area of the memory cell formation area and that of the peripheral circuit formation area. Thereafter, heat-treatment is applied to the silicon substrate 801 to form a silicon dioxide film 807 on the silicon substrate 801 inclusive of the interior of the ditch C.

A polysilicon film 808 containing an impurity and serving as a conductive film is then deposited on the silicon dioxide film 807 by the CVD process as shown in FIG. 8-1(i). This polysilicon film 808 is preferably deposited in such a manner as to be buried in at least the ditch C.

Subsequently, the polysilicon film 808 is removed by CMP (Chemical Mechanical Polishing) until the surface of the silicon substrate 801 is exposed, as shown in FIG. 8-1(j). Then, the inside of the ditch C is buried by the polysilicon film 808, the surface of the silicon substrate 801 is flattened and the silicon substrate 801 of the memory cell formation area and of the peripheral circuit formation area is exposed. In other words, the surface layer of the polysilicon film 808 and the surface layer of the silicon dioxide film 806 can be formed at the same level, the polysilicon film 808 to serve as the field shield electrode and the silicon dioxide film 806 to serve as the buried insulating film co-exist on the same substrate, and both of them (806 and 808) do not have any step on the substrate and provide the advantage for flattening in the subsequent process steps. Incidentally, the polysilicon film 808 to serve as the field shield electrode becomes a device isolation electrode when it is fixed at the ground potential or at a certain constant potential in the subsequent process step.

Thereafter, a sacrifice oxide film (not shown) is formed on the surface of the silicon substrate 801, and is completely removed by wet etching. Subsequently, thermal oxidation is applied to the surface of this silicon substrate 801 to form an about 15 nm-thick gate oxide film 809. A polysilicon film 810 is then formed to a thickness of about 200 nm on this gate oxide film 809 by the CVD process, and phosphorus is thermally diffused so as to lower the resistance of this polysilicon film 810.

After a photoresist film, not shown, is formed on the polysilicon film 810 as shown in FIG. 8-1(k), it is patterned into the pattern shape of the gate electrode. The polysilicon film 810 and the gate oxide film 809 are then selectively etched and removed by using the photoresist film (not shown) so patterned. As a result, a gate electrode 810A comprising the polysilicon film 810 having a predetermined pattern is formed in the memory cell formation area on the left side, while a gate electrode 810B comprising the polysilicon film 810 having a predetermined pattern is formed in the peripheral circuit formation area on the right side. After this patterned photoresist film is removed, arsenic ions, for example, are implanted at an implantation energy of 60 keV and in a dose of $5\times10^{15}$ cm$^{-2}$ by using the gate electrodes 810A and 810B as the mask. Heat-treatment is then carried out to form source-drain diffusion layers 813A and 813B on both sides of the gate electrodes 810A and 810B, respectively.

As a result of the process steps described above, the surface of the field shield electrode 808 and the surface of the buried insulating film 806 can be formed at the same level. Therefore, this embodiment can make a contribution to the requirement for flattening in the production process of a semiconductor device.

In FIG. 8-2, reference numeral 805 denotes the silicon dioxide film, reference numeral 806 denotes the silicon dioxide film for device isolation on the peripheral circuit formation area on the right side, reference numeral 807 denotes the silicon dioxide film, reference numeral 808 denotes the field shield electrode for device isolation on the memory cell formation area on the left side, and reference numeral 809 denotes the gate insulating film. Reference numerals 810A and 810B denote the gate electrodes and reference numerals 813A and 813B denote the source-drain diffusion layers. Here, the suffix "A" represent that the device exists in the memory cell formation area on the left side, and the suffix "B" represents that the device exists in the peripheral circuit formation area on the right side. The symbol "(B)" represents that the left device exists inside the ditch B and the symbol "(C)" represents that the left device exists inside the ditch C.

Embodiment 9:

A production method of a semiconductor device according to the ninth embodiment of the present invention will be explained with reference to FIGS. 9-1(a) to 9-1(h) and FIG. 9-2.

Figures 1A, 9:
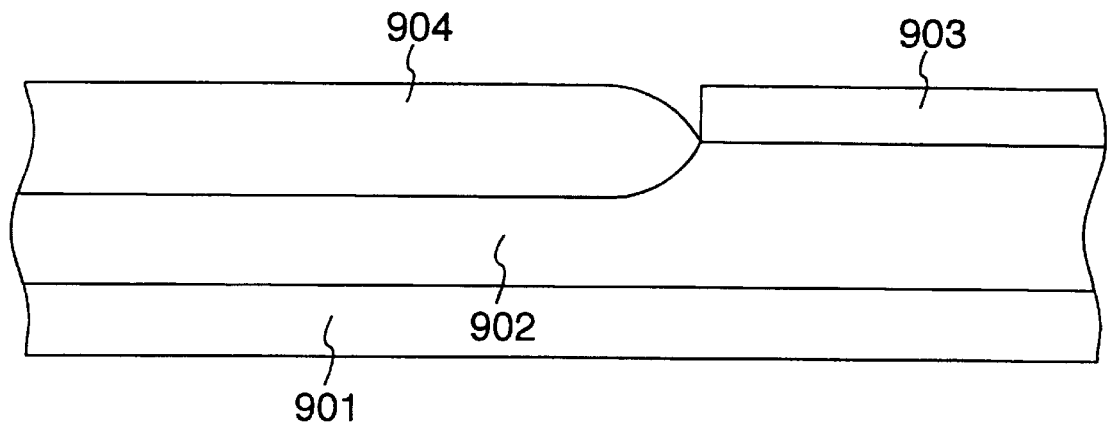
Figures 1B, 9:
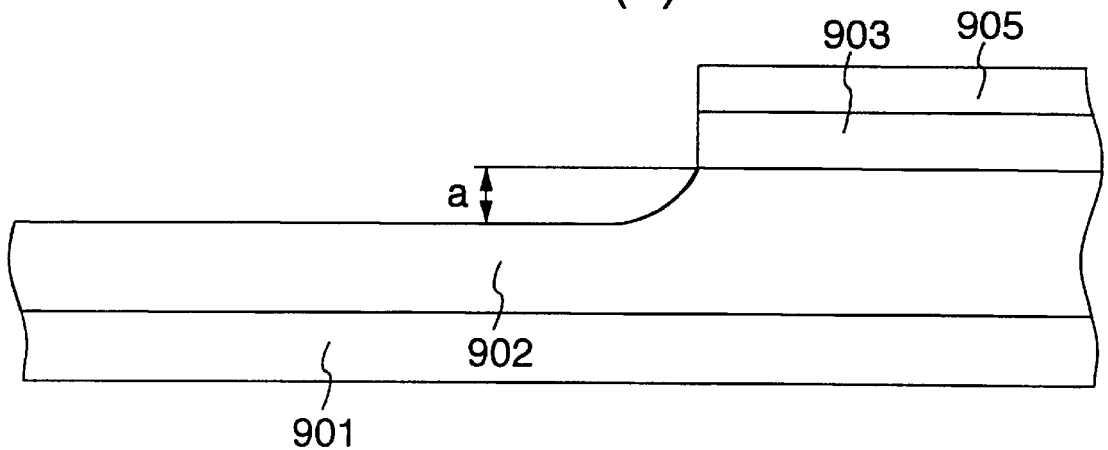
Figures 1C, 9:
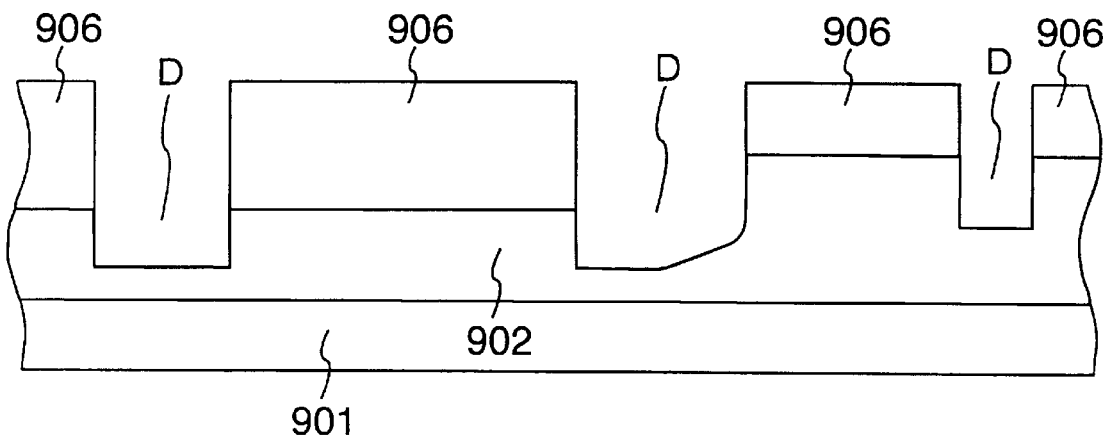
Figures 1D, 9:
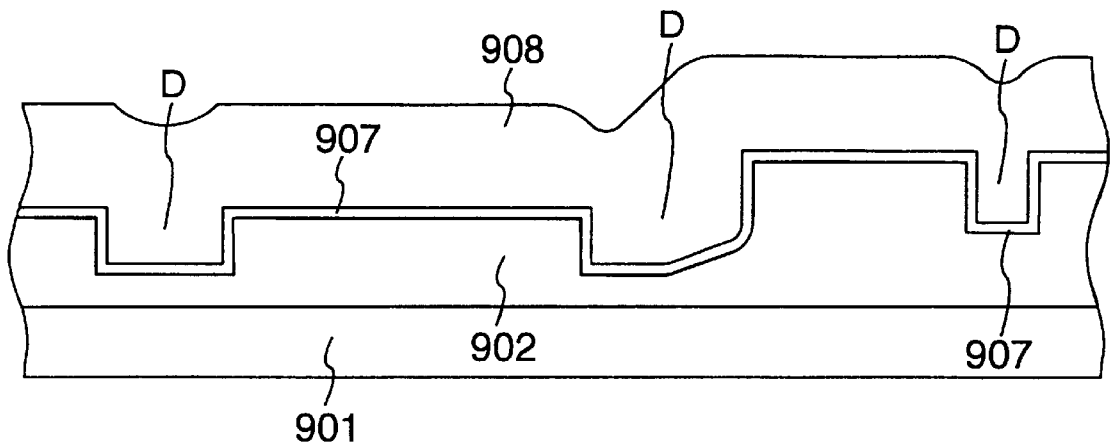
Figures 1E, 9:
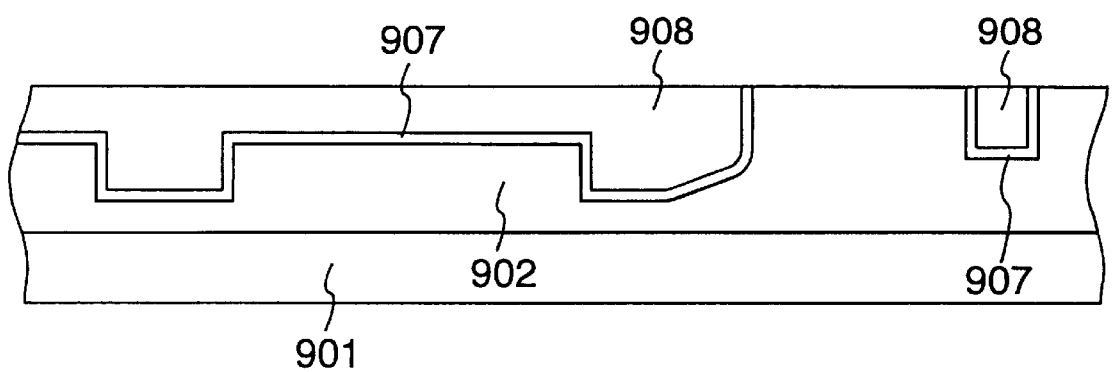
Figures 1F, 9:
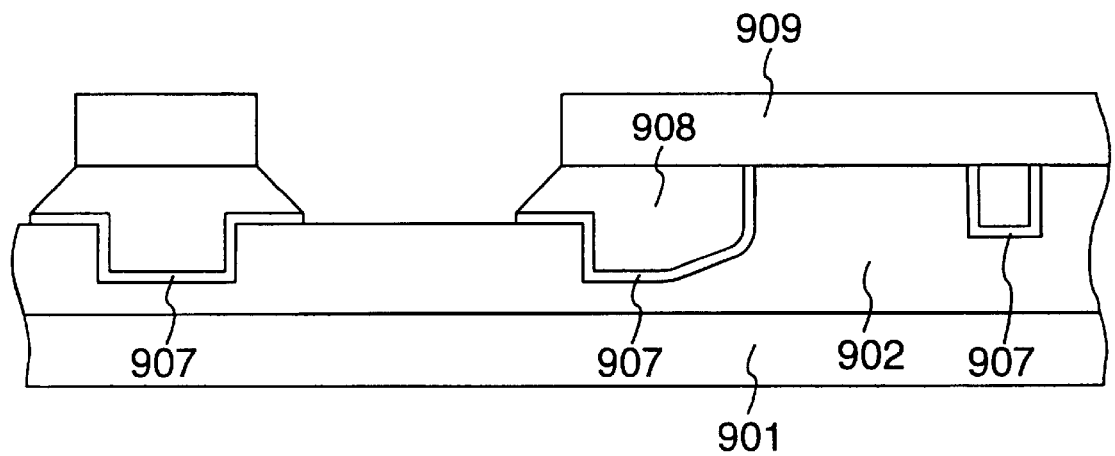
Figures 1G, 9:
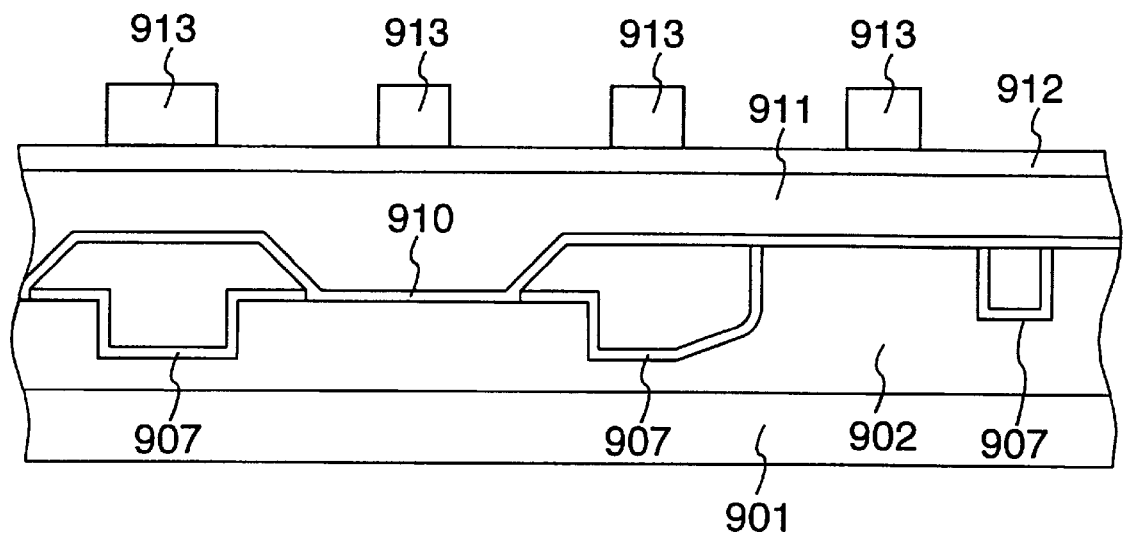
Figures 1H, 9:
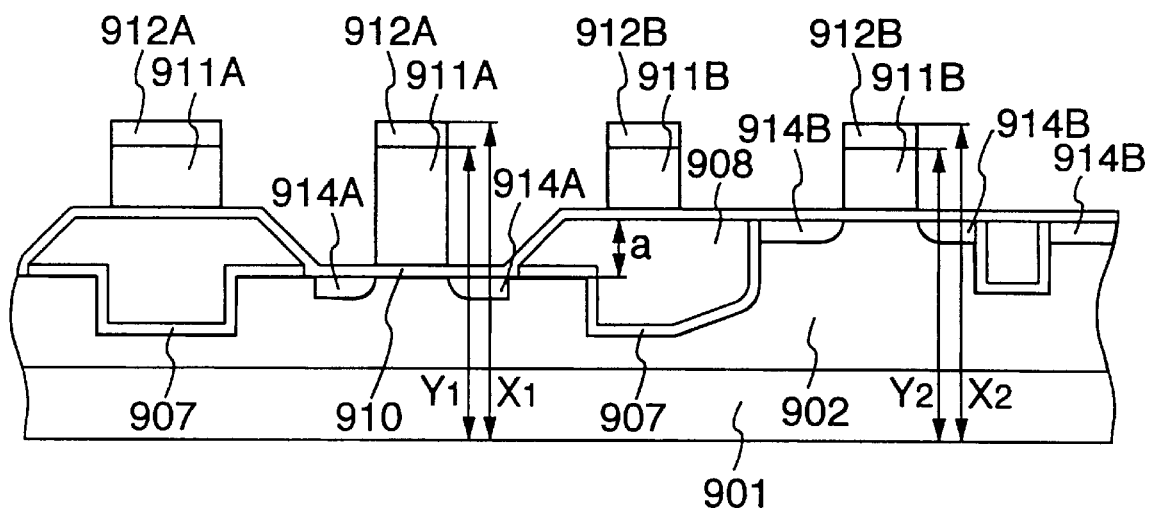
Figures 2, 9:
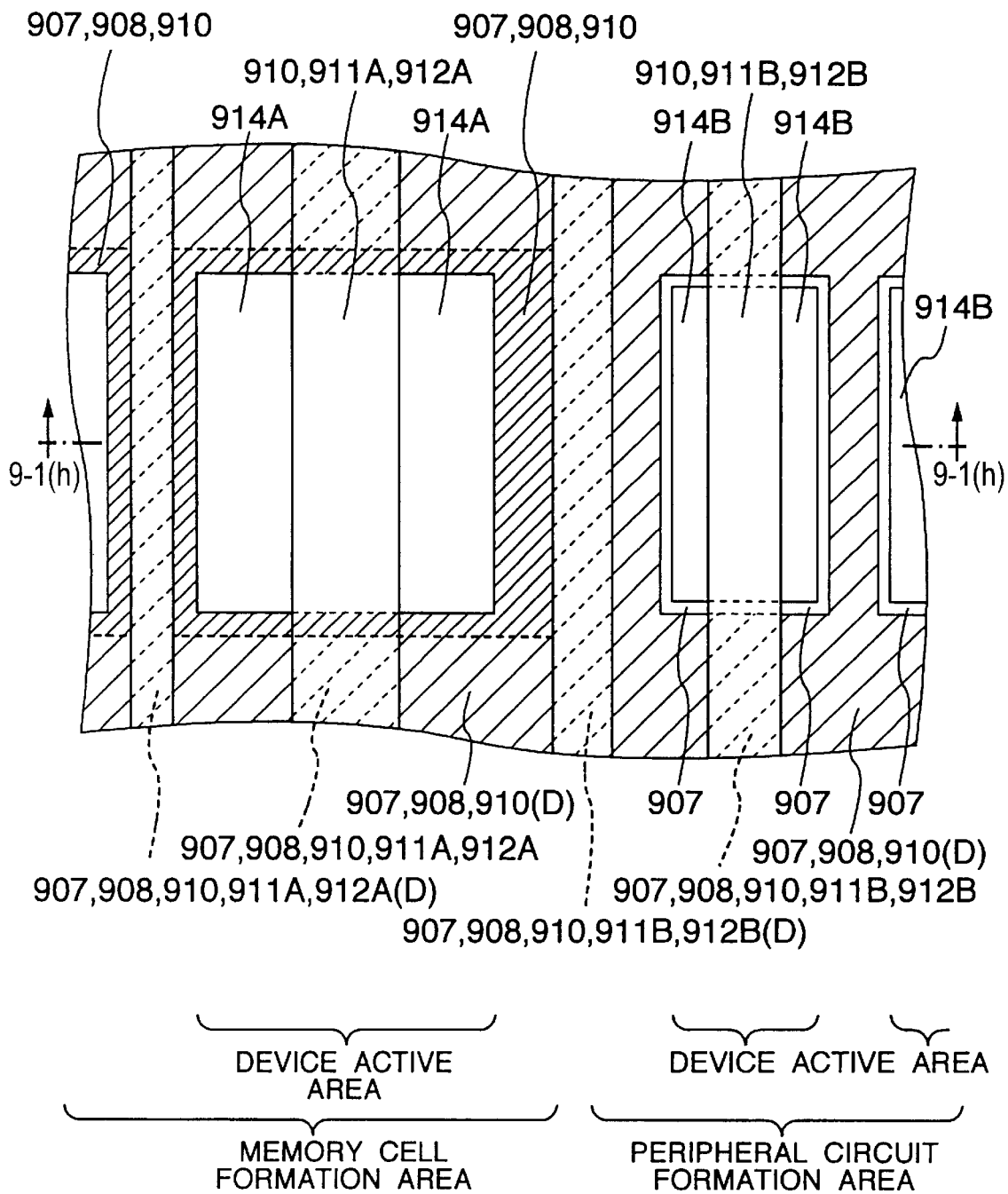

FIGS. 9-1(a) to 9-1(h) show the production steps of a production method of a semiconductor device according to the ninth embodiment of the present invention. The areas shown on the right side of FIGS. 9-1(a) to 9-1(h) are the peripheral circuit formation areas, and the areas shown on the left side are the memory cell formation areas, such as DRAMs. FIG. 9-2 is a plan view corresponding to a longitudinal sectional view of FIG. 9-1(h).

First, boron ions, for example, are implanted to a P type silicon substrate 901 at an implantation energy of 60 keV and in a dose of $1\times10^{13}$ cm$^{-2}$ as shown in FIG. 9-1(a), and heat-treatment is carried out at 1,100° C. for 6 hours, for example, so as to diffuse and activate boron as the impurity into the silicon substrate and to form a P type well area 902 made of boron on the silicon substrate 901. After a silicon nitride film 903 is formed on the silicon substrate 901, the silicon nitride film 903 on the memory cell formation area is selectively etched and removed. Thereafter, thermal oxidation is applied to the silicon substrate 901 by using this silicon nitride film 903 as the mask to form an about 400 nm-thick field oxide film 904 in the memory cell area. Therefore, the field oxide film 904 is not formed over the silicon substrate 901 covered with the silicon nitride film 903.

Next, a photoresist film 905 is formed on the area of the silicon nitride film 903 of the peripheral circuit formation area as shown in FIG. 9-1(b). The field oxide film 904 is completely removed by etching by using the photoresist film 905 as the mask so as to expose the surface of the silicon substrate 1 of the memory cell formation area. As a result, the surface of the silicon substrate 901 of the memory cell formation area becomes lower by a thickness a (about 200 nm) of the oxidized surface of the silicon substrate 911 at the time of the formation of the field oxide film 904 than the surface of the silicon substrate 901 of the peripheral circuit formation area.

After the photoresist film 905 is removed as shown in FIG. 9-1(c), the silicon nitride film 903 is removed. A photoresist film 906 is then formed on the silicon substrate 901, and the photoresist film 906 formed in the device isolation areas of the peripheral circuit formation area and the memory cell formation area is selectively removed. Subsequently, the silicon substrate 901 is etched and removed by about 400 nm by using the photoresist film 906 as the mask to form a ditch D inside the silicon substrate 1. This ditch D serves as a part of the device isolation area of each of the peripheral circuit formation area and the memory cell formation area shown in FIG. 9-2.

After the photoresist film 906 is removed as shown in FIG. 9-1(d), thermal oxidation is applied to the surface of the silicon substrate 901 having the ditch D to form a silicon dioxide film 907. Thereafter, a polysilicon film 908 containing an impurity and serving as a conductive film is formed on the silicon dioxide film 907 by the CVD process. This polysilicon film 908 is preferably deposited in such a manner as to be buried in at least the ditch D.

Next, the polysilicon film 908 is removed by CMP (Chemical Mechanical Polishing) until the surface of the silicon substrate 901 of the peripheral circuit formation area is exposed as shown in FIG. 9-1(e) in such a manner as to leave the polysilicon film 908 inside the ditch D of each of the memory cell formation area and the peripheral circuit formation area. In other words, the polysilicon film 908 is buried into the area where the surface of the silicon substrate 901 of the memory cell formation area is lower by the thickness a (about 200 nm) than the surface of the silicon substrate 901 of the peripheral circuit formation area, and inside the ditch D. In consequence, when the polysilicon film 908 is flattened by the CMP process, the surfaces of both the memory cell formation area and the peripheral circuit formation area having the step come to exist at the same level.

After a photoresist film 909 is formed over the silicon substrate 901 of the peripheral circuit formation area and on the polysilicon film 908 of the memory cell formation area as shown in FIG. 9-1(f), the photoresist film 909 of the device active area of the memory cell formation area is removed to pattern the photoresist film 909. The polysilicon film 908 formed in the device active area of the memory cell formation area is etched and removed, using the photoresist film 909 so patterned. The polysilicon film 908 is thus patterned. The etching condition of this polysilicon film 908 is preferably such that the sidewall of the polysilicon film 908 is shaped into a forward taper. For example, when isotropic (wet) etching is employed for etching and removing the polysilicon film 908, the sidewall of the polysilicon film 908 can be shaped into a forward taper. If the sidewall of the polysilicon film 908 is shaped into a forward taper, it becomes possible to prevent a part of the material of the gate electrode from remaining on the sidewall of the polysilicon film 908 when the gate electrode is formed at the post-step. Further, the silicon dioxide film 907 of the device active area of the memory cell formation area is etched and removed by using the patterned photoresist film 909 as the mask. Incidentally, the polysilicon film 908 formed in the memory cell formation area and at the boundary between the memory cell formation area and the peripheral circuit formation area will later serve as a field shield electrode for device isolation by fixing it at the ground potential or at a certain constant potential at the post-step.

After a sacrifice oxide film (not shown) is formed on the surface of the silicon substrate 901, this sacrifice oxide film (not shown) is completely removed by wet etching as shown in FIG. 9-1(g). Thereafter, thermal oxidation is applied to the surface of the silicon substrate 901 so as to form a laminate structure film (ONO film) as a gate insulating film 910 comprising a silicon dioxide film, a silicon nitride film and a silicon dioxide film on the surface of the silicon substrate 901. An about 200 nm-thick polysilicon film 911 is the deposited on this gate insulating film 910 by the CVD process. The surface of the polysilicon film 911 is then polished by the CMP process so as to flatten the surface of the polysilicon film 911, and phosphorus is thermally diffused into this polysilicon film 911 so as to lower its resistance. In other words, the surface of the polysilicon film 911 of the memory cell formation area and the surface of the polysilicon film 911 of the peripheral circuit formation area exist at the same level as a result of polishing of the polysilicon film 911 by the CMP process. Thereafter, a silicon dioxide film 912 is deposited on the polysilicon film 911 by the CVD process. After a photoresist film 913 is formed on the silicon dioxide film 912, this photoresist film 913 is patterned into the shape of a gate electrode pattern.

The silicon dioxide film 912 and the polysilicon film 911 are etched and removed serially and selectively by using the patterned photoresist film 913 as the mask as shown in FIG. 9-1(h) so as to form a gate electrode 911A comprising the polysilicon film 911 having a predetermined pattern in the memory cell formation area on the left side and a gate electrode 911B comprising the polysilicon film 911 having a predetermined pattern on the peripheral circuit formation area on the right side. Since the height (thickness) of the polysilicon film of the peripheral circuit formation area in the longitudinal direction is smaller than the height (thickness) of the polysilicon film 911 of the memory cell formation area in the longitudinal direction, there is the possibility that the silicon substrate 901 of the device active area of the peripheral circuit formation area is etched when the polysilicon film 911 is etched into the shape of the gate electrode. However, because the gate insulating film 901 having the silicon nitride film is formed, the gate insulating film 910 plays the role of an etching stopper at the time of etching of the polysilicon film 911. Consequently, the silicon substrate of the device active area of the peripheral circuit formation area is not etched at the time of etching.

After this patterned photoresist film 913 is removed, arsenic ions, for example, are implanted at an implantation energy of 60 keV and in a dose of $5 \times 10^{15}$ cm$^{-2}$ by using the gate electrodes 911A and 911B as the mask, and heat-treatment is then carried out to form source-drain diffusion layers 914A and 914B on both sides of the gate electrodes 911A and 911B, respectively.

Since the polysilicon film 911C is flattened by the CMP process at the step shown in FIG. 9-1(g), the surface height of the gate electrode 911B of the peripheral circuit formation area (or the cap oxide film 912B comprising the silicon dioxide film 912) and the surface height of the gate electrode 911A of the memory cell formation area (or the cap oxide film 912A comprising the silicon dioxide film 912) are the same. Namely, X1 (Y1) of the memory cell formation area equals X2 (Y2) of the peripheral circuit formation area in terms of a vertical line from the back of the substrate; that is, the surface layer of the gate electrode 911A (or the cap oxide film 912A) formed on the area in which the surface of the silicon substrate 901 of the memory cell formation area is lower by the thickness a (about 200 nm) than the surface of the silicon substrate 901 of the peripheral circuit formation area, and the surface layer of the gate electrode 911B formed on the peripheral circuit formation area (or the cap oxide film 912B) are at the same level. Therefore, this structure is extremely advantageous for flattening the surface of the silicon substrate 901.

In other words, even when the surface of the silicon substrate 901 of the memory cell formation area is lower than the surface height of the silicon substrate 901 of the peripheral circuit formation area (by about 200 nm lower in this embodiment), the gate electrode 911A can be shaped into a height by about 200 nm greater than the height of the gate electrode 911B formed in the device active area of the memory cell formation area by flattening the polysilicon film 911 by the CMP process. In consequence, even when the step exists between the memory cell formation area and the peripheral circuit formation area, flattening of the wiring layer to be later formed over the semiconductor substrate can be easily attained.

In FIG. 9-2, reference numeral 907 denotes the field shield electrode for device isolation, and reference numeral 910 denotes the gate insulating film. Reference numerals 911A and 911B denotes the gate electrode, reference numerals 912A and 912B denote the cap oxide films and reference numerals 914A and 914B denote the source-drain diffusion layers. Here, the suffix "A" represents that the device exists in the memory cell formation area on the left side, and the suffix "B" does that the device exists in the peripheral circuit formation area on the right side. Symbol (D) represents that the left device exists inside the ditch D.

Embodiment 10:

Hereinafter, a production method of a semiconductor device according to the tenth embodiment of the present invention will be explained with reference to FIGS. 9-1(a) to 9-1(e), FIGS. 10-1(a) to 10-1(d) and FIG. 10-2.

Figures 1A, 10:
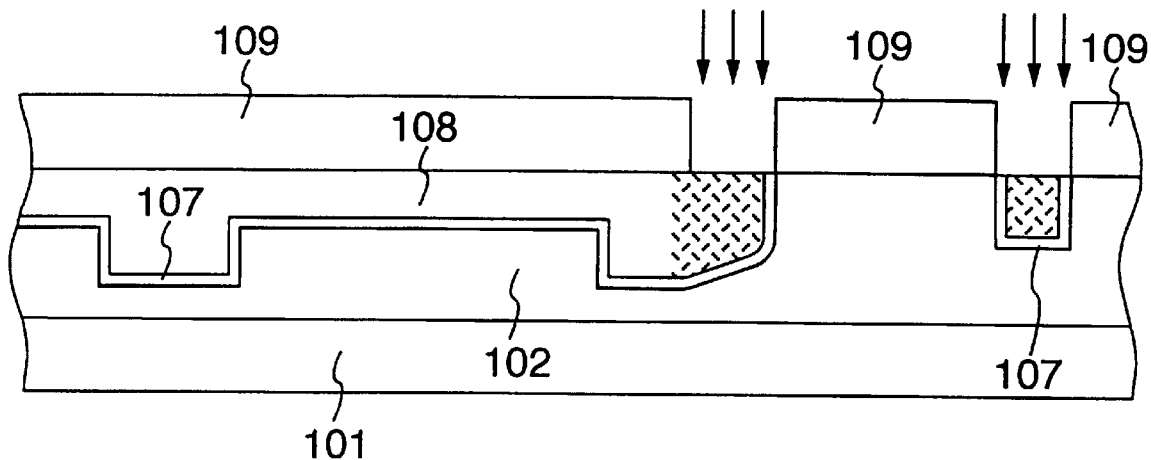
Figures 1B, 10:
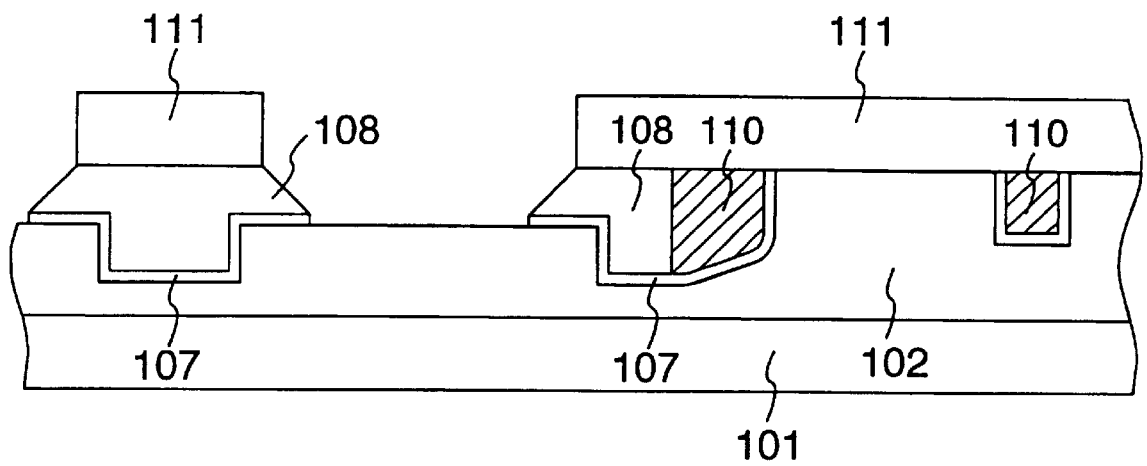
Figures 1C, 10:
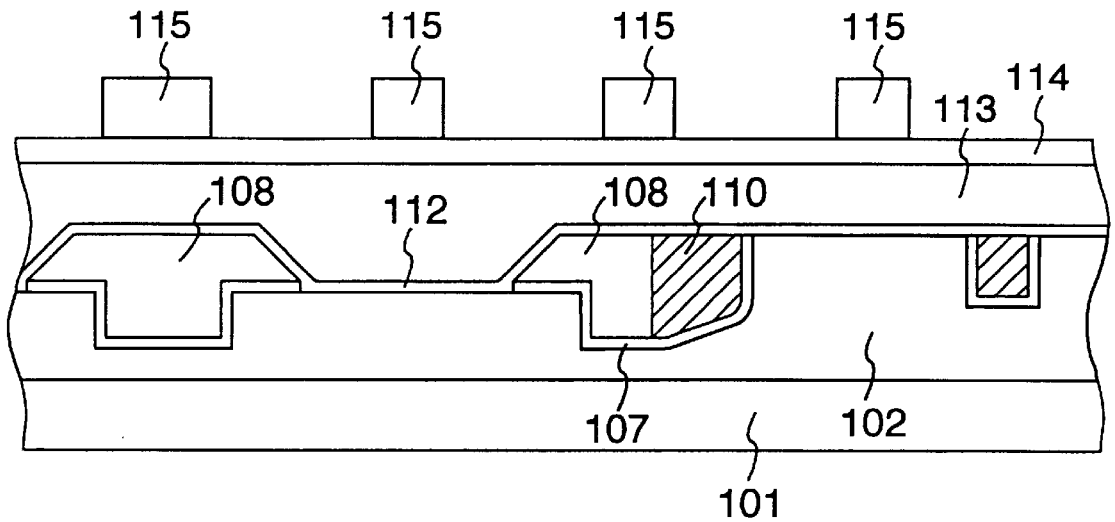
Figures 1D, 10:
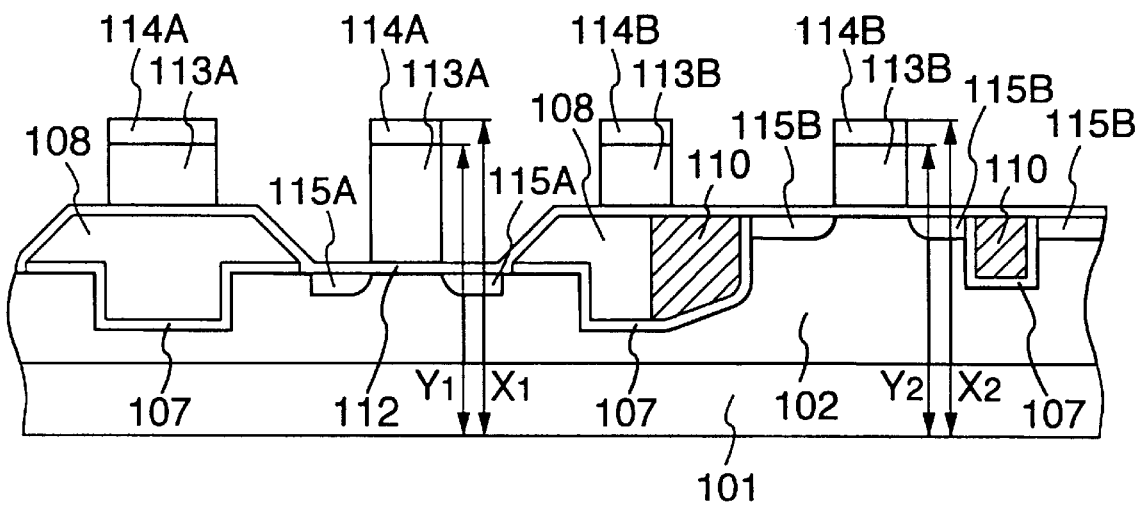
Figures 2, 10:
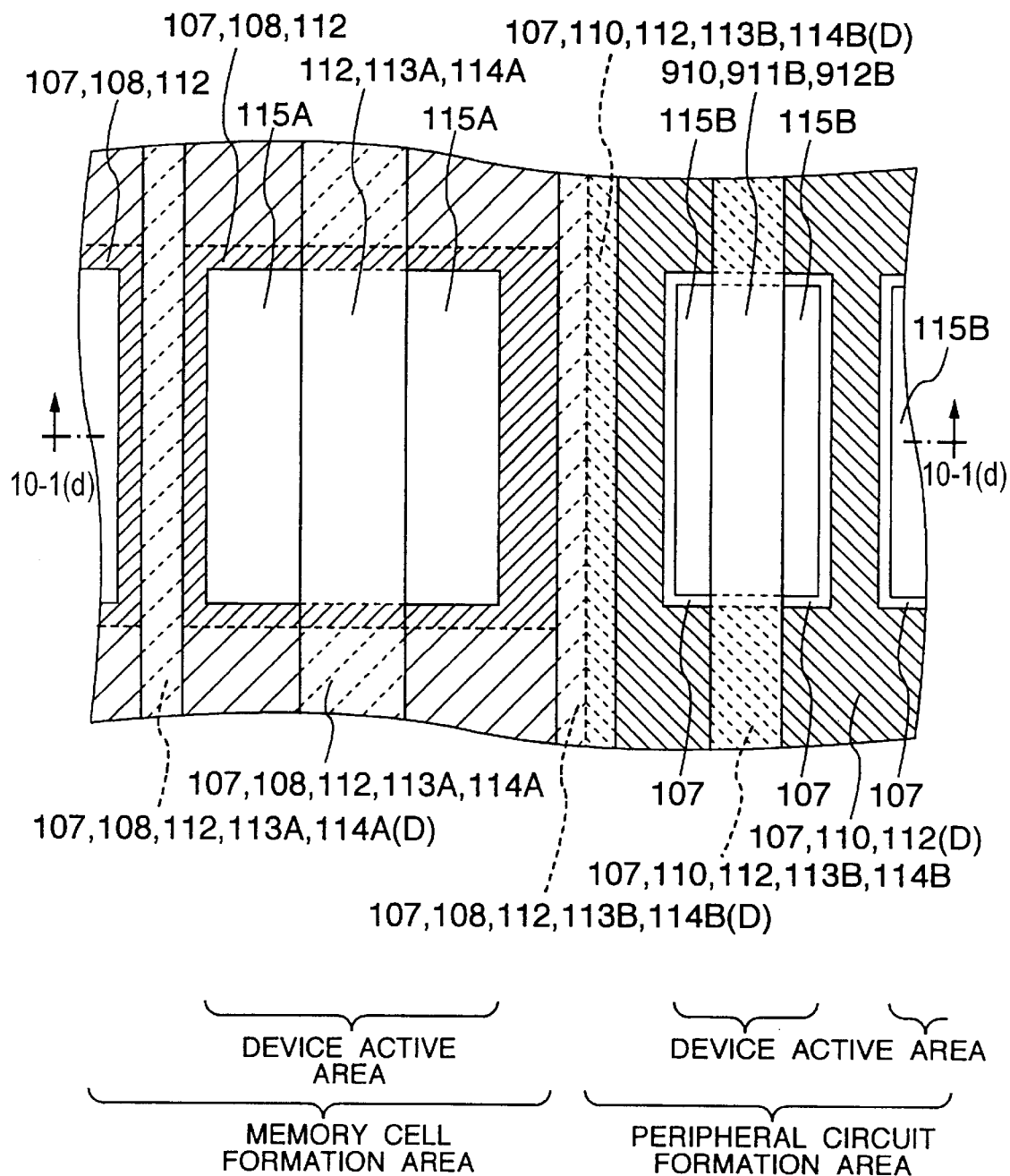

FIGS. 9-1(a) to 9-1(e) and FIGS. 10-1(a) to 10-1(d) show the production steps of a production method of a semiconductor device according to the tenth embodiment of the present invention. The areas shown on the right side of these drawings are the peripheral circuit formation areas and the areas shown on the left side are the memory cell formation area such as DRAMs. FIG. 10-2 is a plan view corresponding to a longitudinal sectional view of FIG. 10-1(d).

The production steps shown in FIGS. 9-1(a) to 9-1(e) are the same as those of Embodiment 9. After the step shown in FIG. 9-1(e), a photoresist film 109 is formed on the silicon substrate 101 as shown in FIG. 10-1(a), and the photoresist film 109 at a part of the device isolation area (ditch D) of the peripheral circuit portion area and at a part of the device isolation area (ditch D) on the peripheral circuit formation area side as the boundary portion between the memory cell formation area and the peripheral circuit formation area are removed so as to pattern the photoresist film 109. Oxygen ions are implanted into the polysilicon film 108 of the device isolation area of the peripheral circuit formation area and into the polysilicon film 108 at a part of the device isolation area on the side of the peripheral circuit formation area as the boundary portion between the memory cell formation area and the peripheral circuit formation area by ion implantation by using the photoresist film 109 as the mask. This ion implantation is carried out by varying the acceleration energy (step-wise) so as to uniformly implant the oxygen ions into the polysilicon film 8. Thereafter, the photoresist film 109 is removed.

Next, heat-treatment is applied to the silicon substrate 101 as shown in FIG. 10-1(b) so as to activate the oxygen ions implanted into a part of the polysilicon film 108 and to form the silicon dioxide film 110 comprising the oxygen-containing polysilicon film 108 formed in the device isolation area of the peripheral circuit formation area. By the way, a semiconductor integrated circuit including a device isolation area having a small parasitic capacity can be obtained by burying the oxygen-containing polysilicon film 110 of the device isolation area of the peripheral circuit formation area. After a photoresist film 111 is deposited to the silicon substrate 101, the photoresist film 111 of the device active area of the memory cell formation area is removed so as to pattern this photoresist film 111. The polysilicon film 108 formed in the device active area of the memory cell formation area is then etched and removed by using this patterned photoresist film 111 as the mask to pattern this polysilicon film 108. The etching condition of this polysilicon film 108 is preferably such that the sidewall of the polysilicon film 108 is etched into the forward tapered shape. For example, when the polysilicon film 108 is etched by isotropic (wet) etching, the sidewall of the polysilicon film 108 can be etched into the forward tapered shape. If the sidewall of the polysilicon film 108 is etched into the forward tapered shape, it becomes possible to prevent a part of the material of the gate electrode from remaining on the sidewall of the polysilicon film 108 when the gate electrode is formed in the post-step. Further, the silicon dioxide film 107 of the device active area of the memory cell formation area is removed by etching by using this patterned photoresist film 111 as the mask. Thereafter, the photoresist film 111 is removed. Incidentally, the polysilicon film 108 formed in the memory cell formation area and the polysilicon film 108 formed at the boundary portion on the memory cell formation area side between the memory cell formation area and the peripheral circuit formation area will serve as the field shield electrodes for device isolation when fixed at the ground potential or at a certain predetermined potential in the post-step.

A sacrifice oxide film (not shown) in formed on the surface of the silicon substrate 101 and is then removed completely by wet etching as shown in FIG. 10-1(c). Thereafter, thermal oxidation is applied to the surface of the silicon substrate 101 to form a gate insulating film 112 as a laminate structure film (ONO film) comprising a silicon dioxide film, a silicon nitride film and a silicon dioxide film on the surface of the silicon substrate 101. An about 20 nm-thick polysilicon film 113 is then deposited to this gate insulating film 112 by the CVD process. Next, the surface of this polysilicon film 113 is polished and flatterned by the CMP process, and phosphorus is thermally diffused so as to lower the resistance of the polysilicon film 113. In other words, as the polysilicon film 113 is polished by the CMP process, the surface layer of the polysilicon films 113 of both of the memory cell formation area and the peripheral circuit formation area come to exist on the same level. Thereafter, a silicon dioxide film 114 is formed on the polysilicon film 113 by the CVD process. After a photoresist film 115 is formed on the silicon dioxide film 114, this photoresist film 115 is patterned into the gate electrode pattern shape.

The silicon dioxide film 114 and the polysilicon film 113 are etched and removed serially and selectively by using the patterned photoresist film 115 as the mask, forming thereby a gate electrode 113A comprising the polysilicon film 113 having a predetermined pattern in the memory cell formation area on the left side and a gate electrode 113B comprising the polysilicon film 113 having a predetermined pattern in the peripheral circuit formation area on the right side. Because the height (thickness) of the polysilicon film 113 of the peripheral circuit formation area in the longitudinal direction is smaller than the height (thickness) of the polysilicon film 113 of the memory cell formation area in the longitudinal direction, there is the possibility that the silicon substrate 101 of the device active area of the peripheral circuit formation area is etched when the polysilicon film 111 is etched into the gate electrode shape. However, because the gate insulating film 112 having the nitride film is formed, this gate insulating film 112 plays the role of an etching stopper when the polysilicon film 113 is etched. In consequence, the silicon substrate of the device active area of the peripheral circuit formation area is not etched at the time of etching. Thereafter, the photoresist film 115 so patterned is removed, and arsenic ions, for example, are implanted at an implantation energy of 60 keV and in a dose of $5 \times 10^{15}$ cm$^{-2}$ by using the gate electrodes 113A and 113B as the mask. Heat-treatment is carried out so as to form source-drain diffusion layers 115A and 115B on both sides of the gate electrodes 113A and 113B, respectively.

The polysilicon film 111 is flattened by the CMP process at the process step shown in FIG. 10-1(c). Therefore, the surface height of the gate electrode 113B of the peripheral circuit formation area (or the cap oxide film 114B comprising the silicon dioxide film 114) and the surface height of the gate electrode 113A of the memory cell formation area (or the cap oxide film 114A) comprising the silicon dioxide film 114) are the same. Namely, X1 (Y1) of the memory cell formation area equals X2 (Y2) of the peripheral circuit formation area in terms of a vertical line from the back of the substrate; that is, the surface layer of the gate electrode 113A (or the cap oxide film 114A) formed on the area, in which the surface of the silicon substrate 101 of the memory cell formation area is lower by the thickness a (about 200 nm) than the surface of the silicon substrate 101 of the peripheral circuit formation area, and the surface layer of the gate electrode 113B formed on the peripheral circuit formation area (or the cap oxide film 114B) are at the same level. Therefore, this structure is extremely advantageous for flattening the surface of the silicon substrate 101. In other words, even when the surface of the silicon substrate 101 of the memory cell formation area is lower than the surface height of the silicon substrate 101 of the peripheral circuit formation area (by about 200 nm in this embodiment), the gate electrode 113A can be shaped into a height by about 200 nm greater than the height of the gate electrode 113B formed in the device active area of the memory cell formation area by flattening the polysilicon film 113 by the CMP process. In consequence, even when the step exists between the memory cell formation area and the peripheral circuit formation area, flattening of the wiring layer to be later formed over the semiconductor substrate can be easily attained.

In FIG. 10-2, reference numeral 107 denotes the silicon dioxide film, reference numeral 108 denotes the field shield electrode for device isolation on the memory cell formation area on the left side, reference numeral 110 denotes the silicon dioxide film for device isolation on the peripheral circuit formation area on the right side, and reference numeral 112 denotes the gate insulating film. Reference numerals 113A and 113B denote the gate electrodes, reference numerals 114A and 114B denote the cap oxide films, and reference numerals 115A and 115B denote the source-drain diffusion layer. The suffix "A" represents that the device exists in the memory cell formation area on the left side and the suffix "B" represents that the device exists in the peripheral circuit formation area on the right side. Further, symbol "(D)" represents that the left device exists in the ditch D.

Incidentally, though not shown in the drawings, a lower electrode of a capacitor to be connected to one of the imprurity diffusion layers of the memory cell formation area is formed by a post-step and a dielectric film is formed on the capacitor lower electrode by a known technology. Further, an upper electrode of the capacitor is formed on this dielectric film to thereby constitute a DRAM (Dynamic Random Access Memory) having a capacitor. Needless to say, a non-volatile transistor may be formed in the device active area of the memory cell formation area. Such a circuit construction can be applied similarly to all the embodiments described above.

Although the invention has been described with reference to some specific embodiments, this description is not meant to be construed in a limiting sense. Various modifications of the embodiments disclosed herein, as well as other embodiments of the invention, will become apparent to those skilled in the art upon reference to the description of the invention. It is therefore contemplated that the appended claims will cover any such modifications or embodiments as fall within the true scope of the invention.

What is claimed is:

1. A semiconductor device equipped on the same substrate thereof with a first area isolated for device isolation by a buried insulating film and with a second area isolated for device isolation by a field shield device isolation structure, the thickness of said substrate inside said second area being smaller than the thickness of said substrate inside said first area, wherein a part of said field shield device isolation structure is continuously superposed on and with said first area.

2. A semiconductor device according to claim 1, wherein said superposed portion is said buried insulating film of said first area.

3. A semiconductor device according to claim 1, wherein a diffusion layer is disposed between said first and second areas having a step therebetween.

4. A semiconductor device according to claim 1, wherein said first area is a peripheral circuit formation area and said second area is a memory cell formation area.

5. A semiconductor device according to claim 1, wherein said buried insulating film is a field oxide film.

6. A semiconductor device according to claim 5, wherein the thickness of said substrate inside said second area is smaller by at least about ½ of the film thickness of said field oxide film than the thickness of said substrate inside said first area.

7. A semiconductor device equipped on the same substrate thereof with a first area isolated for device isolation by a buried insulating film and with a second area isolated for device isolation by a field shield device isolation structure, the thickness of said substrate inside said second area being smaller than the thickness of said substrate inside said first area, wherein the top of a gate electrode of said first area is at about the same level as the top of a gate electrode of said second area.

8. A semiconductor device equipped on a semiconductor substrate thereof with a first area isolated for device isolation by a first device isolation structure and with a second area isolated for device isolation by a second device isolation structure and having a different height than said first device isolation structure, wherein said semiconductor device includes a first electrode formed in a device active area of said first area and a second electrode formed in a device active area of said second area;

the height from the surface layer of said semiconductor substrate to the surface layer of said first electrode is different than the height from the surface layer of said semiconductor substrate to the surface layer of said second electrode;

the thickness of said first electrode is different than the thickness of said second electrode;

the difference between the thickness of said first electrode and that of said second electrode is at least about ½ of the thickness of said first device isolation structure; and wherein the surface layer of said first electrode is at about the same level as the surface layer of said second electrode.

9. A semiconductor device according to claim 8, which includes an area having a smaller thickness of said semiconductor substrate is either said first area or said second area.

10. A semiconductor device according to claim 8, wherein the thickness of said semiconductor substrate inside said second area is smaller than the thickness of said semiconductor substrate inside said first area.

11. A semiconductor device according to claim 9, which includes a semiconductor memory device in said device active area of either of said areas in which the thickness of said semiconductor substrate is smaller.

12. A semiconductor device according to claim 1, wherein said semiconductor memory device is a non-volatile semiconductor memory device or a DRAM equipped with a capacitor.

13. A semiconductor device according to claim 10, wherein said device active area inside said first area is a peripheral circuit formation area, and said device active area inside said second area is a memory cell formation area.

14. A semiconductor device according to claim 8, wherein said first device isolation structure is a device isolation structure comprising an insulating film, and said second device isolation structure is a field shield device isolation structure equipped with a device isolation electrode.

15. A semiconductor device according to claim 14, wherein said device isolation electrode is fixed to a ground potential or to a certain predetermined potential, and said insulating film of said first device isolation structure is an insulating film inclusive of an oxide film.

16. A semiconductor device equipped on a semiconductor substrate thereof with a first area isolated for device isolation by a device isolation structure comprising an insulating film and with a second area isolated for device isolation by a field shield device isolation structure having a device isolation electrode, wherein said semiconductor device includes a first electrode formed in a device active area of said first area and a second electrode formed in a device active area of said second area;

the height from the surface layer of said semiconductor substrate to the surface layer of said first electrode is different than the height from the surface layer of said semiconductor substrate to the surface layer of said second electrode;

the thickness of said first electrode is different than the thickness of said second electrode;

the difference between the thickness of said first electrode and that of said second electrode is at least about ½ of the thickness of said device isolation structure comprising said insulating film; and wherein the surface layer of said first electrode is at about the same level as the surface layer of said second electrode.

17. A semiconductor device according to claim 16, which includes an area in which the tickness of said semiconductor substrate is smaller in either one of said first and second areas.

18. A semiconductor device according to claim 16, wherein the thickness of said semiconductor substrate inside said second area is smaller than the thickness of said semiconductor substrate inside said first area.

19. A semiconductor device according to claim 17, wherein a semiconductor memory device is provided in a device active area of said area in which the thickness of said semiconductor substrate is smaller.

20. A semiconductor device according to claim 19, wherein said semiconductor memory device is a non-volatile semiconductor memory device or a DRAM equipped with a capacitor.

21. A semiconductor device according to claim 18, wherein said device active area inside said first area is a peripherial circuit formation area, and said device active area inside said second area is a memory cell formation area.

22. A semiconductor device according to claim 16, wherein said first device isolation structure is a device isolation structure comprising an insulating film, and said second device isolation structure is a field shield device isolation structure equipped with a device isolation electrode.

23. A semiconductor device according to claim 22, wherein said device isolation electrode is fixed at a ground potential or a certain predetermined potential, and said device isolation structure comprising an insulating film is a device isolation structure inclusive of an oxide film.

24. A semiconductor device according to claim 16, wherein the thickness of said area in which the thickness of said semiconducor substrate is smaller is smaller by at least about ½ than the thickness of said first device isolation structure.

25. A semiconductor device according to claim 16, wherein the thickness of said semiconducor substrate inside said second area is smaller by at least about ½ than the thickness of said first device isolation structure.

26. A semiconductor device according to claim 8, wherein the top of a gate electrode of said first area is at about the same level as the top of a gate electrode of said second area.

* * * * *